(12) United States Patent
Nakai

(10) Patent No.: US 7,405,118 B2
(45) Date of Patent: Jul. 29, 2008

(54) SEMICONDUCTOR DEVICE AND METHOD OF FABRICATING THE SAME

(75) Inventor: Satoshi Nakai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 401 days.

(21) Appl. No.: 11/287,328

(22) Filed: Nov. 28, 2005

(65) Prior Publication Data

US 2007/0032005 A1 Feb. 8, 2007

(30) Foreign Application Priority Data

Aug. 4, 2005 (JP) ............................. 2005-227041

(51) Int. Cl.
*H01L 21/8238* (2006.01)
(52) U.S. Cl. ................ 438/200; 438/981; 257/E21.639
(58) Field of Classification Search .................. 438/200, 438/232, 981; 257/E21.639
See application file for complete search history.

(56) References Cited

U.S. PATENT DOCUMENTS 6,165,825 A * 12/2000 Odake .......................... 438/217
6,403,425 B1 * 6/2002 Ang et al. ..................... 438/283
6,831,020 B2 12/2004 Yamada et al.

FOREIGN PATENT DOCUMENTS

JP 2003-203988 7/2003

* cited by examiner

*Primary Examiner*—Chandra Chaudhari
(74) *Attorney, Agent, or Firm*—Westerman, Hattori, Daniels & Adrian, LLP.

(57) ABSTRACT

The present invention provides a semiconductor device fabrication method including the steps of: forming first gate insulating films in first to third active regions of a silicon substrate; wet-etching the first gate insulating film of the second active region through a first resist opening portion of a first resist pattern; forming a second gate insulating film in the second active region; forming on the silicon substrate a second resist pattern having a second resist portion larger than the first resist opening portion; wet-etching the first gate insulating film of the third active region through a second resist opening portion of the second resist pattern; and forming a third gate insulating film in the third active region.

9 Claims, 52 Drawing Sheets

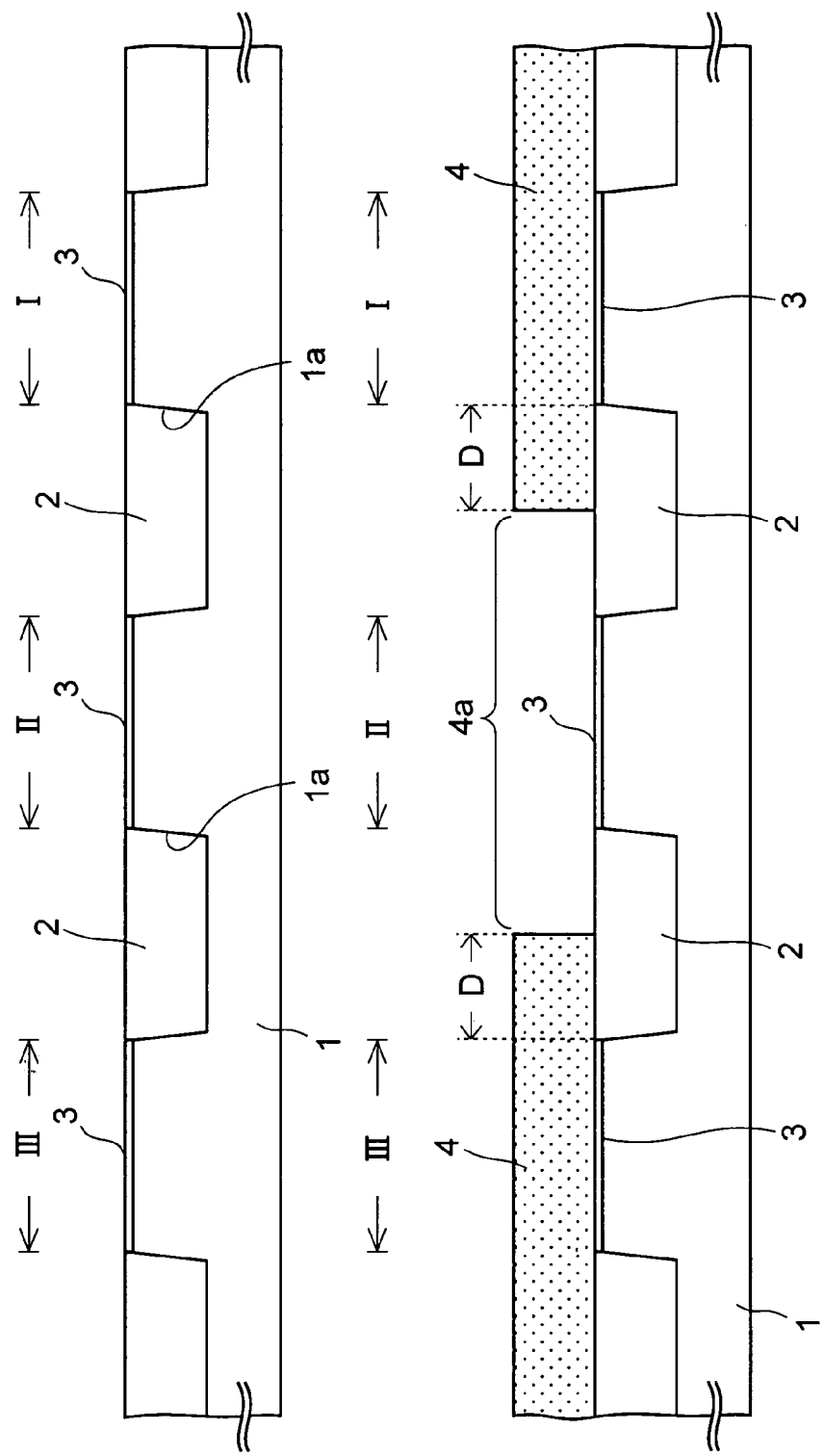

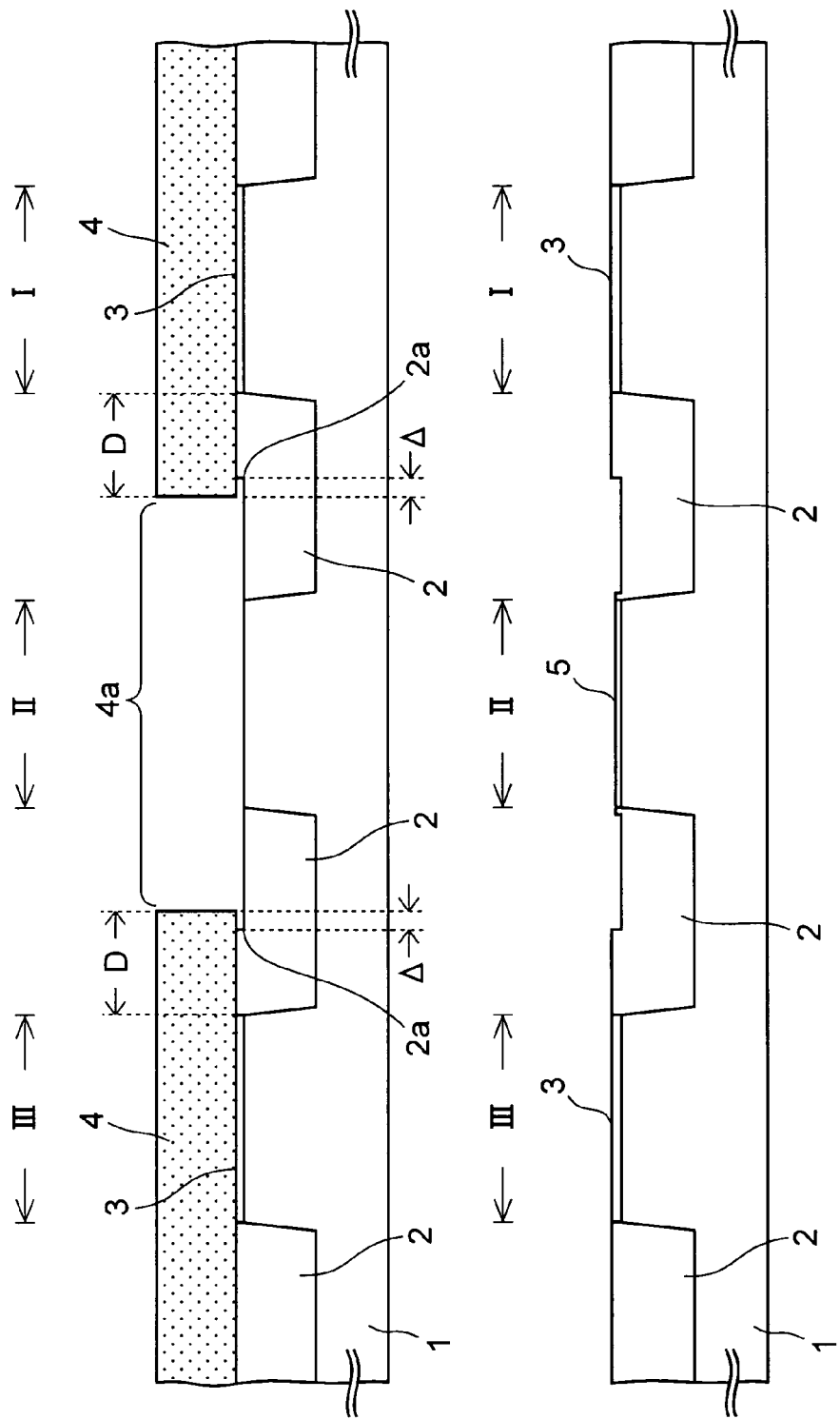

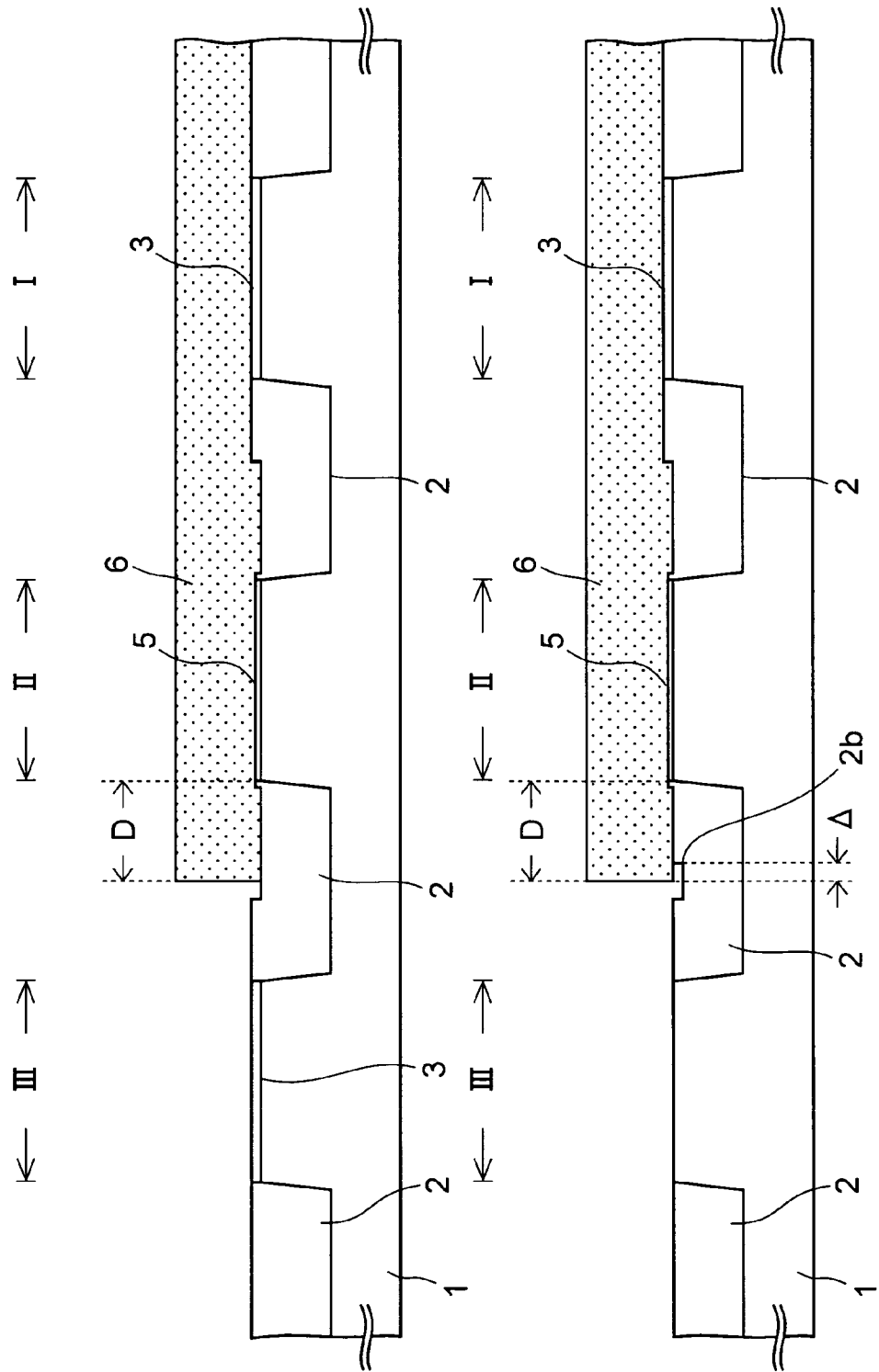

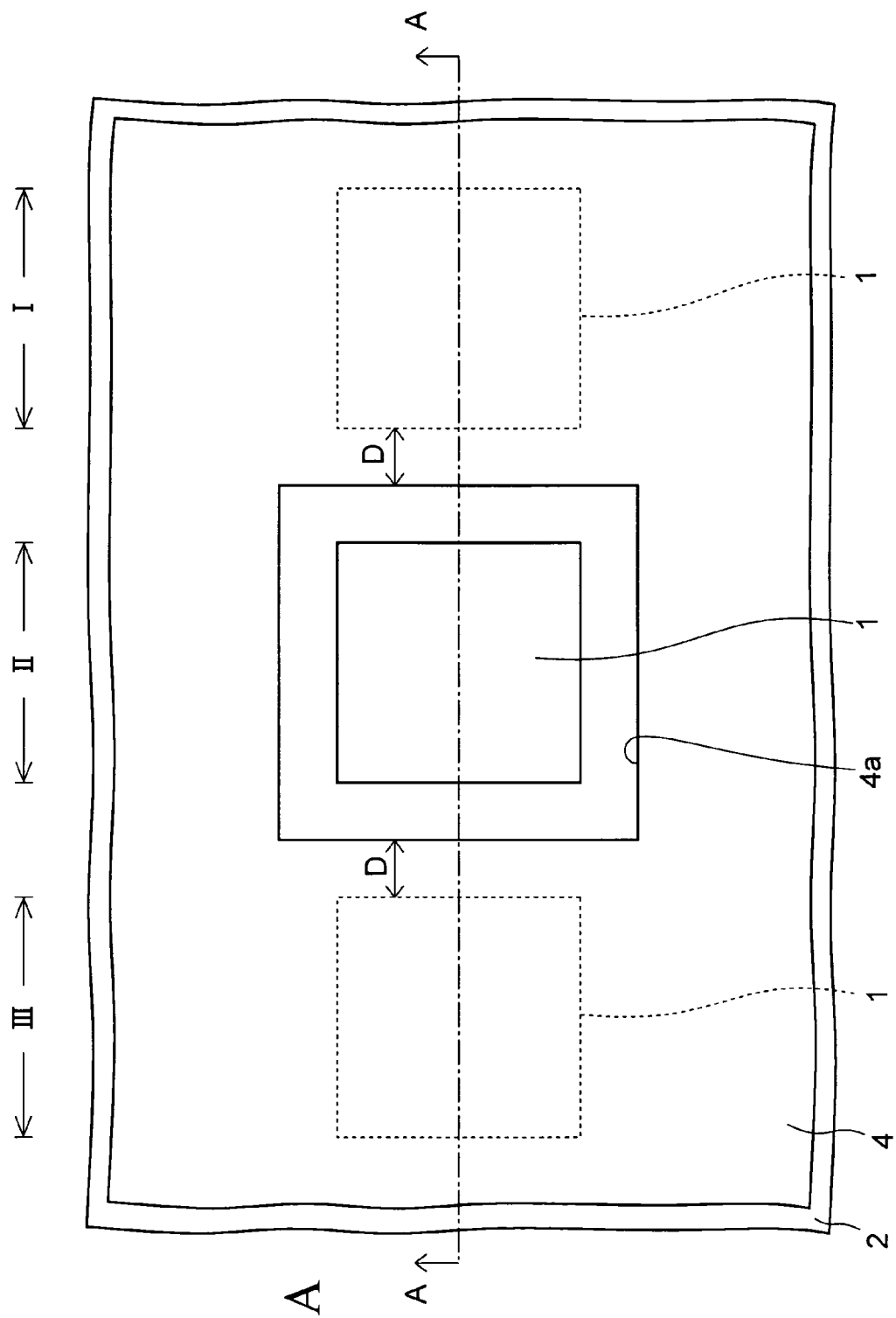

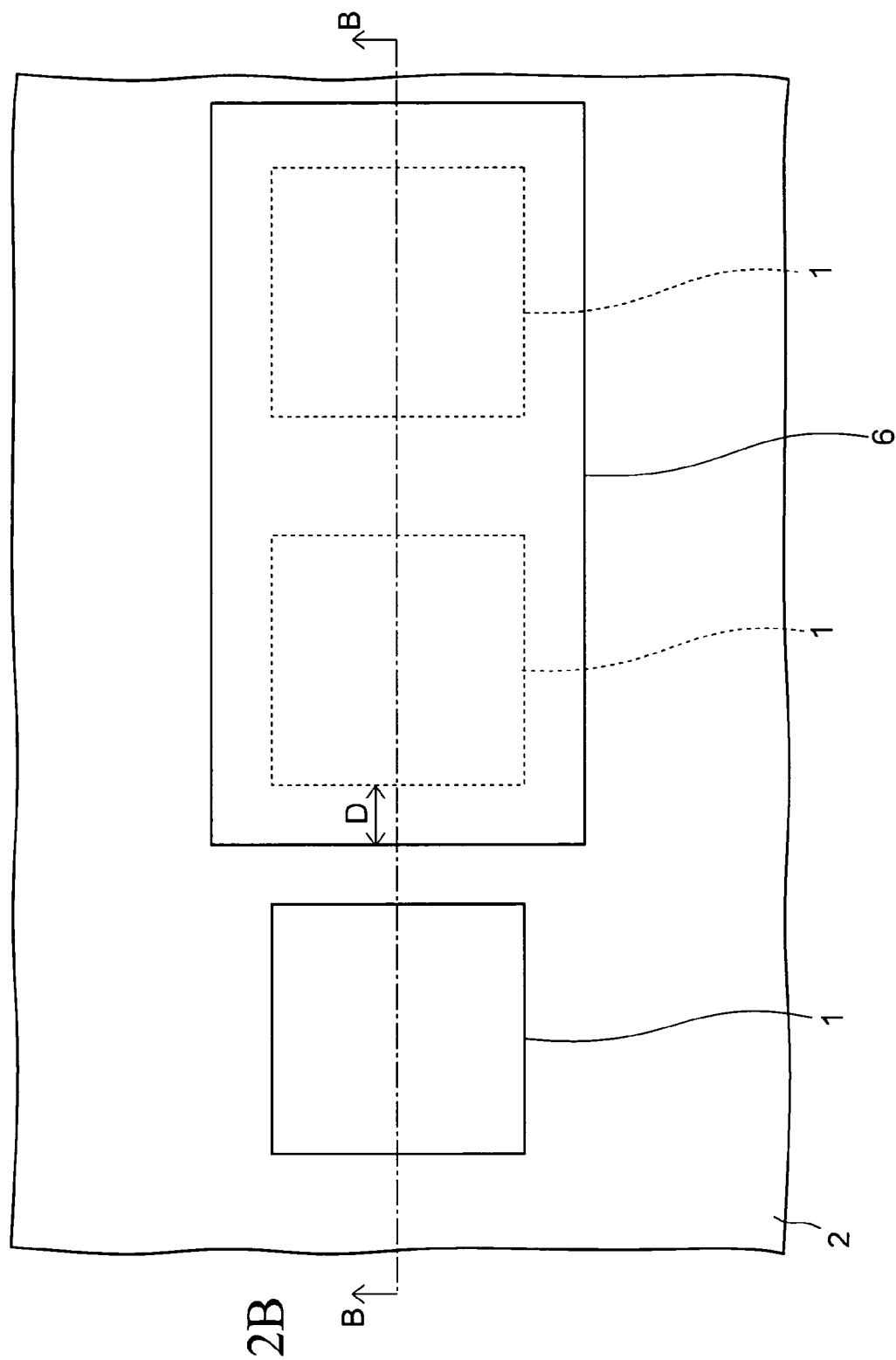

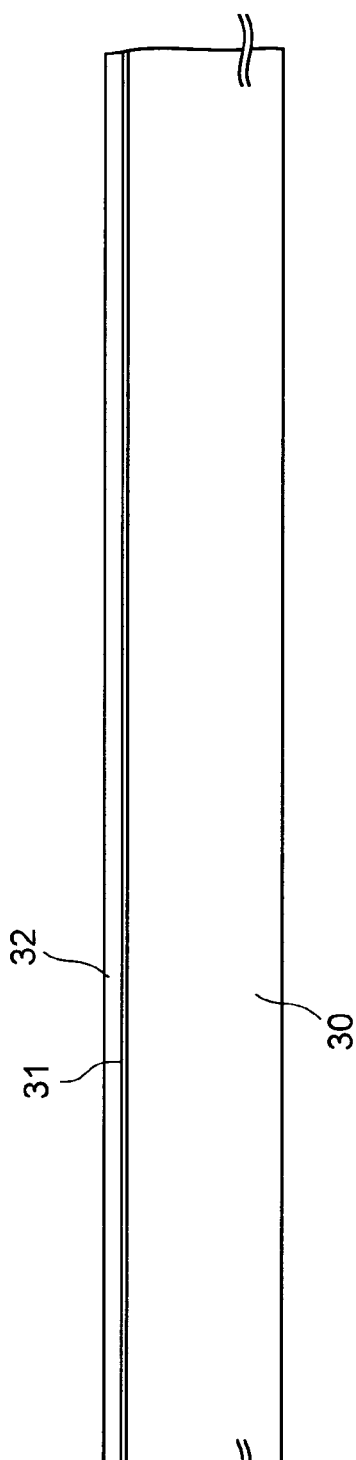
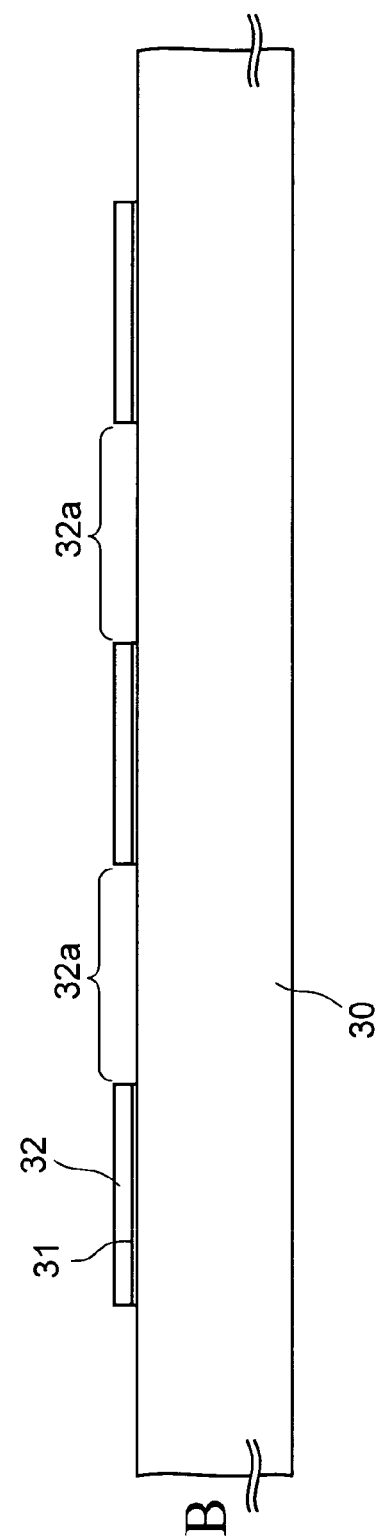
FIG. 7A
FIG. 7B

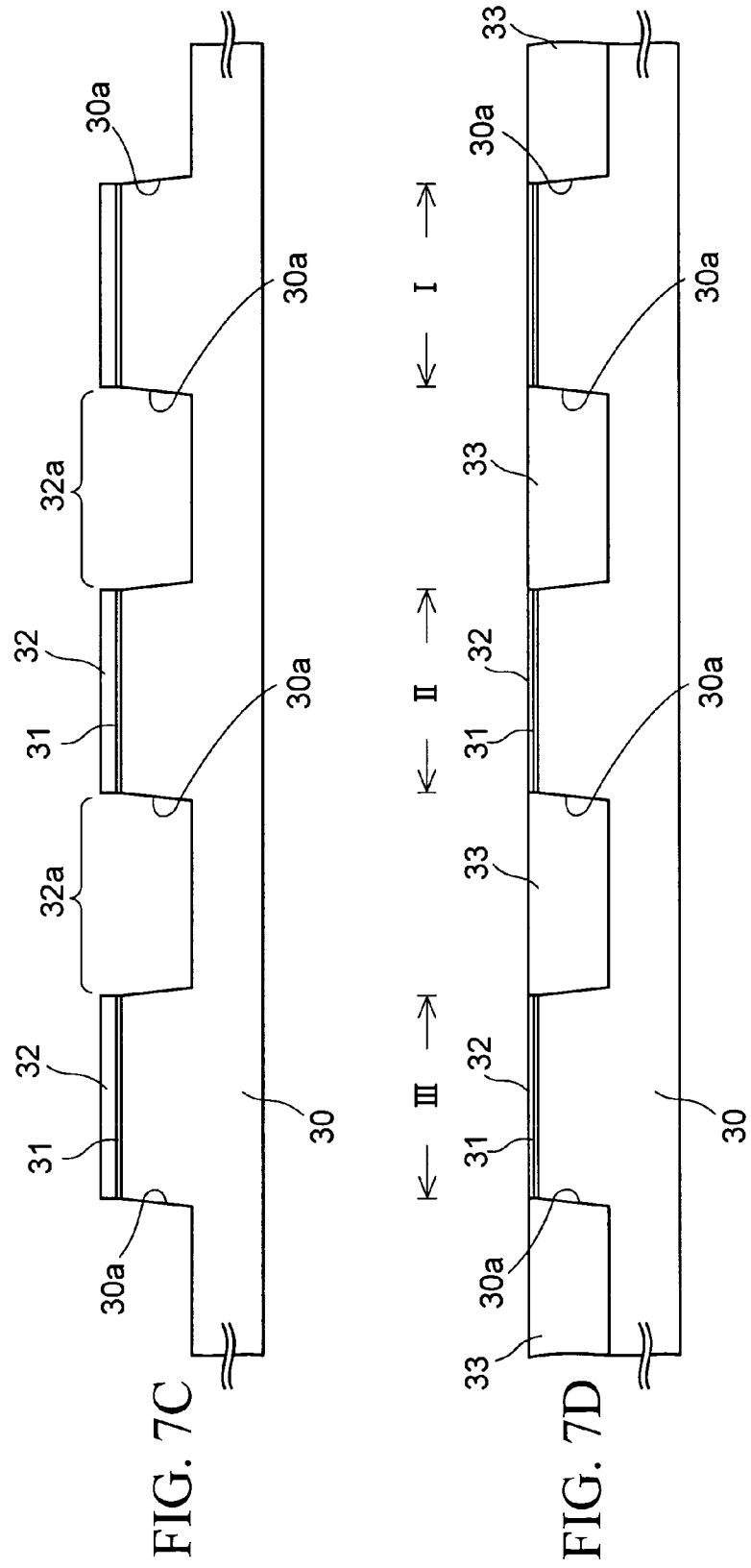

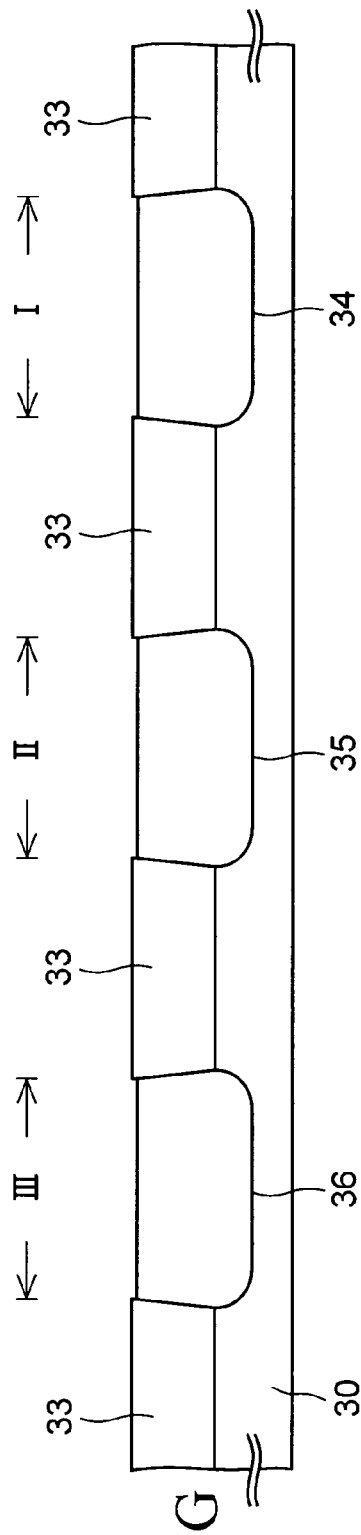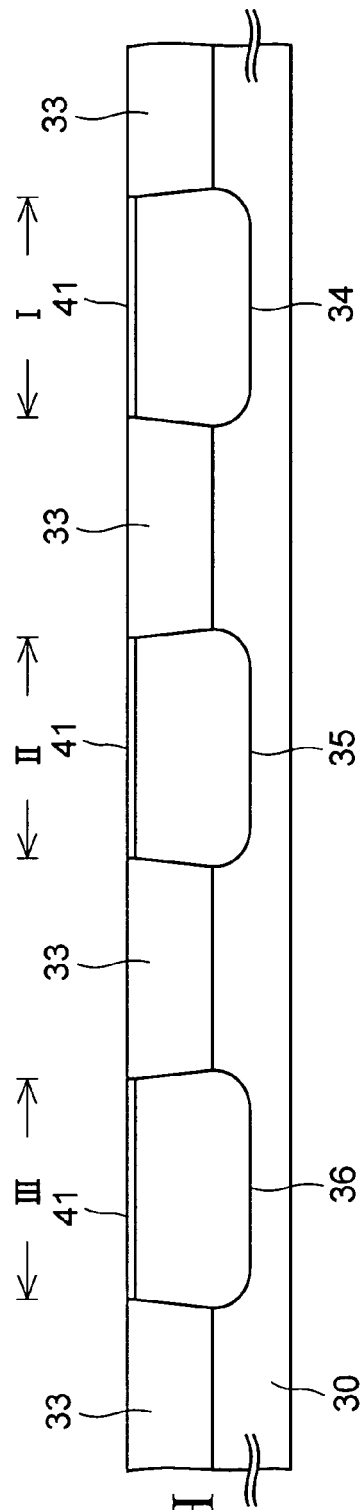

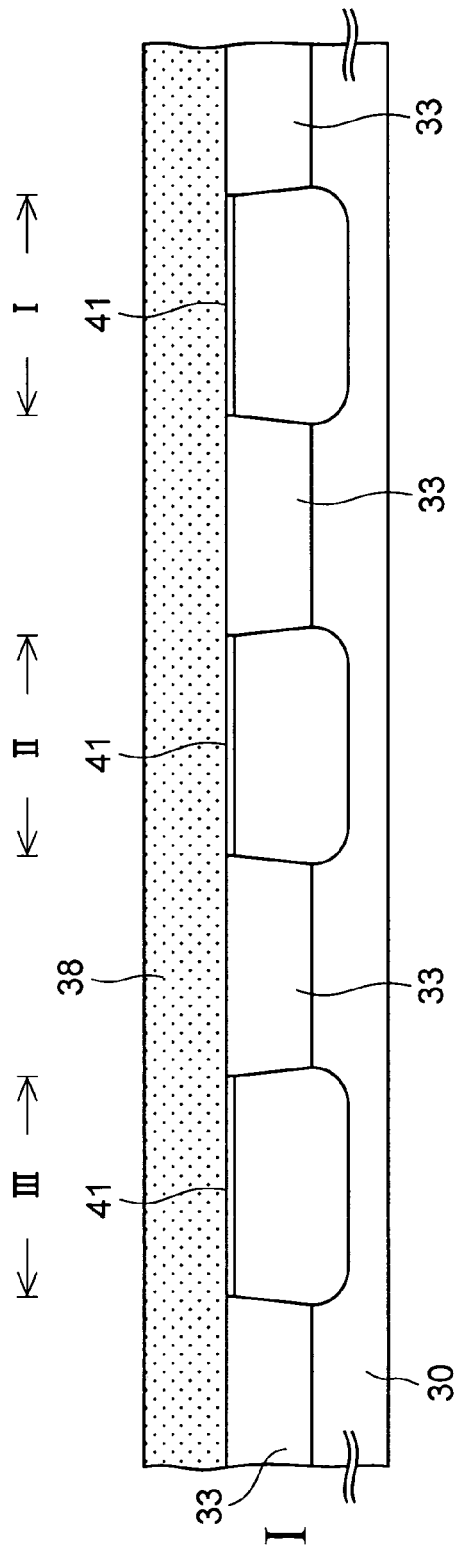
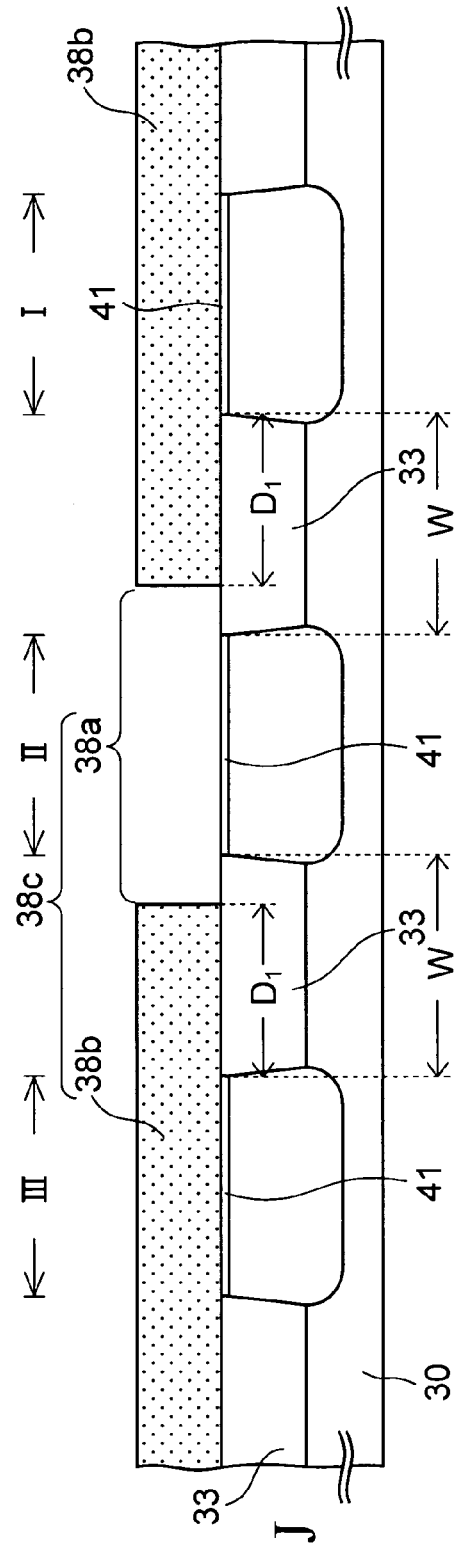
FIG. 7I
FIG. 7J

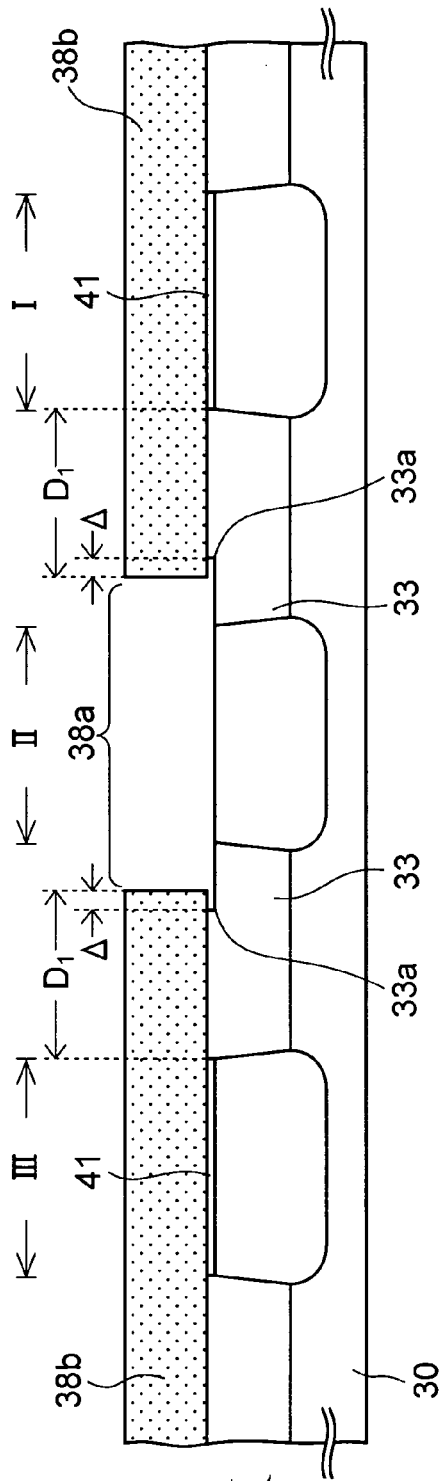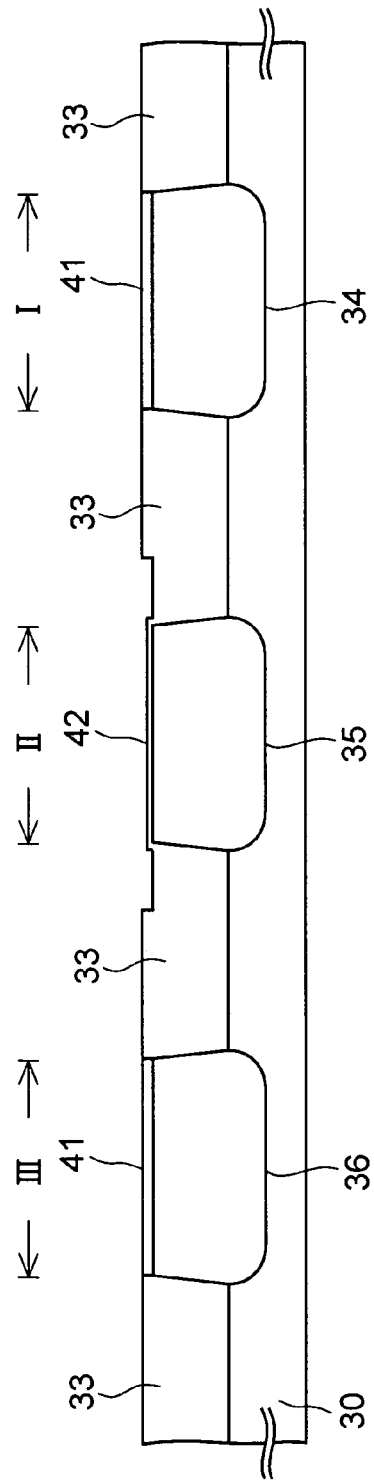

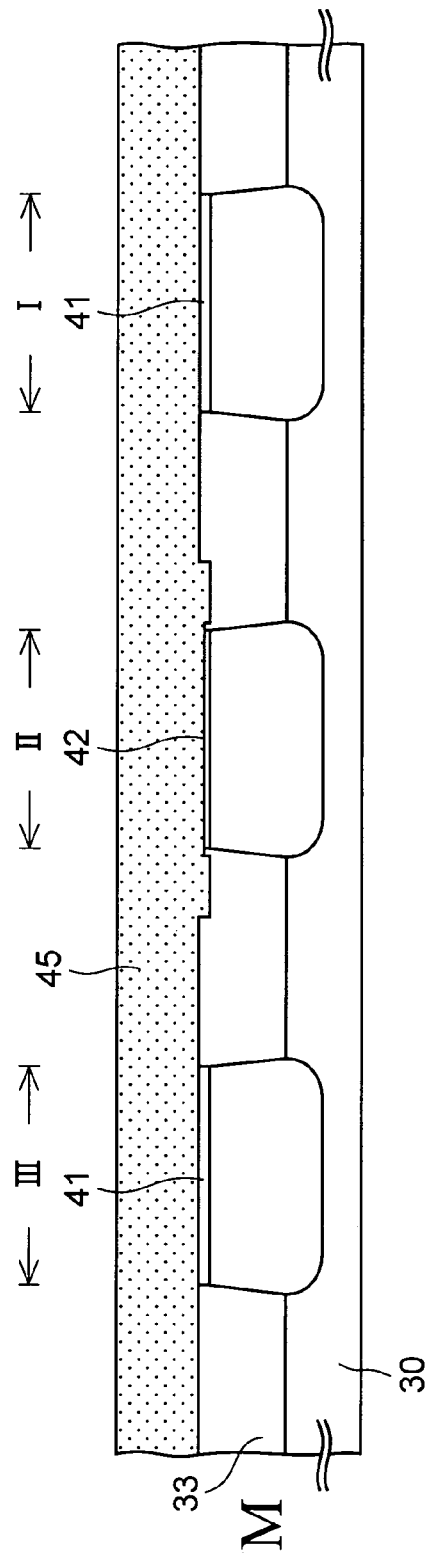
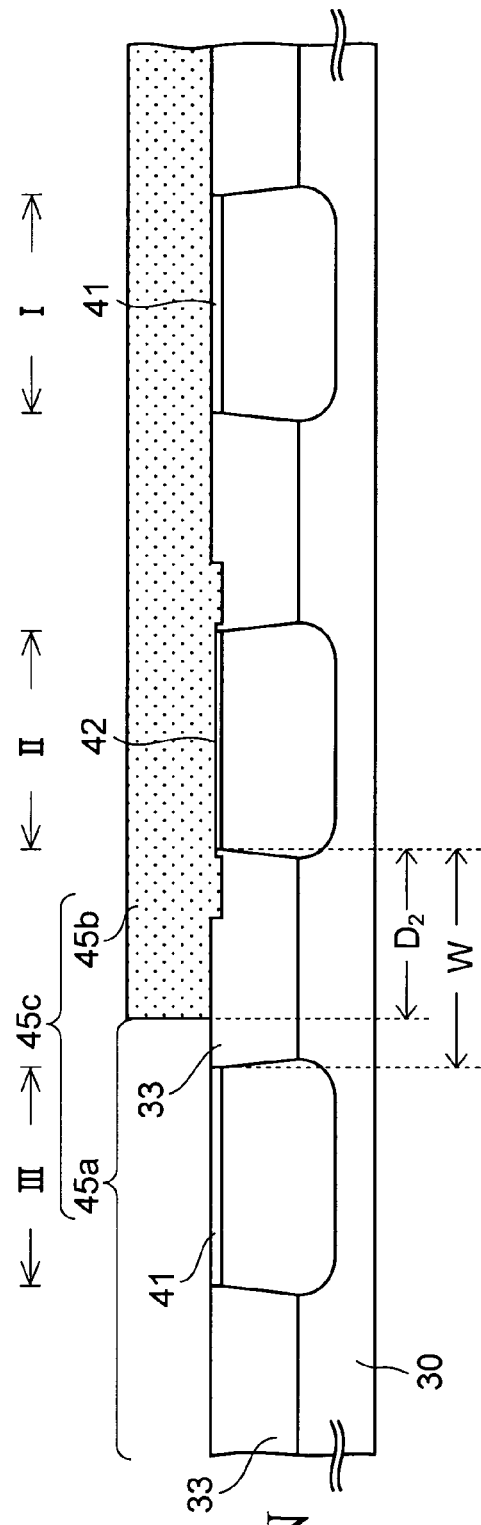
FIG. 7M
FIG. 7N

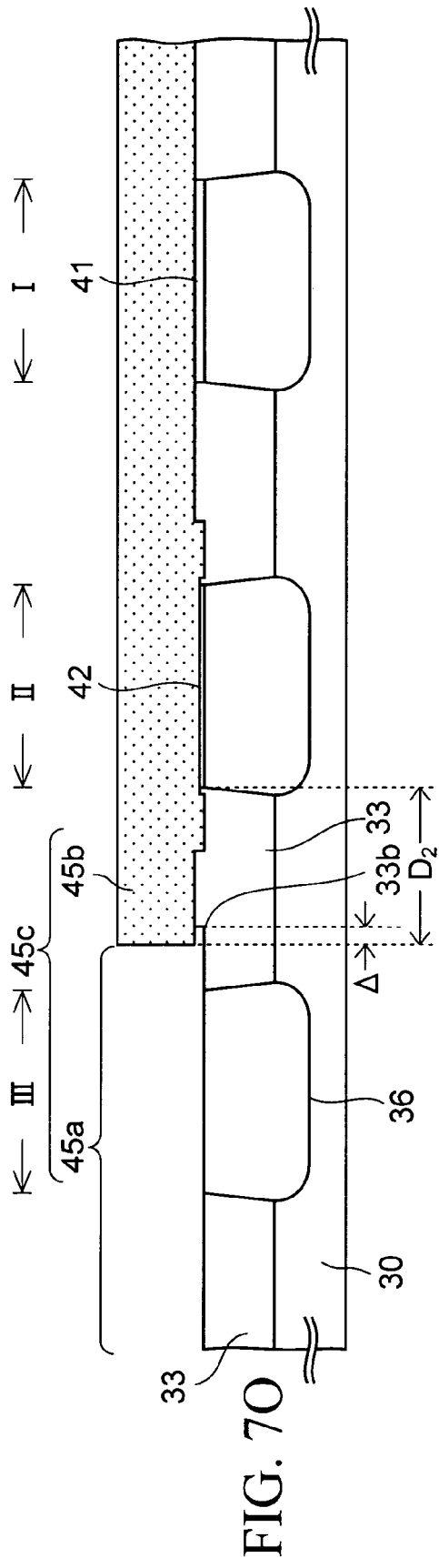
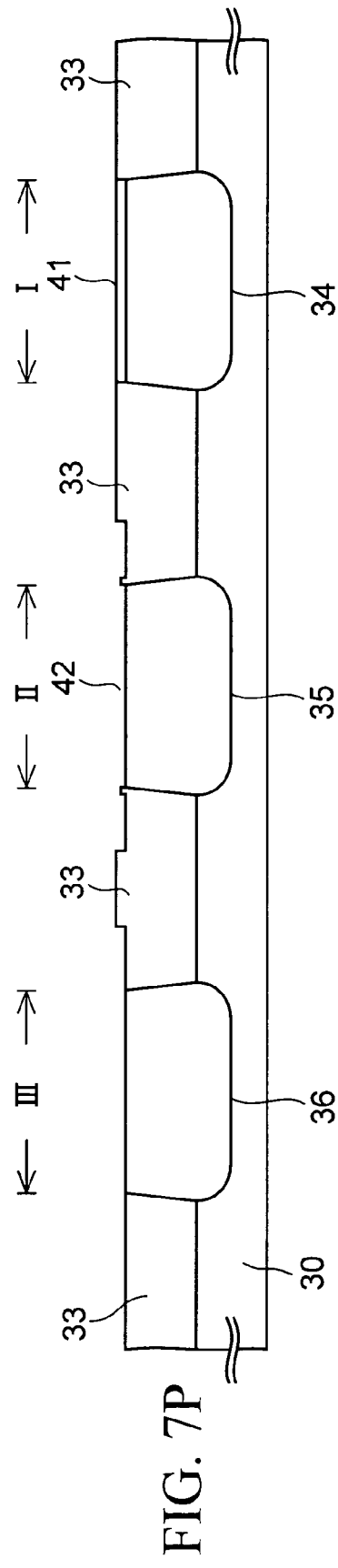
FIG. 7O
FIG. 7P

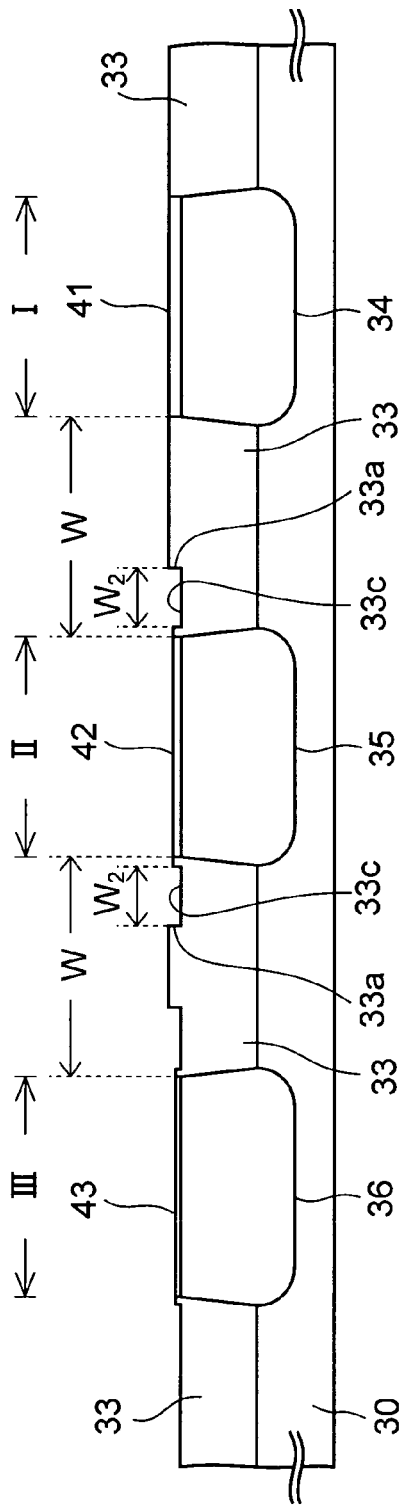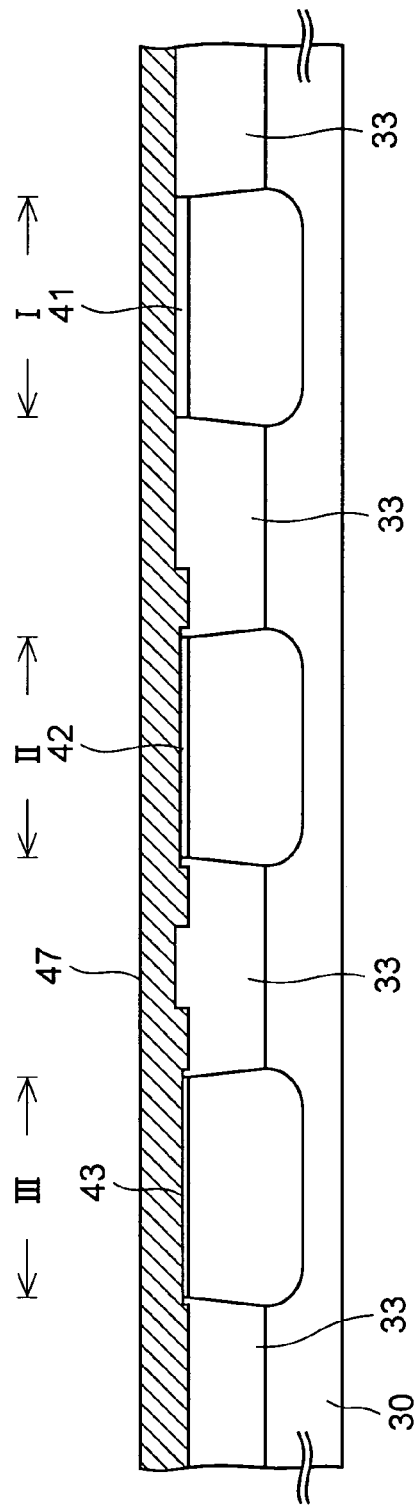

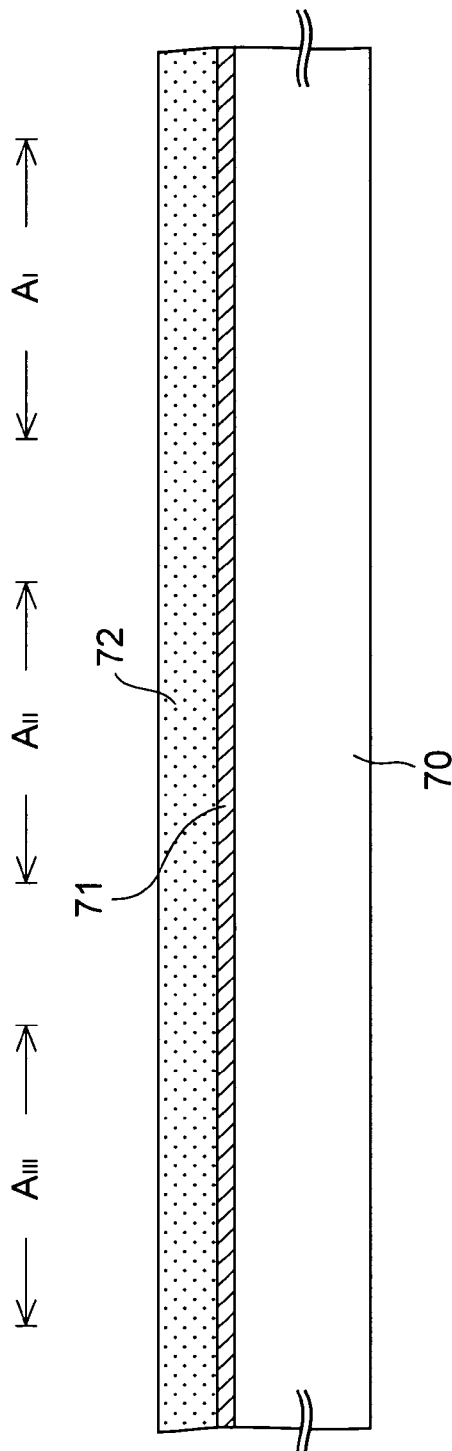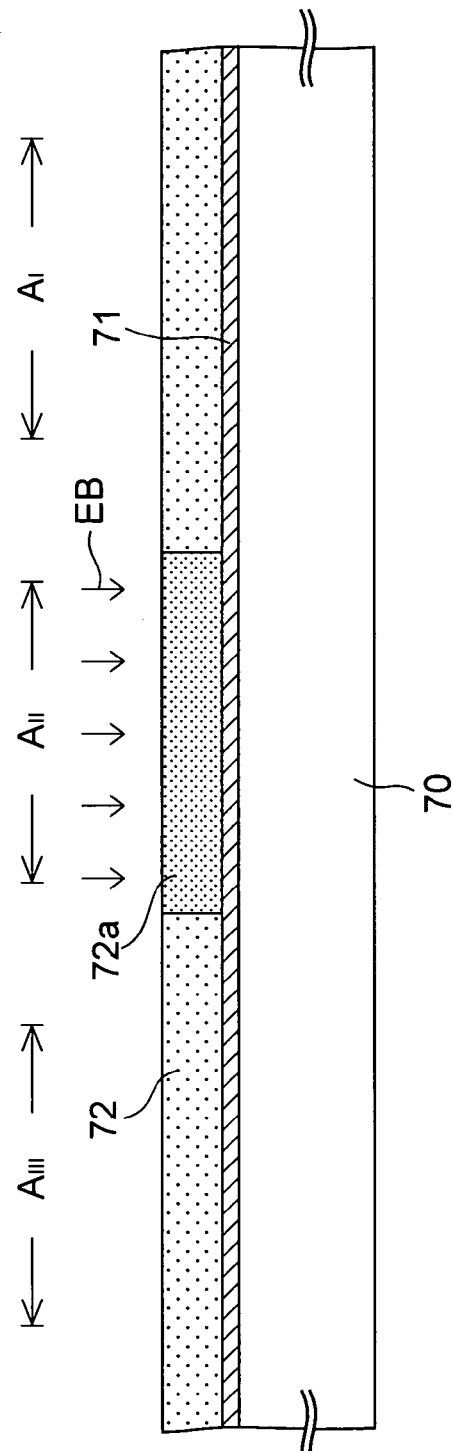

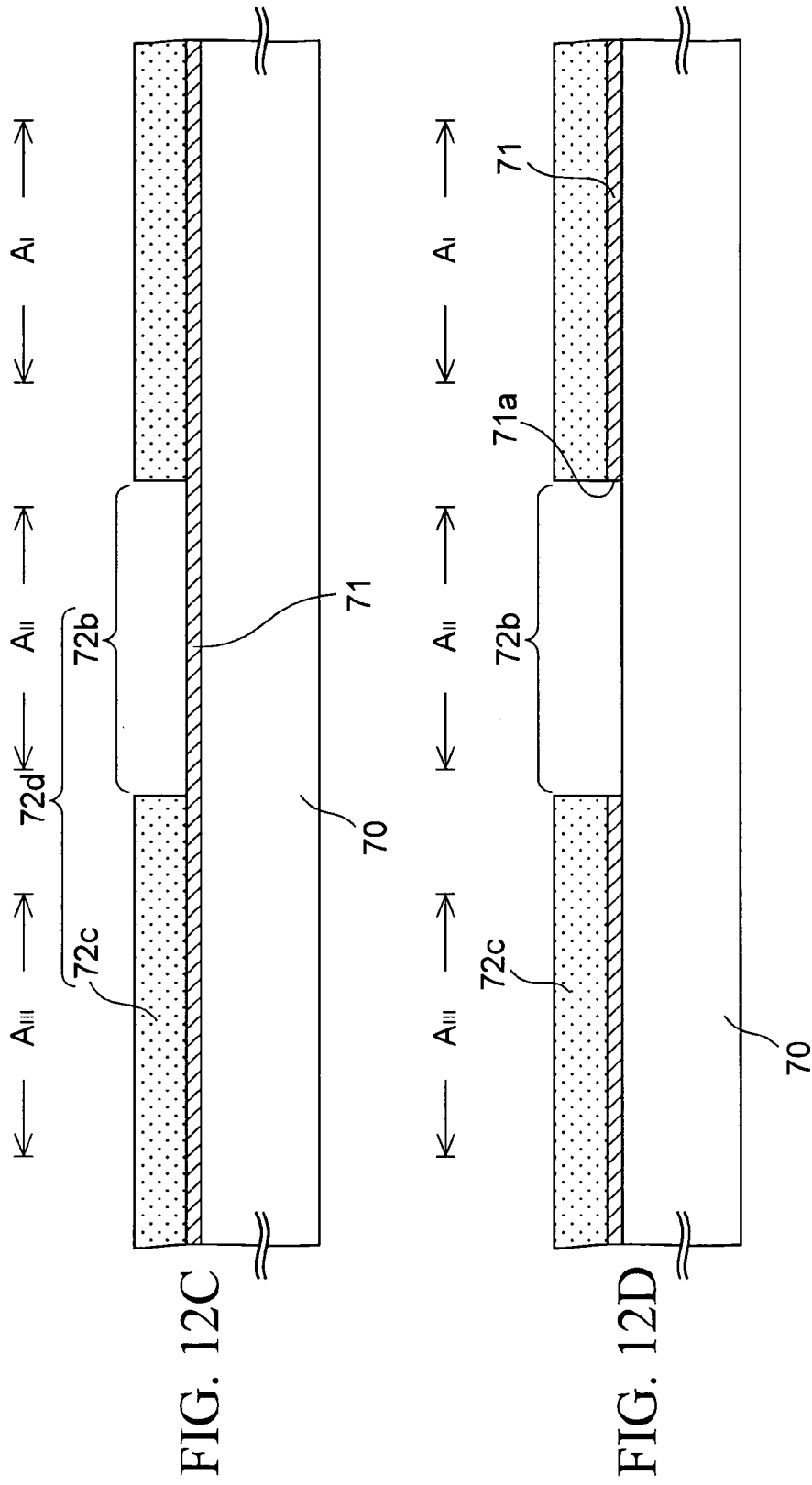

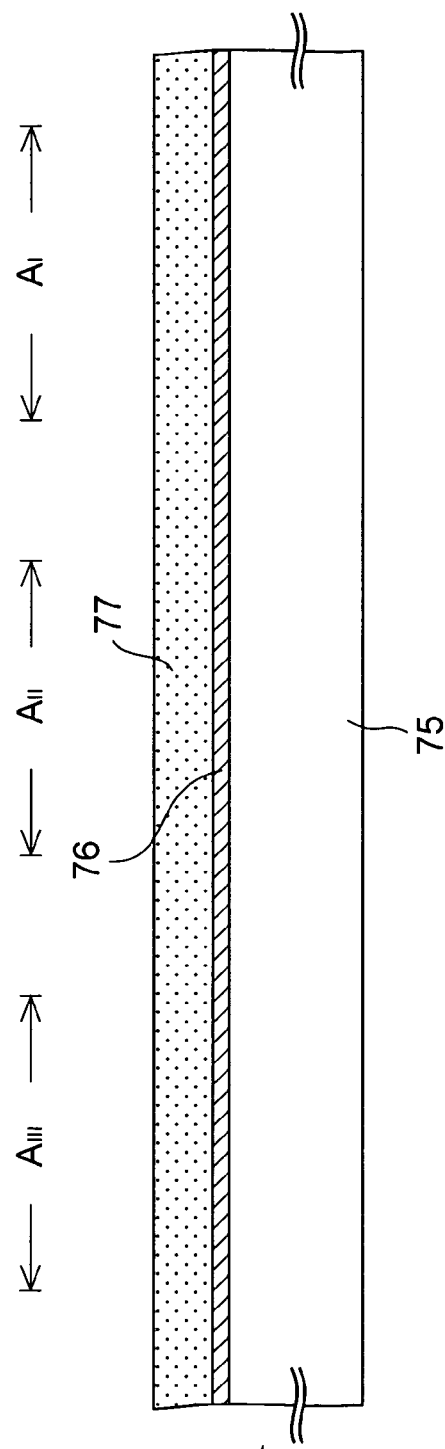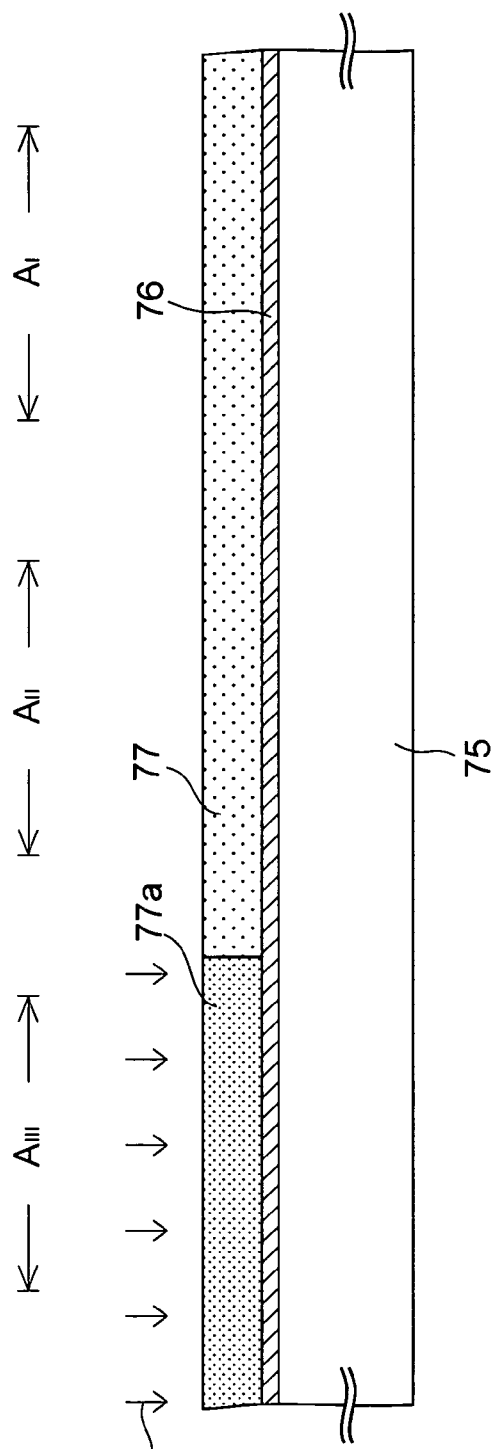
FIG. 15A
FIG. 15B

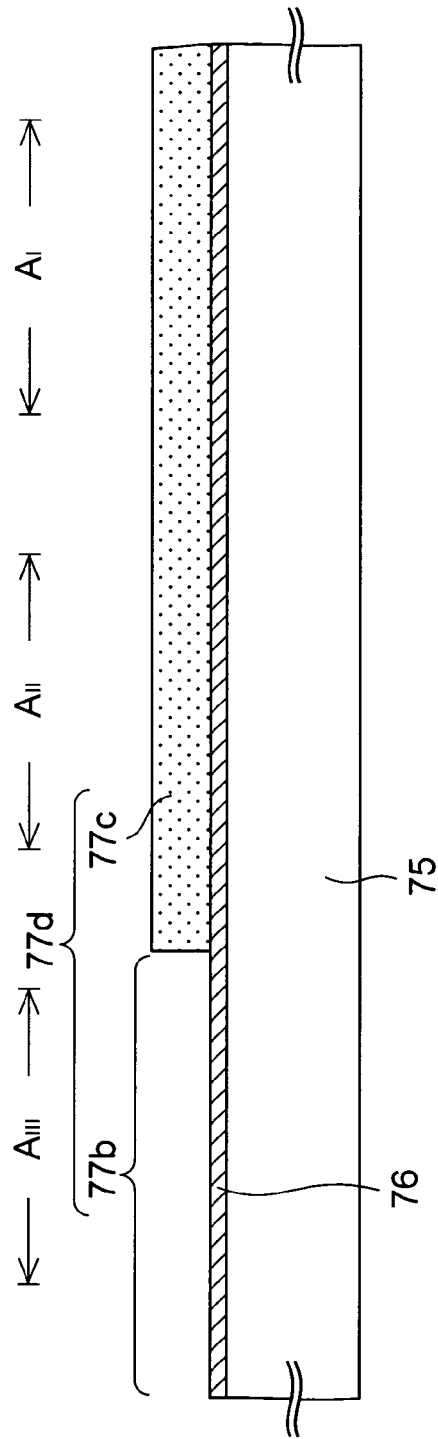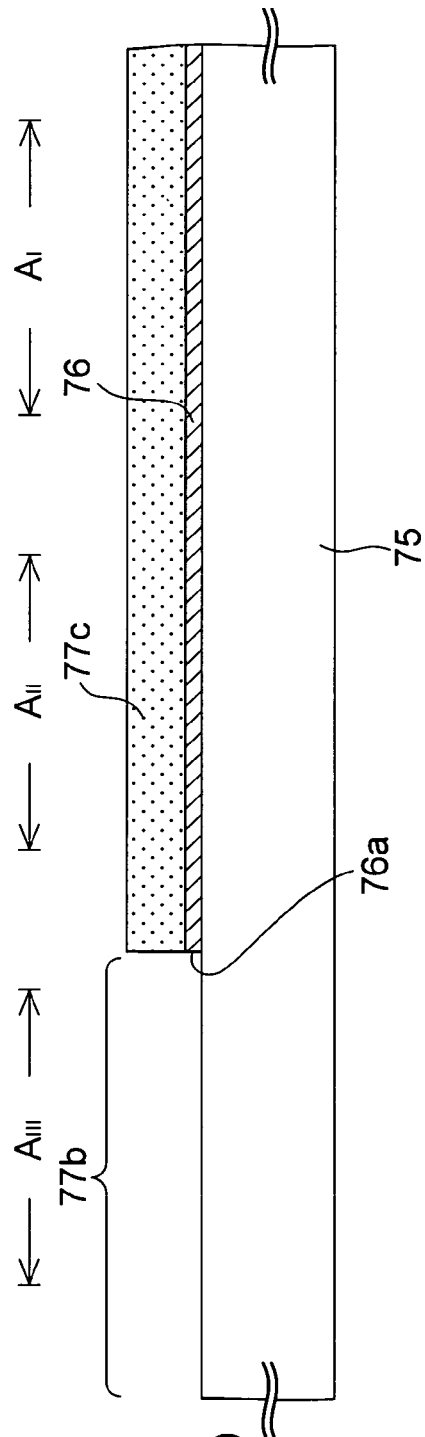

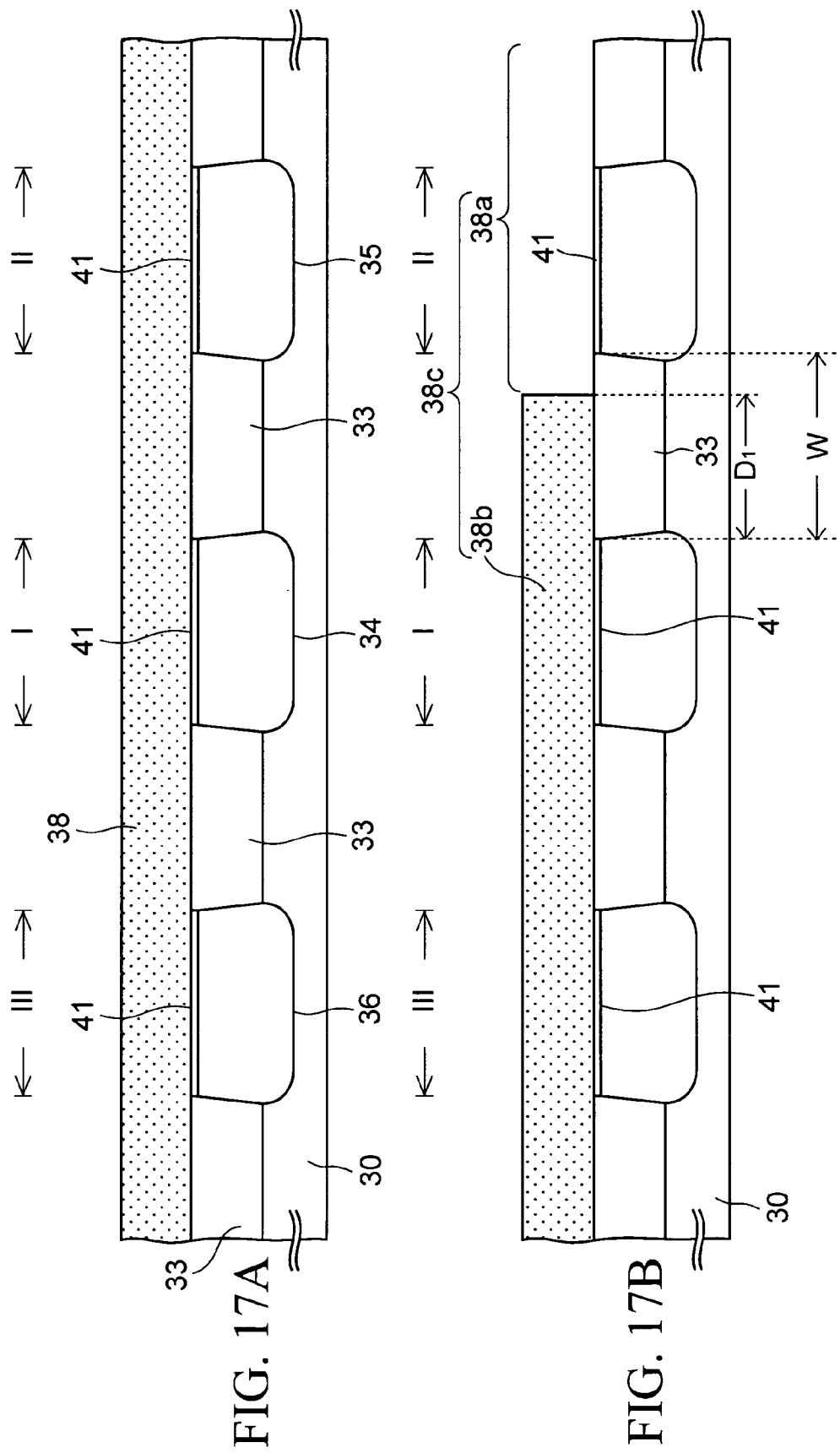

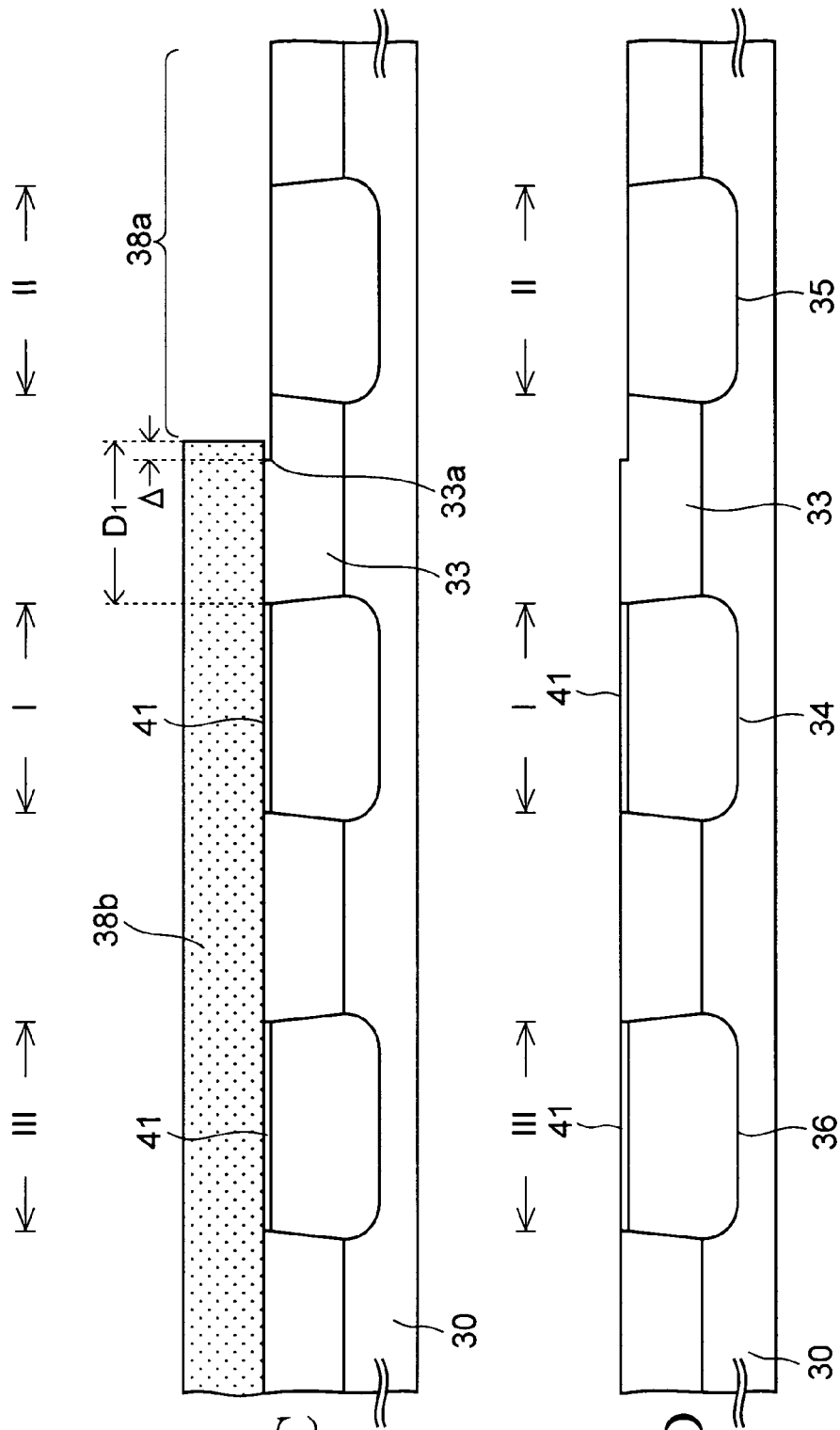

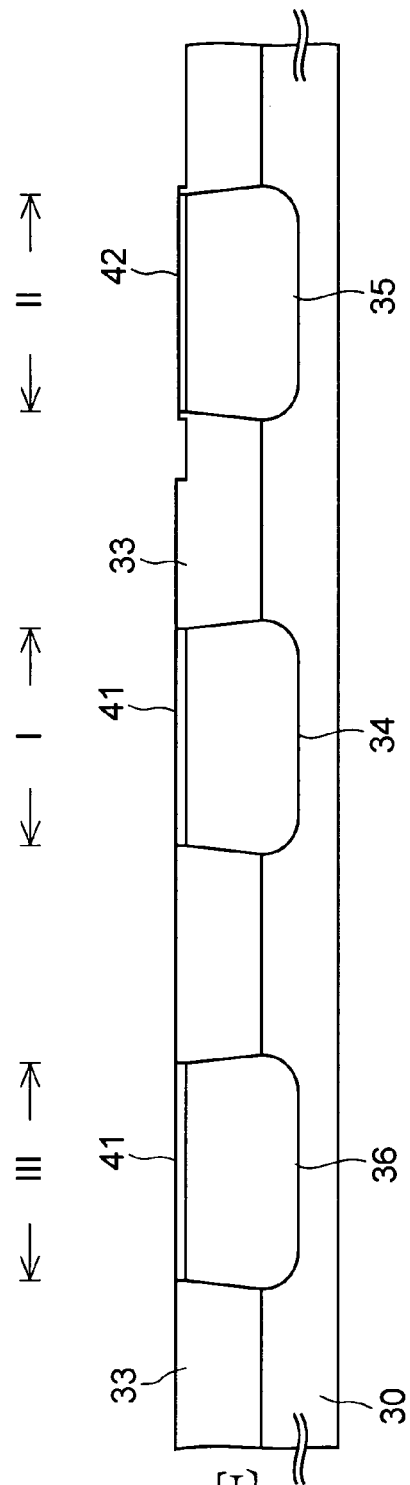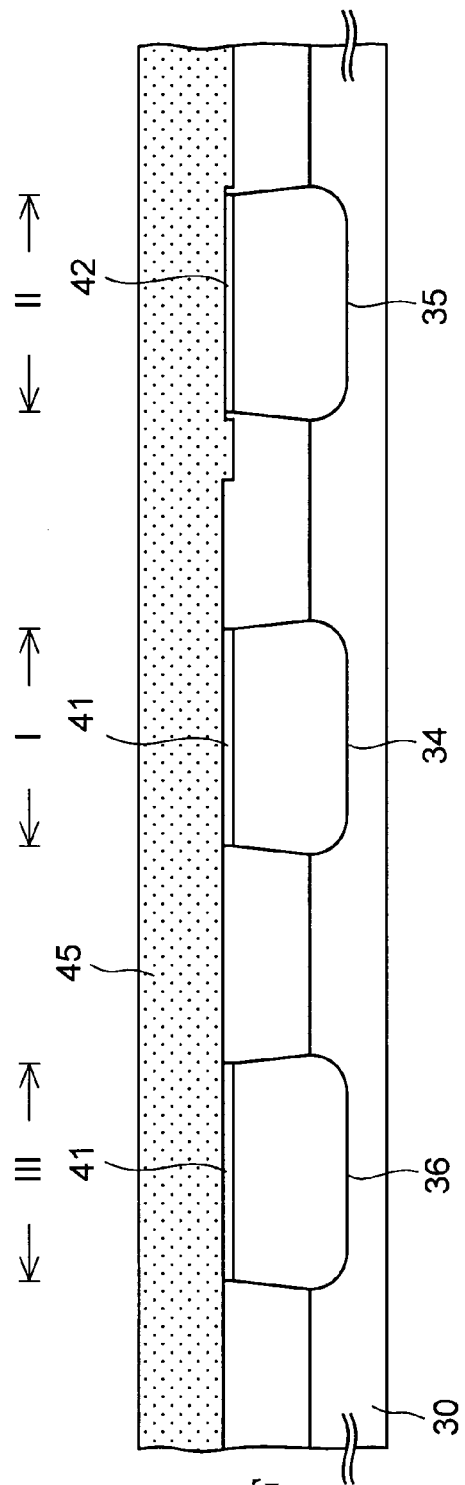
FIG. 17E
FIG. 17F

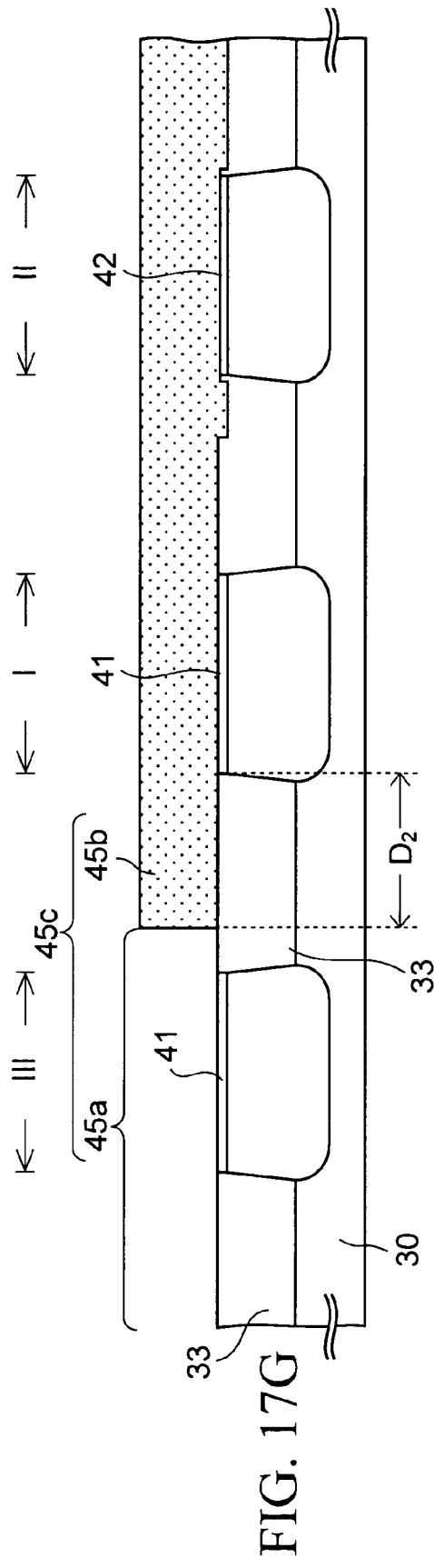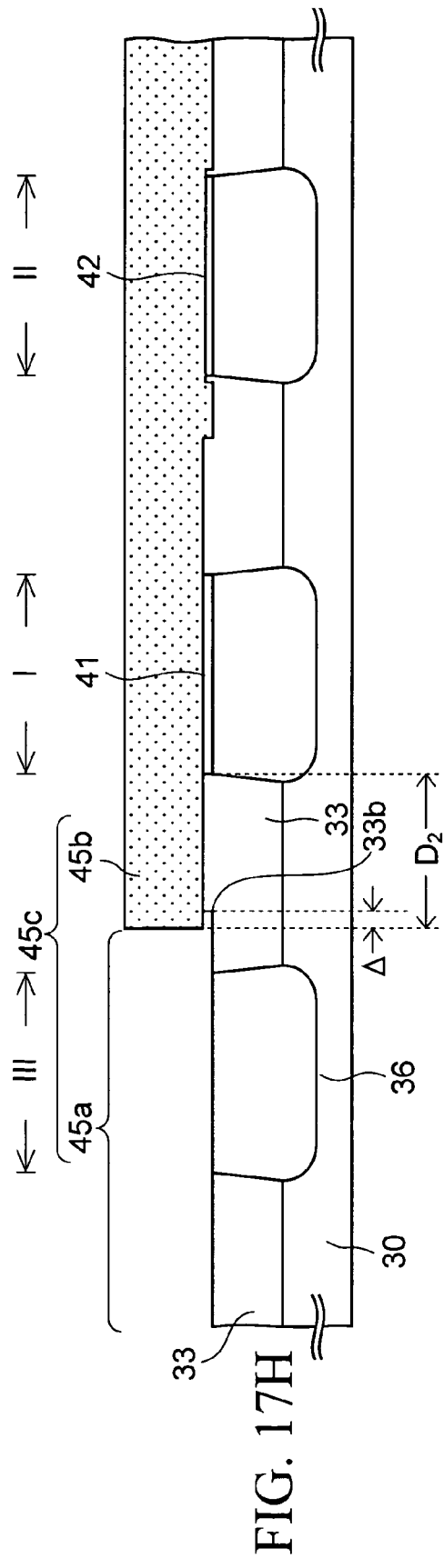

SEMICONDUCTOR DEVICE AND METHOD OF FABRICATING THE SAME

CROSS-REFERENCE TO RELATED APPLICATIONS

This application is based on and claims priority of Japanese Patent Application No. 2005-227041 filed on Aug. 4, 2005, the entire contents of which are incorporated herein by reference.

BACKGROUND OF THE INVENTION

1. Field of the Invention

The present invention relates to a semiconductor device and a method of fabricating the same.

2. Description of the Related Art

In a semiconductor logic device, e.g., a logic LSI, one chip is partitioned into a core unit and an input/output unit. Of these units, the core unit mainly performs operations, and the input/output unit transmits or receives a signal to/from an external circuit.

MOS transistors formed in the core unit need to perform operations at high speed, and therefore gate insulating films thereof are formed to be thin. On the other hand, in MOS transistors of the input/output unit, since a high voltage used in the external circuit is used, gate insulating films thicker than those of the core unit are formed in order to increase the breakdown voltages between a substrate and gates and to reduce standby leakage currents.

However, if gate insulating films are thick, the driving abilities of MOS transistors are deteriorated. Meanwhile, if gate insulating films are thin, leakage currents between a substrate and gates may be increased. Accordingly, in recent years, gate insulating films having thicknesses intermediate between those of the above-described thick and thin gate insulating films have been formed in the core unit or the input/output unit, thus forming MOS transistors which have driving abilities more excellent than those of the input/output MOS transistors and in which leakage currents are reduced compared to those of the MOS transistors for operations.

As a result, in an LSI fabrication process, as disclosed in Japanese Unexamined Patent Publication No. 2003-203988, it is necessary to form, on one semiconductor substrate, gate insulating films having three kinds of thicknesses, i.e., thin gate insulating films, intermediate-thickness gate insulating films, and thick gate insulating films.

There are several methods of forming three gate insulating films having different thicknesses as described above. In FIGS. 14 and 15 of the following Patent Literature 1, the formation and removal of thermal oxide films which become gate insulating films are performed at a plurality of times, thereby forming gate insulating films having different thicknesses in three regions of a semiconductor substrate.

However, if wet etching for removing thermal oxide films is performed at a plurality of times, there arises the problem that a device-isolation insulating film is etched at end portions of the gate insulating films and that an electric field concentrates at the vicinities of the etched portions (divots) of the device-isolation insulating film, as described in paragraph 0021 of the Patent Literature 1.

In order to solve the problem, the Patent Literature 1 proposes a method in which three gate insulating films having different thicknesses are respectively formed in three regions of a semiconductor substrate while the removal of a thermal oxide film which becomes a gate insulating film is performed only once in one region of the semiconductor substrate.

Even when the removal of a thermal oxide film is performed only once in one region as described above, it is necessary to advance the miniaturization of a semiconductor device which has been desired in recent years.

[Patent Literature 1] Japanese Unexamined Patent Publication No. 2003-203988

SUMMARY OF THE INVENTION

According to a first aspect of the present invention, provided is a semiconductor device fabrication method including the steps of: forming a device-isolation insulating film in a semiconductor substrate to isolate first to third active regions of the semiconductor substrate with the device-isolation insulating film; forming first gate insulating films on the semiconductor substrate in the first to third active regions, respectively; forming a first resist pattern on the device-isolation insulating film and the first gate insulating films, which first resist pattern has a first resist opening portion surrounding the second active region and a first resist portion covering the first and third active regions; removing the first gate insulating film of the second active region through the first resist opening portion by wet etching; removing the first resist pattern; forming a second gate insulating film on the semiconductor substrate in the second active region after removing the first resist pattern, which second gate insulating film is thinner than the first gate insulating film; forming a second resist pattern on the device-isolation insulating film and the first and second gate insulating films, which second resist pattern has a second resist opening portion surrounding the third active region and a second resist portion covering the first and second active regions and being larger than that of the first resist opening portion of the first resist pattern; removing the first gate insulating film of the third active region through the second resist opening portion by wet etching; removing the second resist pattern; forming a third gate insulating film on the semiconductor substrate in the third active region after removing the second resist pattern, which third gate insulating film is thinner than the second gate insulating film; forming first to third gate electrodes on the first to third gate insulating films, respectively; and forming first to third source/drain regions in the semiconductor substrate on both sides of the first to third gate electrodes, respectively.

The above-described steps of forming the first resist pattern and forming the second resist pattern are performed by exposing first and second photoresists using first and second reticles and then developing the first and second photoresists, respectively.

Further, the first and second reticles are fabricated by a reticle fabrication method including the steps of: generating first to third active region designation frames respectively corresponding to the first to third active regions; generating a first film thickness designation frame surrounding the first active region designation frame; generating a second film thickness designation frame surrounding the second active region designation frame so that the second film thickness designation frame is connected to the first film thickness designation frame; shrinking the first film thickness designation frame to generate a shrunk frame; patterning a first film on a first transparent substrate by lithography using shape data on the shrunk frame, and removing a portion of the first film which corresponds to an inside of the first film thickness designation frame to form in the portion a first mask opening portion corresponding to the first resist opening portion, thus forming the first film and the first transparent substrate into the first reticle; enlarging the first and second film thickness designation frames; combining the enlarged first and second film thickness designation frames to generate a third film thickness designation frame; and patterning a second film on a second transparent substrate by lithography using shape data on the third film thickness designation frame, and removing a portion of the second film which corresponds to an inside of the second film thickness designation frame to form in the portion a second mask opening portion corresponding to the second resist opening portion, thus forming the second film and the second transparent substrate into the second reticle.

According to the present invention, the first film thickness designation frame is shrunk to generate the shrunk frame, and the portion of the first film which corresponds to the inside of the shrunk frame is removed, whereby the first mask opening corresponding to the first resist opening portion of the first resist pattern is formed in the first reticle. Further, as for the second reticle, the third film thickness designation frame is generated by enlarging and combining the first and second film thickness designation frames, and the portion of the second film which corresponds to the outside of the third film thickness designation frame is removed, thereby forming the second mask opening corresponding to the second resist opening portion of the second resist pattern.

This makes it possible to form the second resist pattern so that the third active region of the semiconductor substrate is exposed without generating a graphic such as a frame overlapping the third active region designation frame when the second reticle for forming the second resist pattern is designed. Accordingly, in the case where a plurality of transistors which includes third gate insulating films having the smallest thickness and which can operate at high speed are designed, the transistors are prevented from becoming difficult to design because of graphics overlapping the third active region designation frames. Thus, a burden on a designer of the semiconductor device can be reduced.

Moreover, in the present invention, the first and second mask opening portions are formed in the first and second reticles by shrinking the first film thickness designation frame and enlarging the first and second film thickness designation frames. Accordingly, in the first and second resist patterns formed using these reticles, the planar shape of the second resist portion becomes larger than that of the first resist opening portion. This makes it possible to reduce the width of the device-isolation insulating film while overlapping each of the first and second resist portions and the device-isolation insulating film by a distance longer than a length by which an etchant penetrates to the interface between each of the first and second resist patterns and the device-isolation insulating film. Thus, it is possible to advance the miniaturization of a semiconductor device including the first to third gate insulating films having different thicknesses.

Furthermore, according to another aspect of the present invention, provided is a semiconductor device including: a semiconductor substrate; a device-isolation insulating film which is formed in the semiconductor substrate and isolates first to third active regions of the semiconductor substrate; first to third gate insulating films whose thicknesses decrease in this order and which are respectively formed in the first to third active regions of the semiconductor substrate; first to third gate electrodes respectively formed on the first to third gate insulating films; and first to third source/drain regions formed in the semiconductor substrate on both sides of the first to third gate electrodes, respectively. Here, a recessed portion having a width less than half of a width of the device-isolation insulating film is formed near the second active region in an upper surface of the device-isolation insulating film which is adjacent to the second active region.

BRIEF DESCRIPTION OF THE DRAWINGS

FIGS. 1A to 1G are cross-sectional views of a hypothetical semiconductor device in the process of being fabricated;

FIGS. 2A and 2B are plan views of the hypothetical semiconductor device in the process of being fabricated;

FIGS. 12A to 12E are cross-sectional views of a first reticle used in the first embodiment of the present invention in the process of being fabricated;

FIGS. 15A to 15E are cross-sectional views of a second reticle used in the first embodiment of the present invention in the process of being fabricated;

FIGS. 17A to 17K are cross-sectional views of a semiconductor device according to a second embodiment of the present invention in the process of being fabricated;

Figure 1G:
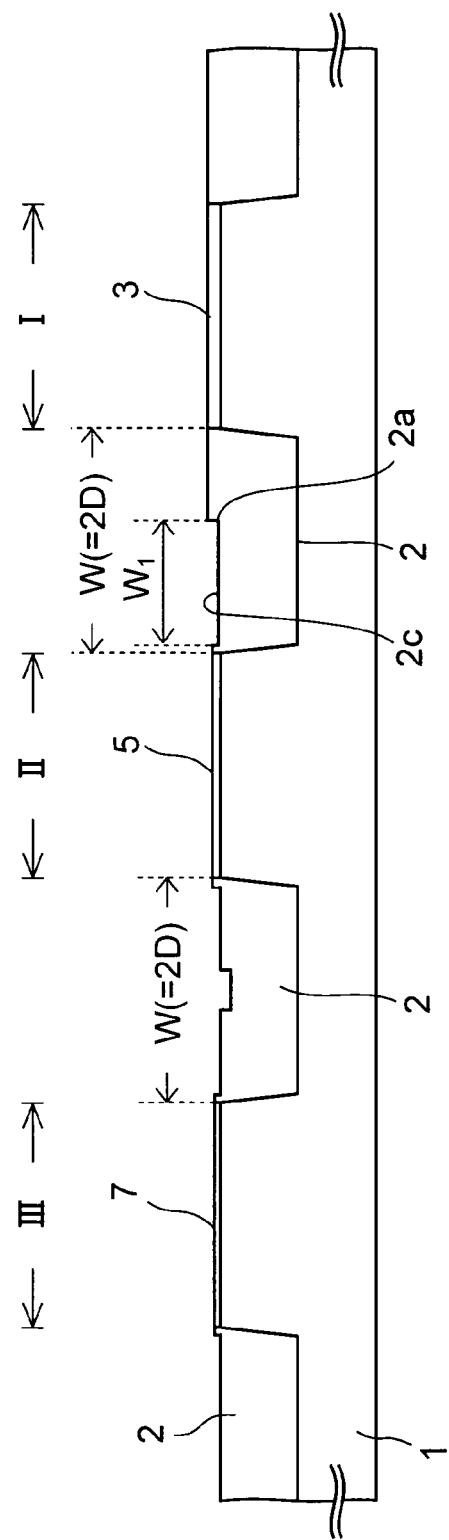

DESCRIPTION OF THE PREFERRED EMBODIMENTS (1) Preliminary Explanation

Before embodiments of the present invention will be described, preliminary matters of the present invention will be described.

FIGS. 1A to 1G are cross-sectional views of a hypothetical semiconductor device in the process of being fabricated.

To begin with, a process for obtaining the cross-sectional structure illustrated in FIG. 1A will be described.

First, a device-isolation trench 1a for shallow trench isolation (STI) is formed in a silicon substrate 1, and the device-isolation trench 1a is filled with a silicon oxide film served as a device-isolation insulating film 2. The silicon substrate 1 is partitioned, with the device-isolation insulating film 2, into a first active region I in which a thick gate insulating film is formed, a second active region II in which an intermediate-thickness gate insulating film is formed, and a third active region III in which a thin gate insulating film is formed.

After that, thermal oxide films having thicknesses of approximately 5 nm are formed by thermally oxidizing the surface of the silicon substrate 1. These thermal oxide films are referred to as first gate insulating films 3.

Then, as illustrated in FIG. 1B, photoresist is coated on the entire upper surface of the silicon substrate 1, and then is exposed and developed, thereby forming a first resist pattern 4 having a first window 4a in the second active region II. The side surface of the first window 4a is formed at a distance D from the first and third active regions I and III adjacent thereto. The distance D is typically approximately 0.26 μm.

Subsequently, as illustrated in FIG. 1C, the first gate insulating film 3 in the second active region II is removed by wet etching the first gate insulating film 3 through the first window 4a using a hydrofluoric acid solution.

It should be noted that in this wet etching, the hydrofluoric acid solution penetrates to a region under the lower surface of the first resist pattern 4 from the first window 4a. Accordingly, the device-isolation insulating film 2 around the first window 4a is also etched, and a step 2a of the device-isolation insulating film 2 recedes from the first window 4a outward by Δ. The receding distance Δ is typically approximately 0.05 μm. However, if the receding distance Δ is large, the first gate insulating films 3 in regions other than the second active region II, e.g., the first and third active regions I and III, are also etched. This makes it impossible to form gate insulating films having even thicknesses in these regions I and III.

Accordingly, in the aforementioned step of FIG. 1B, the overlap distance D between the first resist pattern 4 and the device-isolation insulating film 2 around the first window 4a is set sufficiently larger than the receding distance Δ due to the penetration of the etchant, whereby the first gate insulating films 3 in the first and third active regions I and III are prevented from being etched.

FIG. 2A is a plan view after this step has been finished. The aforementioned FIG. 1C is a cross-sectional view taken along the A-A line of FIG. 2A.

Subsequently, the first resist pattern 4 is removed.

Next, as illustrated in FIG. 1D, a thermal oxide film having a thickness of approximately 1.5 nm is formed on the surface of the silicon substrate 1 in the second active region II by heating the silicon substrate 1 in an oxygen-containing atmosphere. This thermal oxide film is referred to as a second gate insulating film 5. Meanwhile, in the first and third active regions I and III, the silicon substrate 1 under the first gate insulating films 3 is oxidized by this thermal oxidation, whereby the thicknesses of the first gate insulating films 3 are increased.

Then, as illustrated in FIG. 1E, photoresist is coated on the entire upper surface of the silicon substrate 1, and then is exposed and developed, thereby forming a second resist pattern 6 which covers the first and second active regions I and II. It should be noted that the third active region III is exposed without being covered with this second resist pattern 6.

Subsequently, as illustrated in FIG. 1F, the first gate insulating film 3 in the third active region III is wet etched by a hydrofluoric acid solution while using the second resist pattern 6 as an etching mask.

In this etching, as in the etching step of FIG. 1C, the hydrofluoric acid solution penetrates to the interface between the second resist pattern 6 and the device-isolation insulating film 2. Accordingly, a step 2b of the device-isolation insulating film 2 recedes, and the second gate insulating film 5 of the second active region II may be etched. In order to avoid such a disadvantage, in the aforementioned step of FIG. 1E, the overlap distance between the second resist pattern 6 and the device-isolation insulating film 2 around the third active region III is set to be a distance D which is sufficiently larger than the receding distance Δ of the step 2b. As in the case of FIG. 1C, the receding distance Δ is approximately 0.05 μm, and the distance D is approximately 0.26 μm.

FIG. 2B is a plan view after this step has been finished. The aforementioned FIG. 1F is a cross-sectional view taken along the B-B line of FIG. 2B.

Subsequently, the second resist pattern 6 is removed.

Then, as illustrated in FIG. 1G, the surface of the silicon substrate 1 in the third active region III is thermally oxidized by heating the silicon substrate 1 in an oxygen-containing atmosphere again, thus forming a thin thermal oxide film having a thickness of approximately 1.75 nm. This thermal oxide film is referred to as a third gate insulating film 7. It should be noted that in this thermal oxidation, the surface of the silicon substrate 1 in the first and second regions I and II is also slightly oxidized and that the thicknesses of the first and second gate insulating films 3 and 5 are therefore increased.

By the above-described steps, the first to third gate insulating films 3, 5, and 7, whose thicknesses decrease in this order, are formed on the silicon substrate 1.

In this method, a recessed portion 2c as illustrated in FIG. 1G is formed in the device-isolation insulating film 2, as a trace of wet etching performed for the first gate insulating film 3 of the second active region II in the step of FIG. 1C. Further, in this example, the width $W_1$ of the recessed portion 2c is larger than half (W/2) of the width W of the device-isolation insulating film 2 as illustrated in the drawing.

In the above-described semiconductor device fabrication method, the first and second resist patterns 4 and 6 need to overlap the device-isolation insulating film 2 by the distance D in order to prevent gate insulating films from being etched by the penetration of a hydrofluoric acid solution. Such first and second resist patterns 4 and 6 can be created by designing reticles by use of a method described below and exposing photoresist using the reticles.

Figure 3:
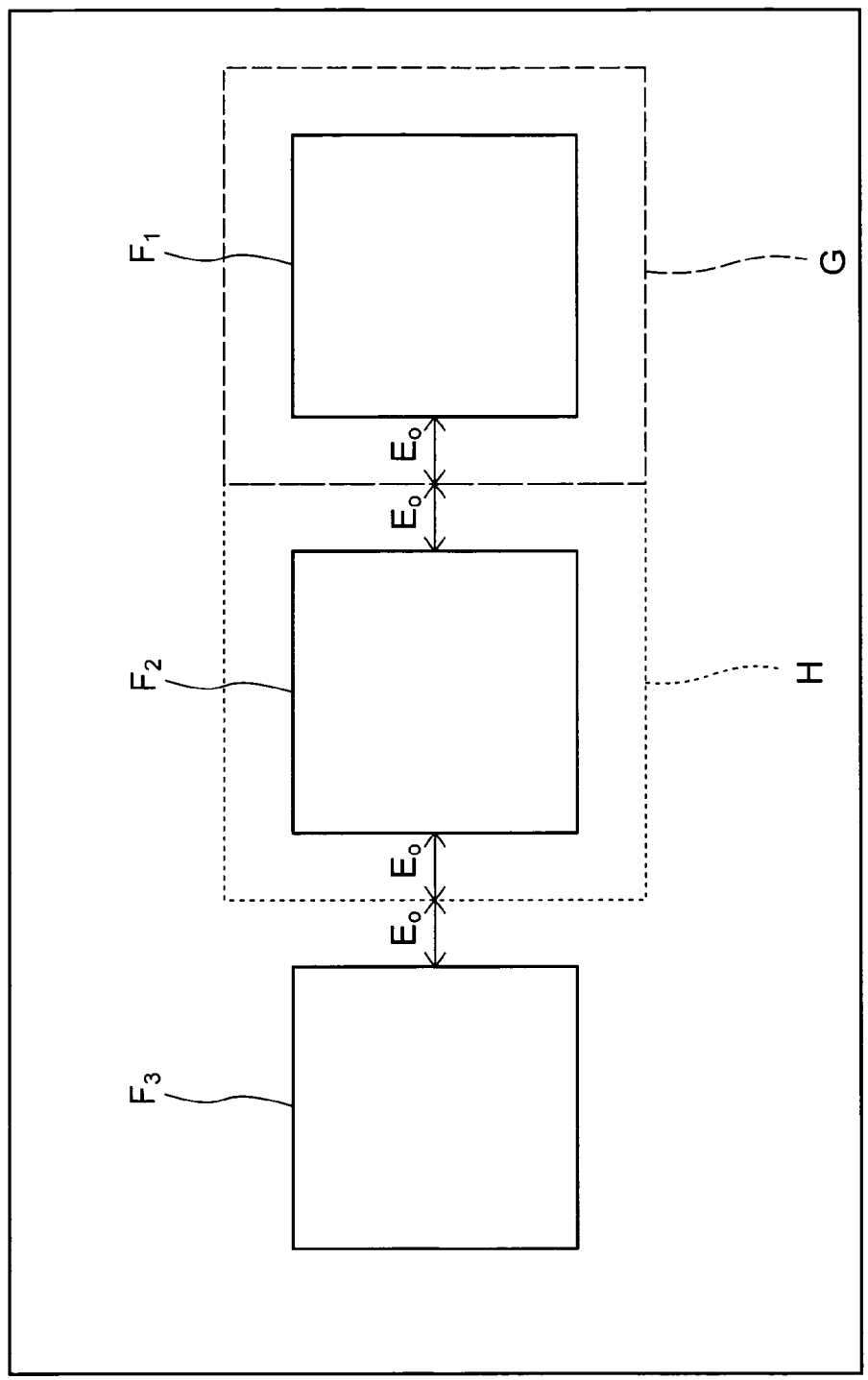
FIG. 3 is a first image of a monitor included in a CAD system for reticle design.

FIG. 3 is an image of a monitor, included in a computer-aided design (CAD) system for reticle design.

When reticles are designed, first to third active region designation frames $F_1$ to $F_3$ respectively corresponding to the aforementioned first to third active regions I to III are generated in a predetermined layer of CAD as illustrated in FIG. 3.

Subsequently, using a layer different from the above-described one, a first film thickness designation frame G is generated which surrounds the first active region designation frame $F_1$.

Then, a second film thickness designation frame H corresponding to the first window 4a (see FIG. 2A) of the first resist pattern 4 is generated around the second active region designation frame $F_2$ so as to be in contact with the first film thickness designation frame G. This second film thickness designation frame H is generated in a layer different from that of the first film thickness designation frame G.

Incidentally, a large number of third active regions III (see FIG. 1G) in which third gate insulating films 7 having the smallest thickness are formed are provided in the silicon substrate 1, and high-speed transistors most frequently used in a logic circuit are respectively formed in the third active regions III. Accordingly, when graphics such as frames are generated in the third active regions III in a certain layer of CAD, there arises such problem that the graphics become obstacles and that designing a large number of high-speed transistors takes some effort. Thus, in the case where a reticle is designed using CAD, frames should not be generated in the third active regions III in which the thicknesses of the gate insulating films are the smallest.

Figure 4:
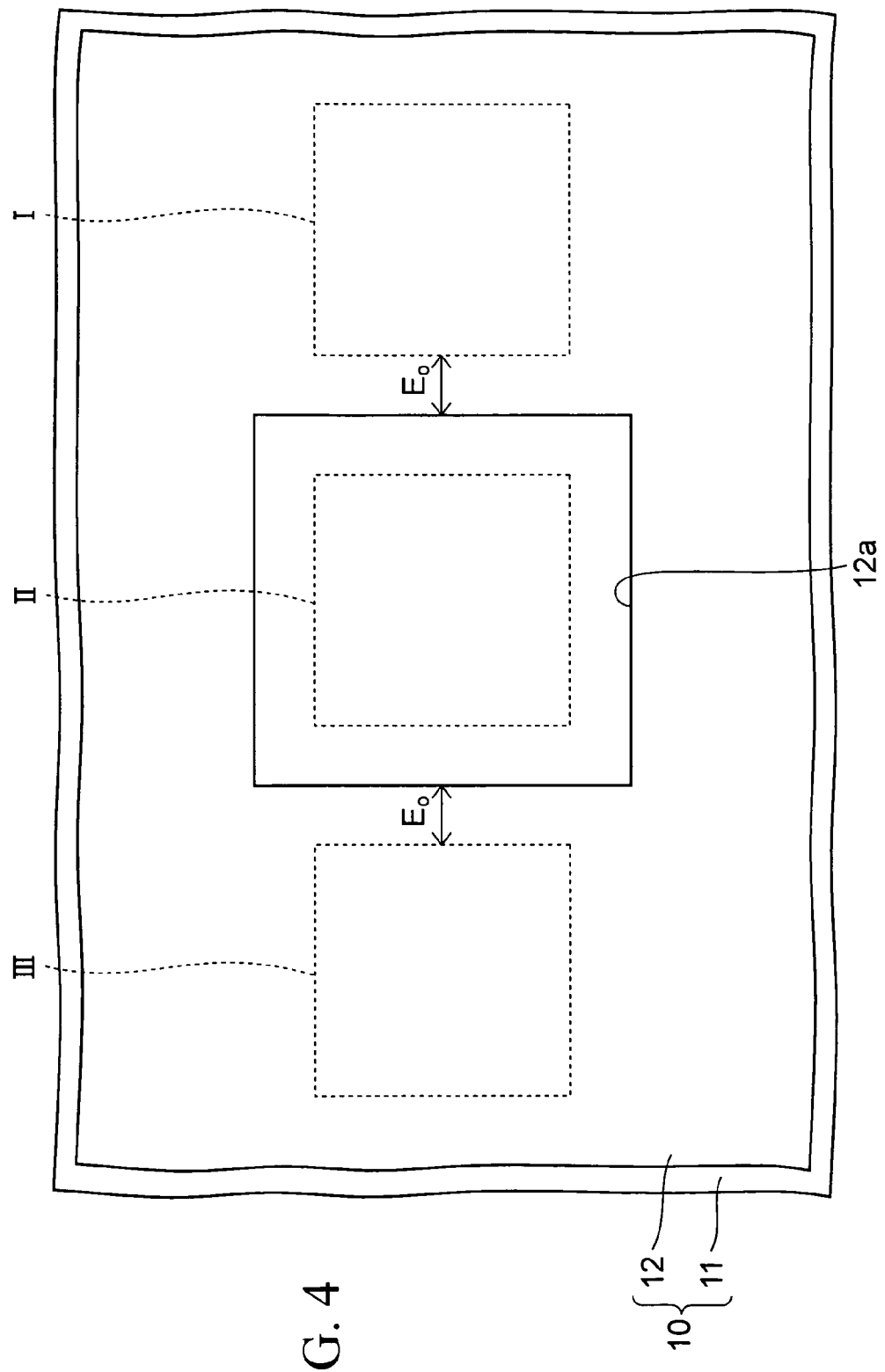
FIG. 4 is a plan view of a first reticle used to fabricate the hypothetical semiconductor device.

After the frames G and H have been generated as described above, shape data of the first film thickness designation frame G is inputted to an electron beam exposure system (not shown), and a light-blocking film 12 is patterned by electron beam (EB) lithography as illustrated in FIG. 4, whereby an opening 12a is formed in the light-blocking film 12 in a region corresponding to the inside of the second film thickness designation frame H. Thus, a first reticle 10 including a transparent substrate 11 and the light-blocking film 12 is completed. It should be noted that in FIG. 4, portions of the first reticle 10 which correspond to the aforementioned first to third regions I to III are indicated by dotted lines.

This first reticle 10 is used when the first resist pattern 4 described in FIG. 1B is formed. The window 4a of the first resist pattern 4 corresponds to the opening 12a of the first reticle 10. As described in FIG. 1B, the window 4a needs to be separated from the first and third active regions I and III by the distance D. Accordingly, in a design phase of FIG. 3, design data of the opening 12a corresponding to the window 4a, i.e., the second film thickness designation frame H, also needs to be separated from the first and third active region designation frames $F_1$ and $F_3$ by a distance $E_0$ corresponding to the above-described distance D. It should be noted that the distance $E_0$ has a value obtained by multiplying the distance D on the silicon substrate 1 by the reciprocal of the reduction ratio of an optical exposure system used when the first resist pattern 4 is formed.

Figure 5:
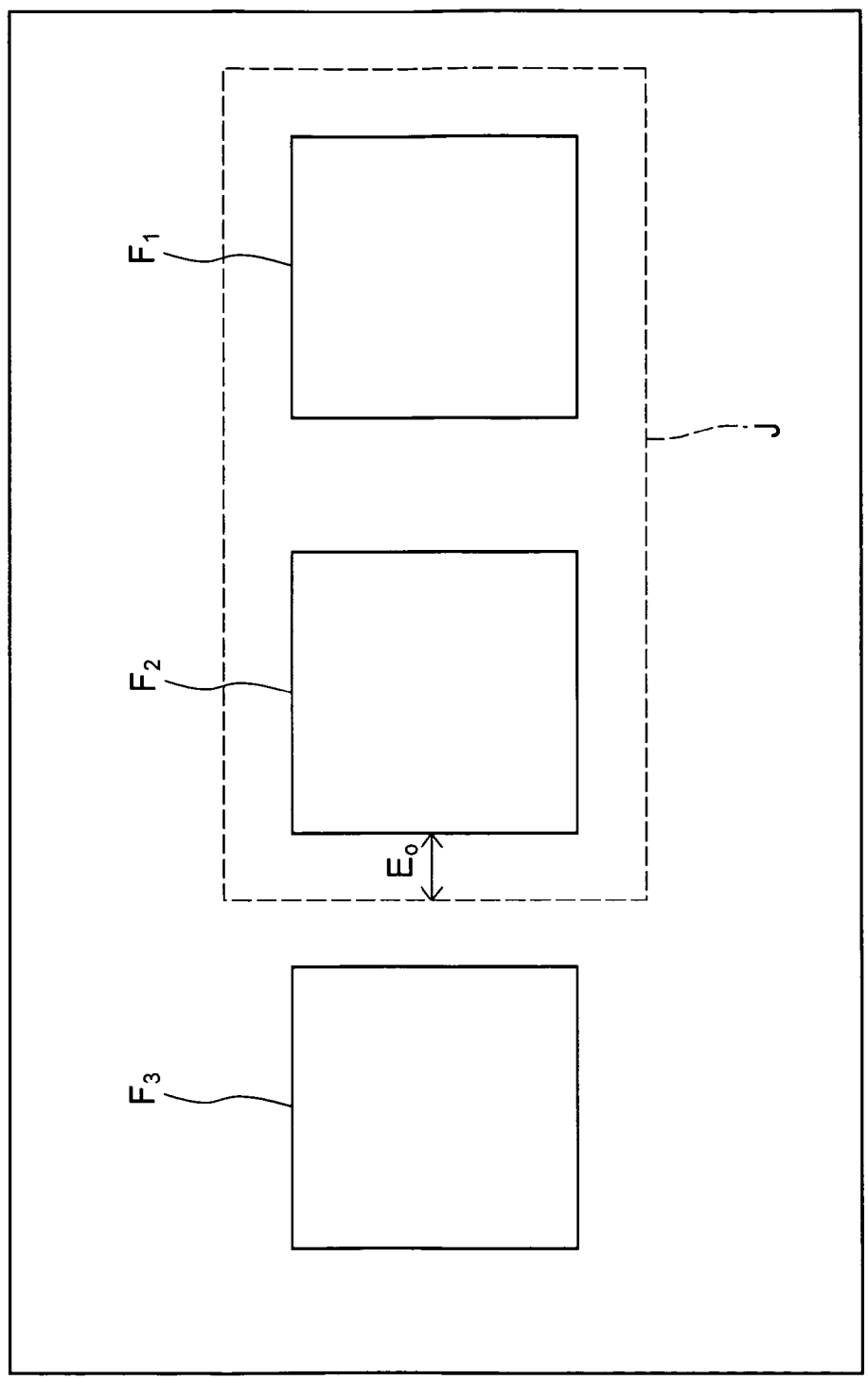
FIG. 5 is a second image of the monitor included in the CAD system for reticle design.

On the other hand, in order to create a reticle for the second resist pattern 6 illustrated in FIG. 1E, a third film thickness designation frame J in which the first and second film thickness designation frames G and H of FIG. 3 are combined is created on the CAD system as illustrated in FIG. 5.

Figure 6:
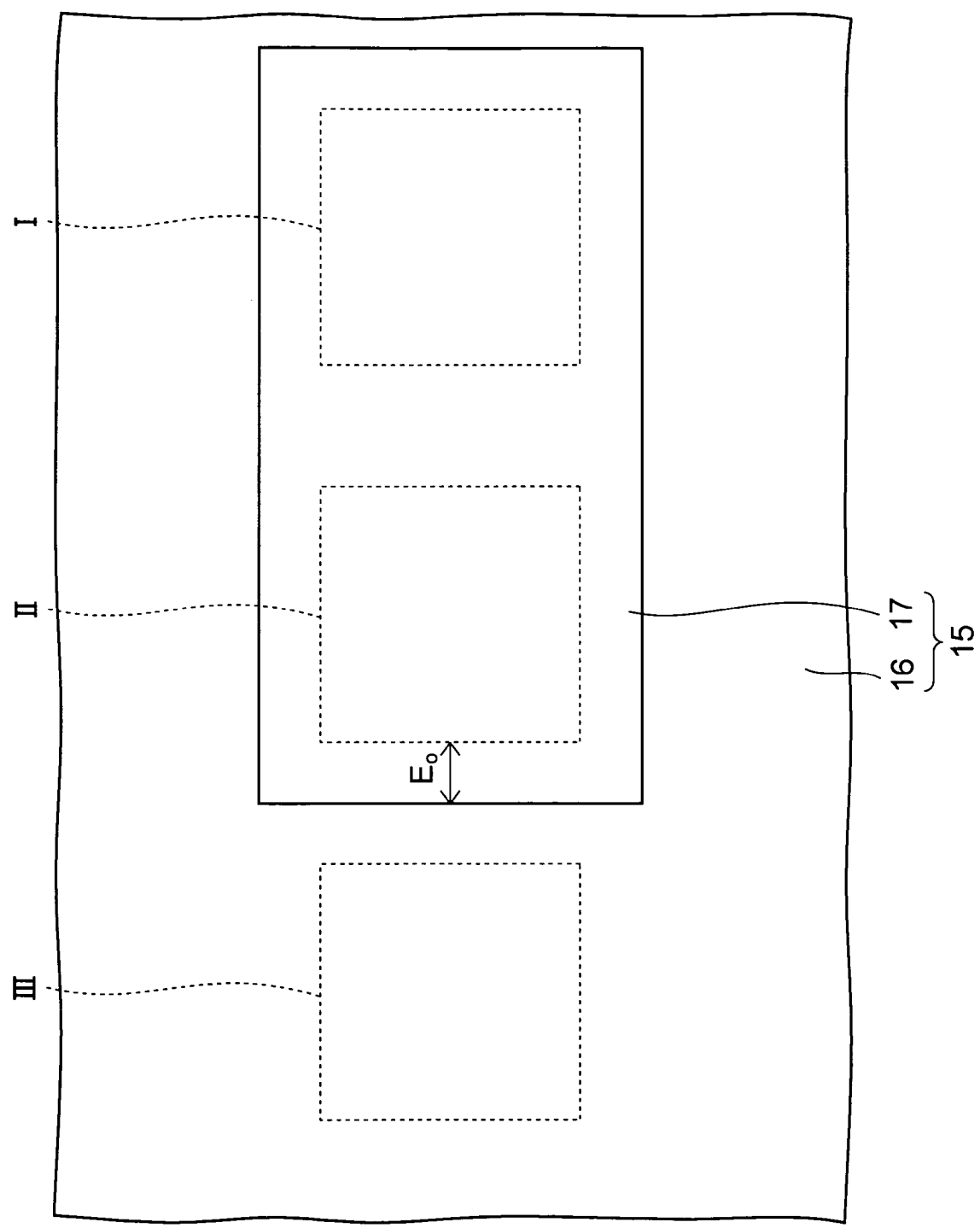
FIG. 6 is a plan view of a second reticle used to fabricate the hypothetical semiconductor device.

Then, as illustrated in FIG. 6, shape data of this third film thickness designation frame J is inputted to an EB exposure system (not shown), and a light-blocking film 17 is patterned by EB lithography, whereby the light-blocking film 17 outside the third film thickness designation frame J is removed. Thus, a second reticle 15 including a transparent substrate 16 and the light-blocking film 17 is completed.

As described above, the second reticle 15 is created by removing the light-blocking film 17 outside the third film thickness designation frame J. That is, the second reticle 15 is designed in CAD by the inverse operation to that for the first reticle 10 created by removing the light-blocking film 12 inside the second film thickness designation frame H.

Accordingly, in order to overlap the second resist pattern 6 (see FIG. 1E) created using the second reticle 15 and the device-isolation insulating film 2 around the third active region III by the distance D, the third film thickness designation frame J needs to be separated from the second active region designation frame $F_2$ by the aforementioned distance $E_0$ as illustrated in FIG. 5.

Thus, the second and third active region designation frames $F_2$ and $F_3$ illustrated in FIG. 3 are separated from each other by a distance $2E_0$. On the silicon substrate 1, the distance between the second and third active regions II and III, i.e., the width of the device-isolation insulating film 2, becomes 2D.

In the above-described reticle design method, as illustrated in FIG. 3, there is the limitation that on the CAD system, an additional graphic such as a frame should not be created in the third region III in which a thin gate insulating film for a high-speed transistor is formed, in order to easily design a high-speed transistor. As a result of attempting to prevent the gate insulating film from being etched by the penetration of a hydrofluoric acid solution under this limitation, a lower limit (2D=0.52 μm) was imposed on the width W of the device-isolation insulating film 2 as illustrated in FIG. 1G. However, this imposes limitations on the miniaturization and density enhancement of a semiconductor device because the device-isolation insulating film 2 cannot be formed so that the width thereof become smaller than the lower limit.

In view of such problems, the inventor of this application conceived the following embodiments of the present invention.

(2) First Embodiment

Figure 7E:
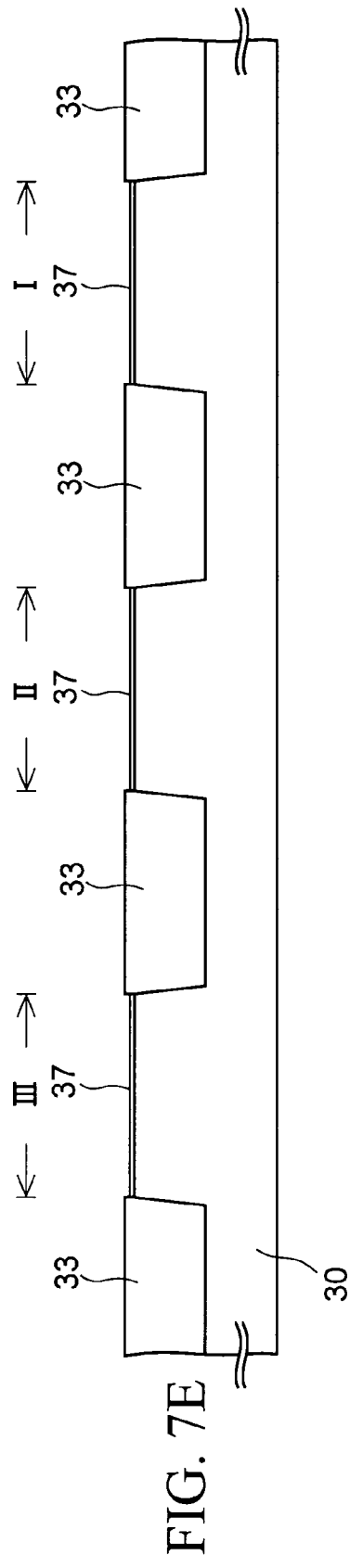
FIGS. 7A to 7U are cross-sectional views of a semiconductor device according to a first embodiment of the present invention in the process of being fabricated.
Figure 7F:
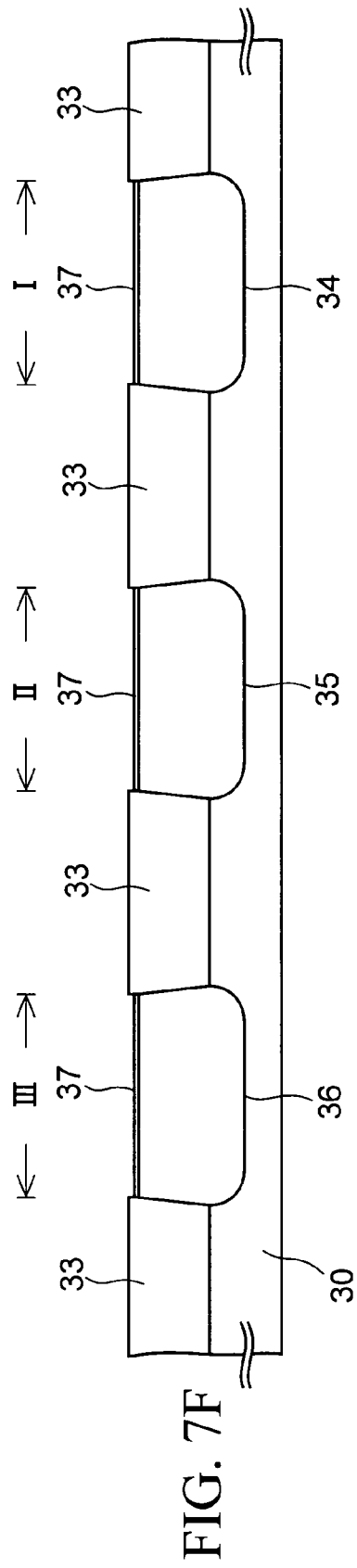
Figure 7S:
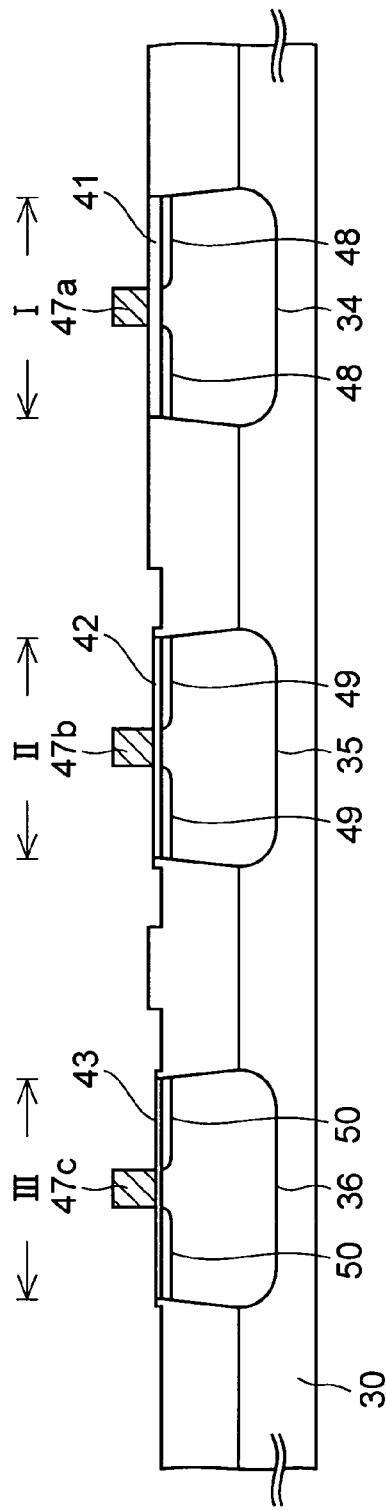
Figure 7T:
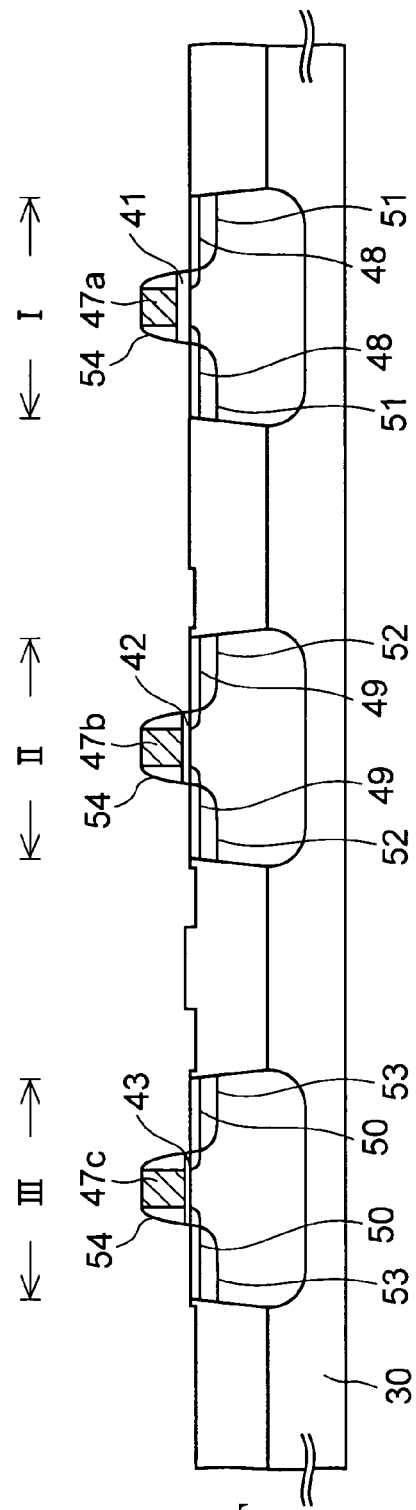
Figure 7U:
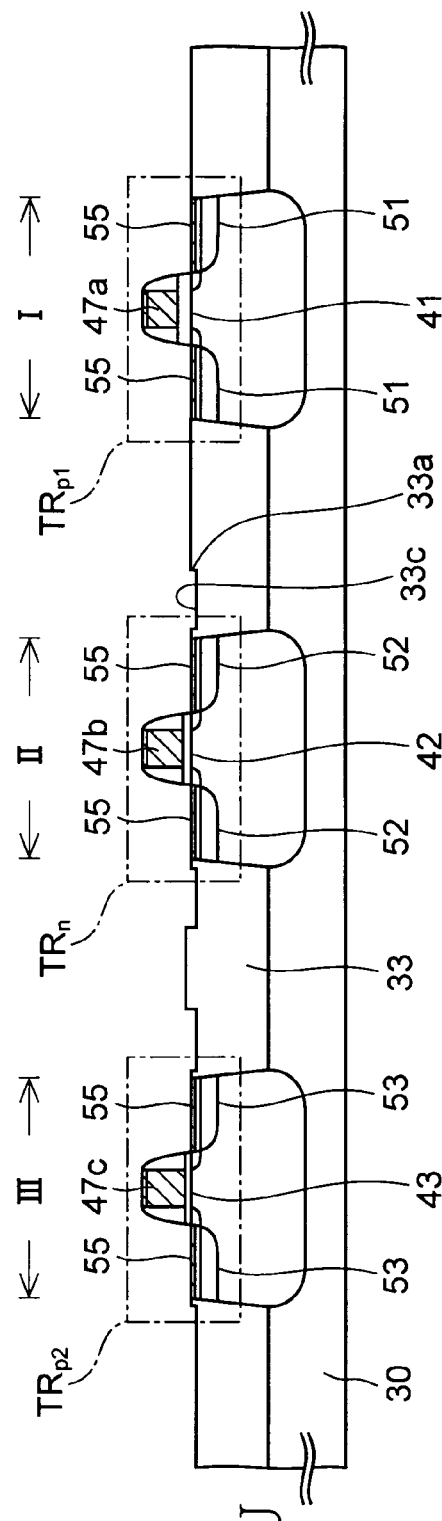

FIGS. 7A to 7U are cross-sectional views of a semiconductor device according to a first embodiment of the present invention in the process of being fabricated. It should be noted that although a description will be given by taking as an example of a CMOS (Complementary Metal Oxide Semiconductor) process in which n- and p-type MOS transistors are embedded in one semiconductor substrate in combination, the present invention can be applied to processes other than the CMOS process.

First, as illustrated in FIG. 7A, a surface of a p-type silicon (semiconductor) substrate 30 is thermally oxidized in an oxygen-containing atmosphere under conditions in which the substrate temperature is 900° C., thus forming a thermal oxide film 31 having a thickness of approximately 10 nm. Further, a silicon nitride film 32 is formed to a thickness of approximately 150 nm on the thermal oxide film 31 by low-pressure CVD.

Then, as illustrated in FIG. 7B, the thermal oxide film 31 and the silicon nitride film 32 are patterned by photolithography, whereby a window 32a is formed in these films.

Subsequently, as illustrated in FIG. 7C, the silicon substrate 30 is etched through the above-described window 32a by adopting reactive ion etching (RIE) using a chlorine-based gas as etching gas, thus forming a device-isolation trench 30a having a depth of approximately 400 nm.

Next, a process for obtaining the cross-sectional structure illustrated in FIG. 7D will be described.

First, in order to recover damage to the inner surface of the device-isolation trench 30a by use of RIE, a thermal oxide film (not shown) is formed to a thickness of approximately 10 nm in the device-isolation trench 30a. After that, a silicon oxide film is formed on the silicon nitride film 32 by high-density plasma (HDP) CVD using silane as reactant gas, whereby the device-isolation trench 30a is completely filled with this silicon oxide film. Then, an unnecessary portion of the silicon oxide film on the silicon nitride film 32 is removed by chemical mechanical polishing (CMP). The silicon oxide film is left as a device-isolation insulating film 33 in the device-isolation trench 30a. Such a device-isolation structure is also referred to as STI.

However, a device-isolation structure in this embodiment is not limited to STI. The device-isolation structure may be obtained by local oxidation of silicon (LOCOS).

It should be noted that the silicon nitride film 32 functions as a polishing stopper for the above-described CMP but the thickness thereof is slightly reduced by polishing.

With the device-isolation insulating film 33 formed as described above, first to third active regions I to III in which gate insulating films having different thicknesses will be formed later are defined in the silicon substrate 30.

Next, a process for obtaining the cross-sectional structure illustrated in FIG. 7E will be described.

First, the silicon nitride film 32 is removed by wet etching using phosphoric acid. Further, the thermal oxide film 31 is removed by wet etching using hydrofluoric acid. After that, the surface of the silicon substrate 30 is thermally oxidized again, thus forming another new thermal oxide film 37 having a thickness of approximately 10 nm.

Then, as illustrated in FIG. 7F, ions of an n-type impurity such as phosphorus are ion-implanted into the silicon substrate 30 in the first and third active regions I and III using the thermal oxide film 37 as a through film, thus forming first and second n wells 34 and 36. Further, ions of a p-type impurity such as boron are implanted into the silicon substrate 30 in the second active region II, thus forming a p well 35. It should be noted that in this ion implantation step, these p- and n-type impurities are individually implanted using respective resist patterns (not shown), and that each resist pattern is removed after ion implantation has been finished.

After that, as illustrated in FIG. 7G, the thermal oxide film 37 damaged by this ion implantation is removed by wet etching using a hydrofluoric acid solution.

Then, as illustrated in FIG. 7H, thermal oxide films having thicknesses of approximately 5 nm are formed on the silicon substrate 30 in the first to third active regions I to III in an oxygen atmosphere by thermal oxidation in which the substrate temperature is approximately 800° C., and these thermal oxide films are used as first gate insulating films 41.

Subsequently, as illustrated in FIG. 7I, first photoresist 38 is coated on the surfaces of the device-isolation insulating film 33 and the first gate insulating films 41.

Further, this first photoresist 38 is exposed using an undermentioned first reticle and then developed, thus forming a first resist pattern 38c as illustrated in FIG. 7J.

This first resist pattern 38c includes a first resist opening portion 38a and a first resist portion 38b. The first resist opening portion 38a is formed to have such a size that it surrounds the second active region II. On the other hand, the first resist portion 38b covers the first and third active regions I and III and overlaps the device-isolation insulating film 33 around the first resist opening portion 38a by a first distance $D_1$ which is longer than half (W/2) of the width W of the device-isolation insulating film 33. It should be noted that in this embodiment, the width W of the device-isolation insulating film 33 is 0.36 μm and the first distance $D_1$ is 0.26 μm.

Figure 8A:
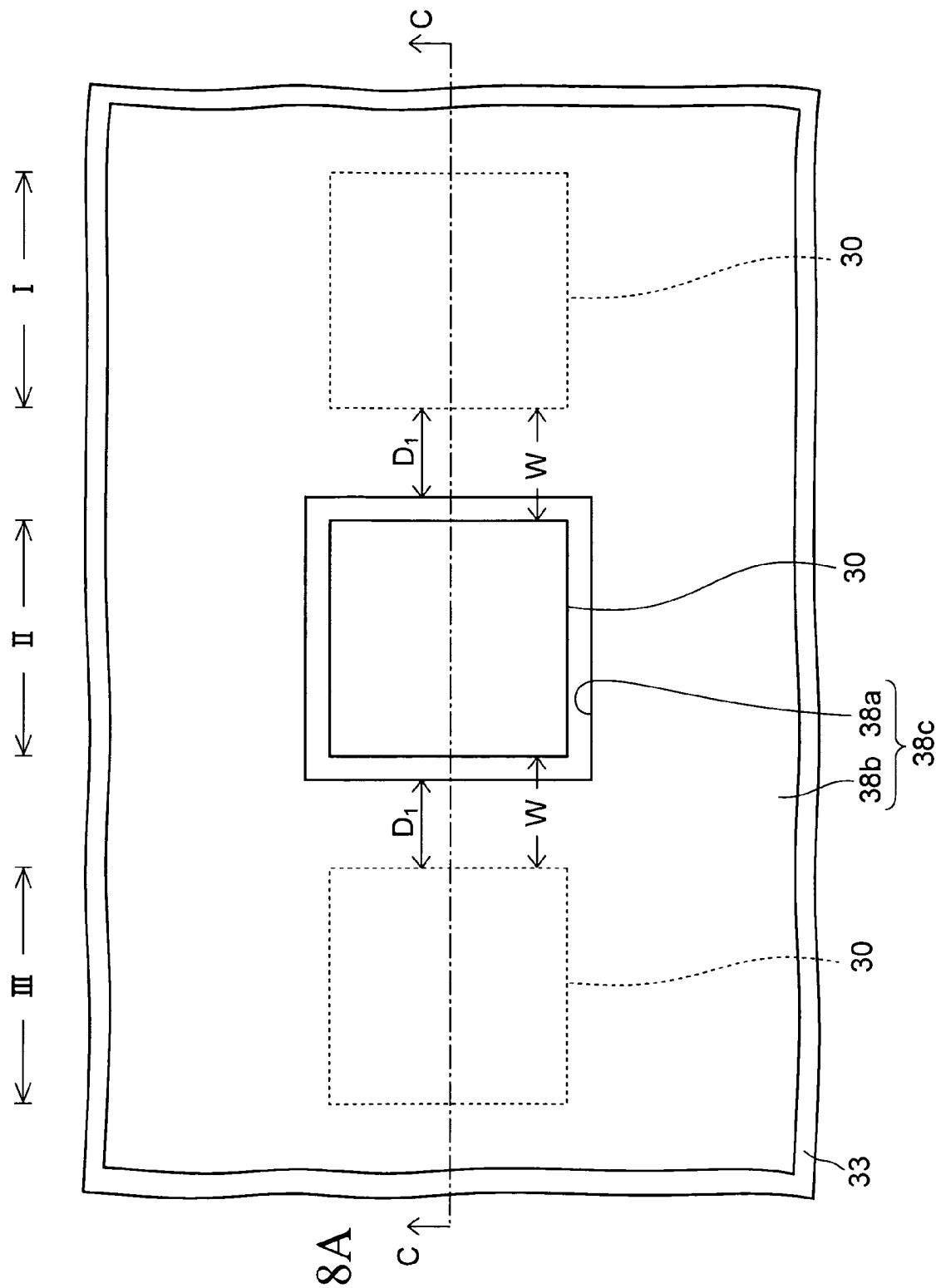
FIGS. 8A and 8B are plan views of the semiconductor device according to the first embodiment of the present invention in the process of being fabricated.

FIG. 8A is a plan view after this step has been finished. The aforementioned FIG. 7J is a cross-sectional view taken along the C-C line of FIG. 8A.

Next, as illustrated in FIG. 7K, the first gate insulating film 41 in the second active region II is removed through the first resist opening portion 38a by wet etching using a hydrofluoric acid solution, whereby a clean surface of the silicon substrate 30 is exposed under the first resist opening portion 38a.

At this time, the hydrofluoric acid solution also penetrates to the interface between the resist portion 38b and the device-isolation insulating film 33 which are at the bottom of the first opening 38a. Accordingly, a portion of the device-isolation insulating film 33, which is recessed from the first resist opening portion 38a by a distance equal to a penetration length Δ of the hydrofluoric acid solution, is also etched, and a step 33a is formed in this portion of the device-isolation insulating film 33. It should be noted that the above-described penetration length Δ is typically approximately 0.05 μm.

Here, if the first gate insulating films 41 of the first and third active regions I and III are also etched due to the above-described penetration of the hydrofluoric acid solution, gate insulating films having even thicknesses cannot be formed in these regions I and III in later steps. In this embodiment, in order to avoid this disadvantage, the overlap distance $D_1$ between the first resist portion 38b and the device-isolation insulating film 33 around the first resist opening portion 38a is set longer than the above-described penetration length Δ.

Subsequently, the first resist pattern 38c is removed.

Next, as illustrated in FIG. 7L, a thermal oxide film having a thickness of approximately 1.5 nm is formed on the silicon substrate 30 in the second active region II in an oxygen atmosphere by rapid thermal oxidation (RTO) in which the substrate temperature is approximately 900° C., and this thermal oxide film is used as a second gate insulating film 42.

In this thermal oxidation, silicon under the first gate insulating films 41 remaining in the first and third active regions I and III is also oxidized, and the thicknesses of the first gate insulating films 41 are therefore increased.

Subsequently, as illustrated in FIG. 7M, second photoresist 45 is coated on the surfaces of the first and second gate insulating films 41 and 42 and the device-isolation insulating film 33.

Further, the second photoresist 45 is exposed using an undermentioned second reticle and then developed, thus forming a second resist pattern 45c as illustrated in FIG. 7N.

The second resist pattern 45c has a second resist portion 45b and a second resist opening portion 45a which surrounds the third active region III. The second resist portion 45b covers the first and second active regions I and II and overlaps the device-isolation insulating film 33 around the second resist opening portion 45a by a second distance $D_2$. Similar to the first distance $D_1$ described in FIG. 7I, this second distance $D_2$ also has a value larger than W/2 (=0.18 μm), e.g., 0.26 μm.

Figure 8B:
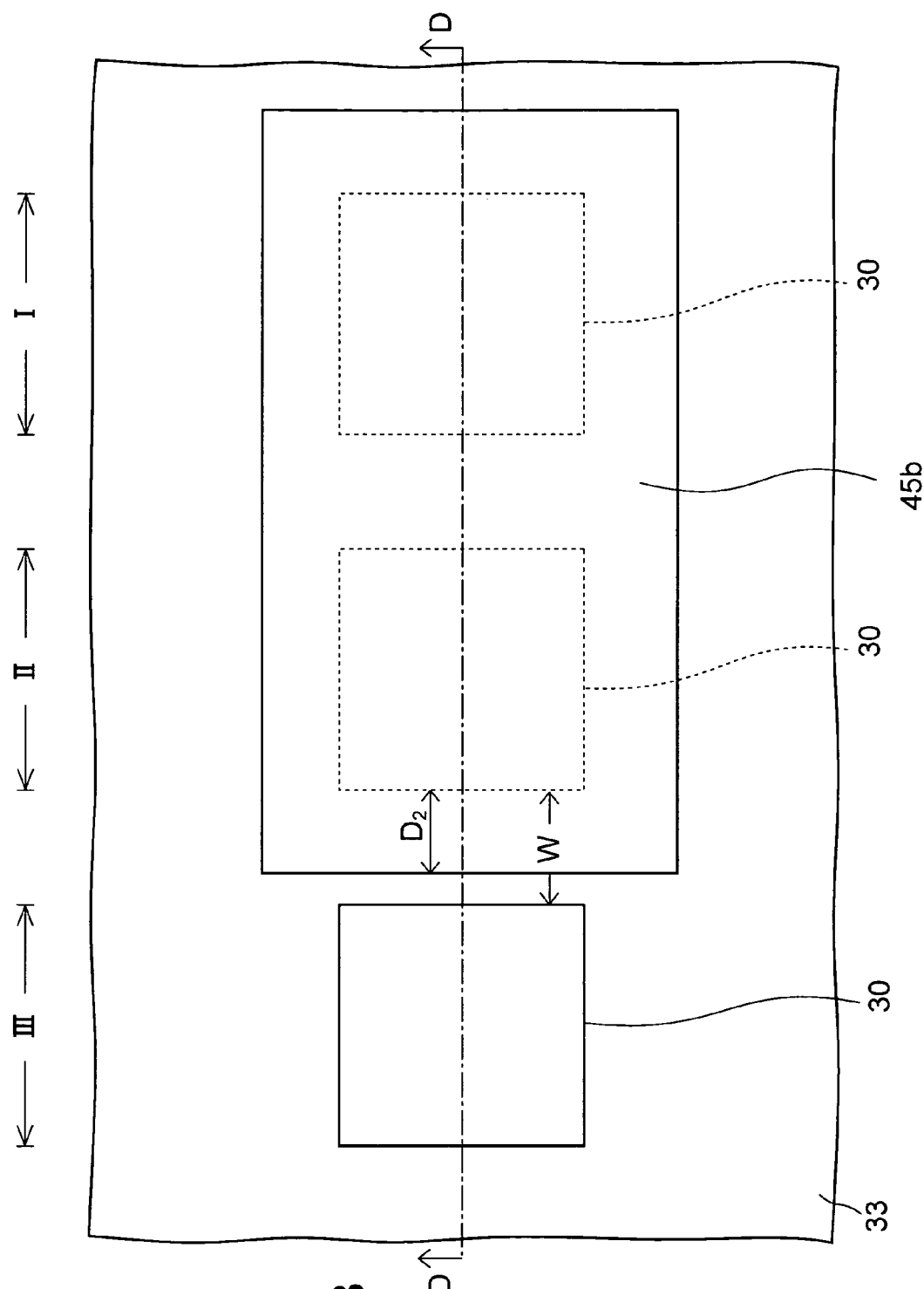

FIG. 8B is a plan view after this step has been finished. The aforementioned FIG. 7N is a cross-sectional view taken along the D-D line of FIG. 8B.

As illustrated in FIG. 8B, the overlap distance $D_2$ between the second resist portion 45b and the device-isolation insulating film 33 is longer than half of the width W of the device-isolation insulating film 33. Accordingly, a planar shape of the second resist portion 45b becomes larger than that of the first resist opening portion 38a of the first resist pattern 38c illustrated in FIG. 8A.

Subsequently, as illustrated in FIG. 7O, the first gate insulating film 41 of the third active region III is removed through the second resist opening portion 45a of the second resist pattern 45c by wet etching, whereby a clean surface of the silicon substrate 30 is exposed through the second resist opening portion 45a. Although an etchant used in this wet etching is not particularly limited, a hydrofluoric acid solution is used in this embodiment.

As in the wet etching step described in FIG. 7K, in this wet etching, the hydrofluoric acid solution also penetrates to the interface between the second resist portion 45b and the device-isolation insulating film 33. Accordingly, a step 33b is formed in a portion of the device-isolation insulating film 33, the portion being recessed from the second resist opening portion 45a by a distance equal to a penetration length Δ of the hydrofluoric acid solution. This penetration length Δ is approximately 0.05 μm as in the case of FIG. 7K.

Further, in order to prevent the second gate insulating film 42 formed in the second region II from being etched due to this penetration of hydrofluoric acid, the overlap distance $D_2$ between the device-isolation insulating film 33 and the second resist portion 45b is set longer than the above-described penetration length Δ.

Subsequently, as illustrated in FIG. 7P, the second resist pattern 45c is removed.

Then, as illustrated in FIG. 7Q, the surface of the silicon substrate 30 is thermally oxidized in an oxygen atmosphere by RTO in which the substrate temperature is approximately 900° C., thus forming a thermal oxide film having a thickness of approximately 1.75 nm in the third active region III. This thermal oxide film is used as a third gate insulating film 43.

The thickness of this third gate insulating film 43 is approximately 1.75 nm as described above and thicker than the thickness (approximately 1.5 nm) of the second gate insulating film 42 immediately after formation which is illustrated in FIG. 7L. However, the thickness of the second gate insulating film 42 is increased due to heat for forming the third gate insulating film 43. Accordingly, at the time when the formation of the third gate insulating film 43 has been finished, the thickness of the third gate insulating film 43 becomes thinner than that of the second gate insulating film 42.

By the above-described steps, the first to third gate insulating films 41 to 43, whose thicknesses decrease in this order, are formed in the first to third active regions I to III of the silicon substrate 30.

Here, in the upper surface of the device-isolation insulating film 33 adjacent to the second active region II, a recessed portion 33c having a width $W_2$ which is smaller than half (W/2) of the width W of the device-isolation insulating film 33 is formed near the second active region II, as a trace of wet etching performed for the first gate insulating film 41 of the second active region II in the step of FIG. 7K.

Subsequently, the gate insulating films 41 to 43 may be doped with nitrogen by exposing the surfaces of the first to third gate insulating films 41 to 43 to $N_2O$ gas.

By doping the first to third gate insulating films 41 to 43 with nitrogen as described above, the dielectric constants of these insulating films are increased, and the effective oxide thicknesses (EOTs) thereof can be therefore reduced. Thus, an effect as if thin gate insulating films were formed is obtained while leakage current between the substrate and gates is prevented.

Next, as illustrated in FIG. 7R, a polysilicon film as a conductive film 47 is formed to a thickness of approximately 180 nm on the first to third gate insulating films 41 to 43 and the device-isolation insulating film 33 by use of low-pressure CVD using silane as reactant gas.

Subsequently, this conductive film 47 is patterned by photolithography, whereby first to third gate electrodes 47a to 47c are respectively formed in the regions I to III as illustrated in FIG. 7S.

Then, ions of boron as a p-type impurity are ion-implanted into the first and third regions I and III using the first and third gate electrodes 47a and 47c as masks, thus forming first and second p-type source/drain extensions 48 and 50 in the silicon substrate 30 on both sides of the first and third gate electrodes 47a and 47c.

Similar to this, ions of an n-type impurity such as arsenic are ion-implanted into the silicon substrate 30 in the second active region II using the second gate electrode 47b as a mask, thus forming n-type source/drain extensions 49.

It should be noted that these p- and n-type impurities are individually implanted using respective resist patterns (not shown).

Next, a process for obtaining the cross-sectional structure illustrated in FIG. 7T will be described.

First, an insulating film such as a silicon oxide film is formed over the entire upper surface of the silicon substrate 30 by CVD. Then, this insulating film is etched back so as to be left as insulating sidewalls 54 on the side surfaces of the gate insulating films 47a to 47c. It should be noted that in this etch back, portions of the first to third gate insulating films 41 to 43 are also etched, the portions being not covered with the insulating sidewalls 54 and the gate electrodes 47a to 47c.

Further, a p-type impurity such as boron is introduced into the silicon substrate 30 on both sides of the gate electrodes 47a and 47c by ion implantation using the insulating sidewalls 54 and the first and third gate electrodes 47a and 47c as masks, thus forming first and second p-type source/drain regions 51 and 53 in the first and third active regions I and III. Subsequently, ions of an n-type impurity such as arsenic are ion-implanted into the silicon substrate 30 on both sides of the second gate electrode 47b, thus forming n-type source/drain regions 52.

Next, a process for obtaining the cross-sectional structure illustrated in FIG. 7U will be described.

First, a refractory metal layer such as a cobalt layer is formed over the entire upper surface of the silicon substrate 30 by sputtering. Then, the refractory metal layer is reacted with silicon by heating the silicon substrate 30, thus forming a refractory metal silicide layer 55 over the silicon substrate 30. This refractory metal silicide layer 55 is also formed on the first to third gate electrodes 47a to 47c, whereby the resistance of each gate electrode 47a to 47c is reduced. Subsequently, the refractory metal layer which remains unreacted on the device-isolation insulating film 33 and the like is removed by wet etching.

Through the above-described steps, a basic structure of the semiconductor device according to this embodiment is completed.

The semiconductor device includes first and second p-type MOS transistors $TR_{p1}$ and $TR_{p2}$ and an n-type MOS transistor $TR_n$, which include the first to third gate insulating films 41 to 43 having different thicknesses, in the first to third active regions I to III of the silicon substrate 30, respectively.

The usage of the MOS transistors $TR_{p1}$, $TR_{p2}$, and $TR_n$ is not particularly limited. However, the second p-type MOS transistor $TR_{p2}$ is preferably used for operations in a core unit of a logic semiconductor device because the second p-type MOS transistor $TR_{p2}$ includes the third gate insulating film 43 having the smallest thickness and is capable of high-speed operation. In this case, a plurality of third active regions III are defined in the semiconductor substrate 30, and second p-type MOS transistors $TR_{p2}$ are respectively formed in each of the third active regions III, whereby a core unit constituted by the plurality of second p-type MOS transistors $TR_{p2}$ can be obtained.

Further, the first p-type MOS transistor $TR_{p1}$, which includes the first gate insulating film 41 having the largest thickness, has a high breakdown voltage between the gate and the substrate and thus can operate at a high voltage of approximately 3.3 V. Accordingly, the first p-type MOS transistor $TR_{p1}$ is preferably used as an input/output transistor which transmits or receives a high-voltage signal to/from an external circuit, in an input/output unit.

Moreover, the n-type MOS transistor $TR_n$, which includes the second gate insulating film 42 having an intermediate thickness, is used as a transistor capable of operating at higher speed than the first p-type MOS transistor $TR_{p1}$ and having intermediate characteristics in which the breakdown voltage is higher than that of the second p-type MOS transistor $TR_{p2}$.

In this embodiment, in order to form the first to third gate insulating films 41 to 43 having different thicknesses as described above, wet etching is performed twice using the first resist pattern 38c of FIG. 7J and the second resist pattern 45c of FIG. 7O as etching masks. These first and second resist patterns 38c and 45c are formed by exposing the first and second photoresists 38 and 45 using the first and second reticles, respectively. Next, a method of fabricating these first and second reticles will be described.

Figure 9:
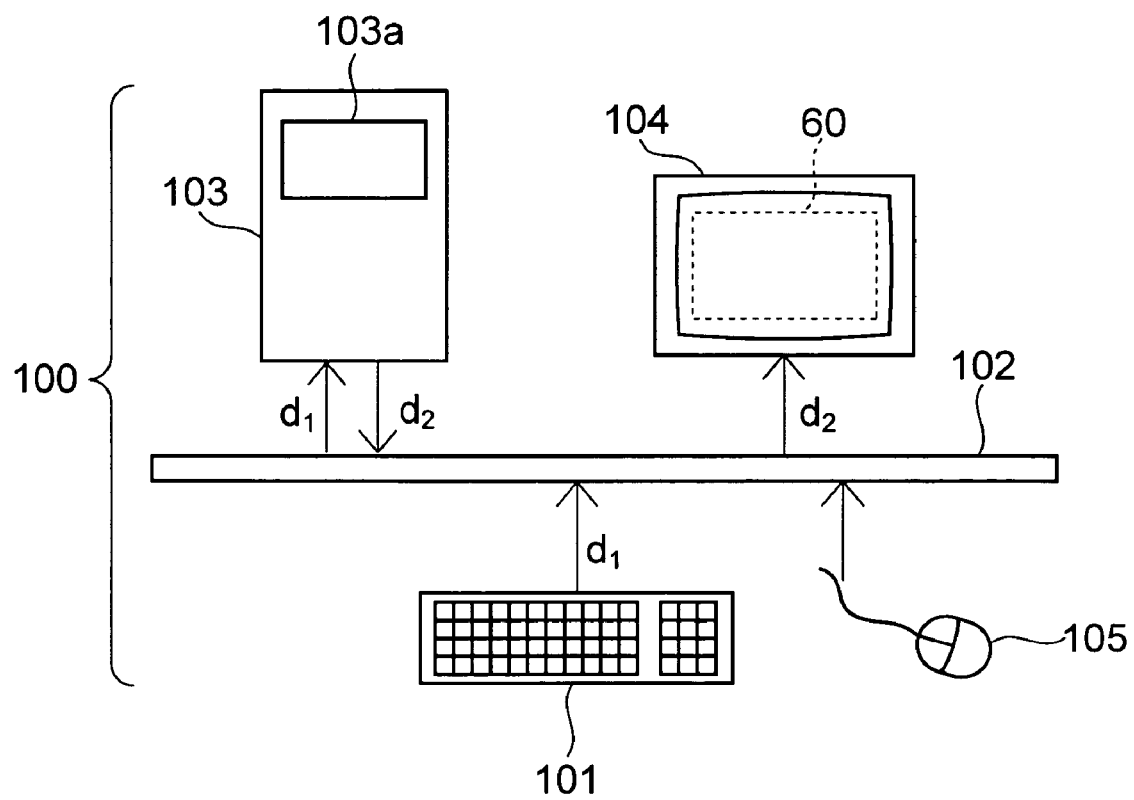
FIG. 9 is a view of the configuration of the CAD system used to design reticles in the first embodiment of the present invention.

FIG. 9 is a view of the configuration of a CAD system used for designing reticles.

The system 100 includes a keyboard 101, a mouse 105, a control unit 103, and a display 104. Data is exchanged between them through a bus line 102.

A user inputs shape data of a graphic as a drawing object, e.g., graphic information (data) $d_1$ such as the lengths of edges and the sizes of angles, to the system 100 by operating the keyboard 101 and the mouse 105. The graphic information $d_1$ is converted into image data $d_2$ by a predetermined arithmetic operation in the control unit 103. The display 104 displays the graphic as a drawing object on a display region 60 based on the image data $d_2$.

It should be noted that the control unit 103 includes a storage unit 103a and that data such as the above-described graphic information $d_1$ is stored in this storage unit 103a.

Figure 10A:
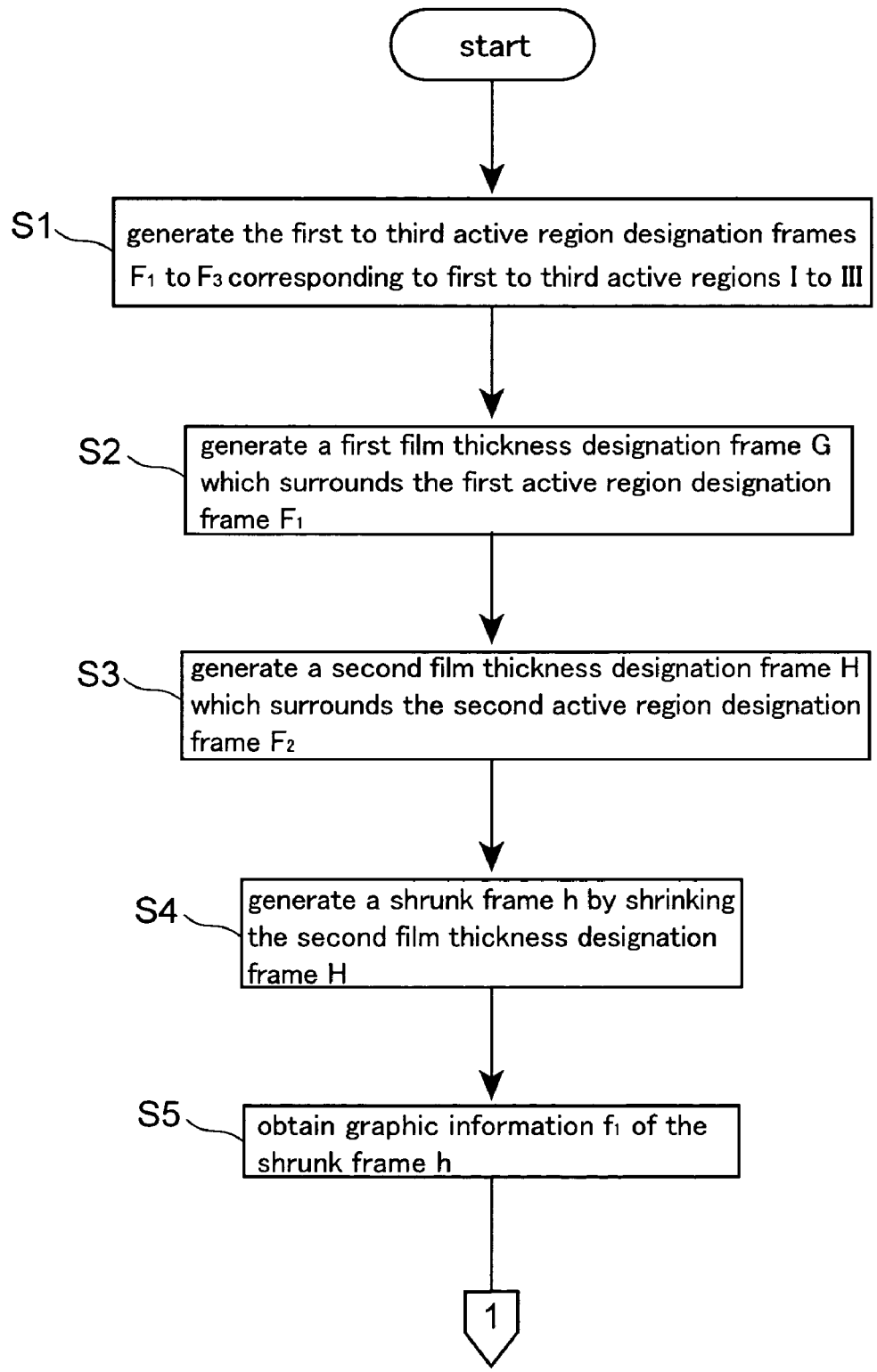
FIGS. 10A and 10B are flowcharts illustrating a reticle fabrication method of the first embodiment of the present invention.
Figure 10B:
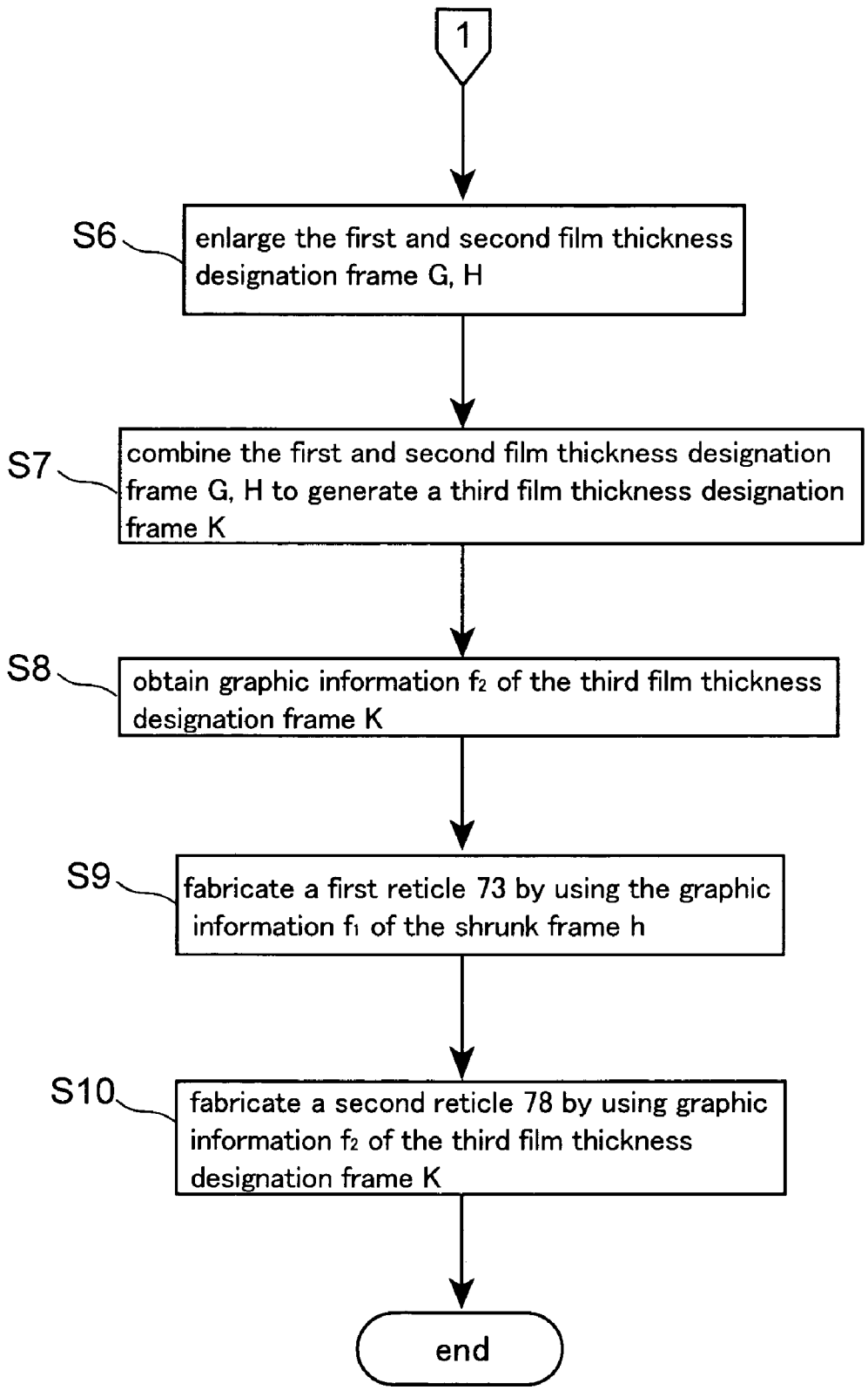

FIGS. 10A and 10B are flowcharts illustrating a reticle fabrication method using this CAD system 100. Further, FIGS. 11A to 11F are plan views schematically illustrating images displayed on the display region of the display 104 in steps of the flowcharts, respectively.

First, step S1 of FIG. 10A will be described.

Figure 11A:
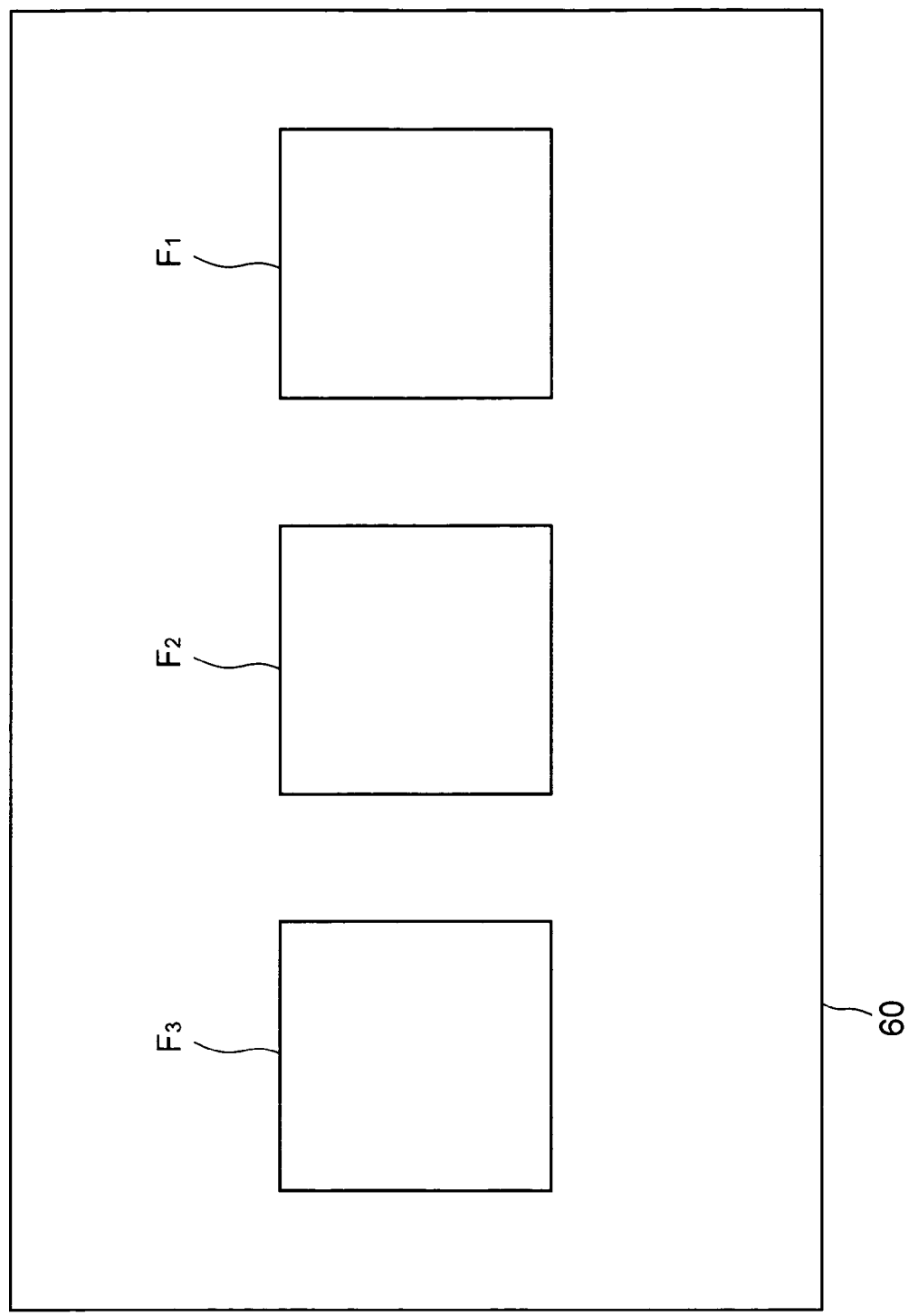
FIGS. 11A to 11F are plan views schematically illustrating images displayed on a display of the CAD system in the reticle fabrication method of the first embodiment of the present invention.

In this step S1, graphic information which indicates the shapes and sizes of the first to third active regions I to III is inputted to the control unit 103 through the keyboard 101 (see FIG. 9) or the mouse 105. The control unit 103 creates image data necessary to visualize this graphic information. As a result, as illustrated in FIG. 11A, first to third active region designation frames $F_1$ to $F_3$ based on this image data are generated in a certain layer of CAD, and the shapes thereof are displayed on the display region 60 of the display 104. These first to third active region designation frames $F_1$ to $F_3$ are displayed on the display region 60, as the first to third active regions I to III similarly enlarged by the reciprocal of the reduction ratio of an optical exposure system used in the steps of FIGS. 7K and 7N.

It should be noted that the third active region designation frame $F_3$ corresponds to the third active region III (see FIG. 7U) partially constituting the core unit of the semiconductor device and that a plurality of second p-type MOS transistors $TR_{p2}$ are formed as transistors for operations in the core unit as described previously. Accordingly, if a graphic such as a frame overlapping the third active region designation frame $F_3$ corresponding to the third active region III exists on the CAD system, the graphic makes it difficult to design the second p-type MOS transistor $TR_{p2}$. Thus, in subsequent steps, a graphic overlapping the third active region designation frame $F_3$ is prevented from being generated on the CAD system.

After step S1 has been finished as described above, the method goes to step S2 of FIG. 10A.

Figure 11B:
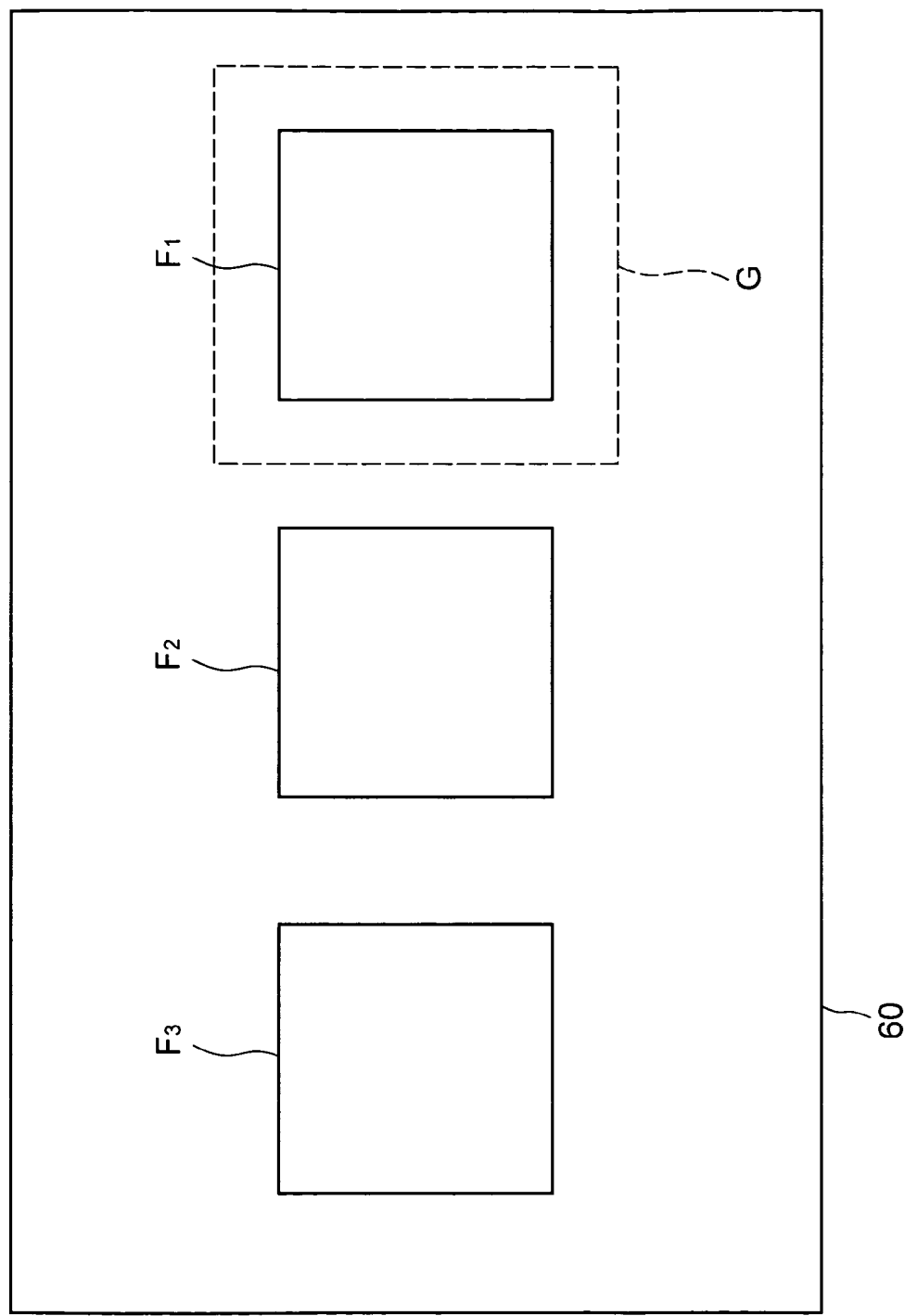

In this step S2, as illustrated in FIG. 11B, a first film thickness designation frame G which surrounds the first active region designation frame $F_1$ is generated in a layer different from that of the first to third active region designation frames $F_1$ to $F_3$, and is displayed on the display region 60. A method of generating this first film thickness designation frame G is not particularly limited. For example, the first film thickness designation frame G may be generated by the user operating the mouse 105 (see FIG. 9) to drag a pointer (not shown) displayed on the display region 60. Alternatively, the first film thickness designation frame G may be generated by inputting an enlargement ratio to the control unit 103 through the keyboard 101 (see FIG. 9) and similarly enlarging the first active region designation frame $F_1$ by the enlargement ratio.

After that, the method goes to step S3 of FIG. 10A.

Figure 11C:
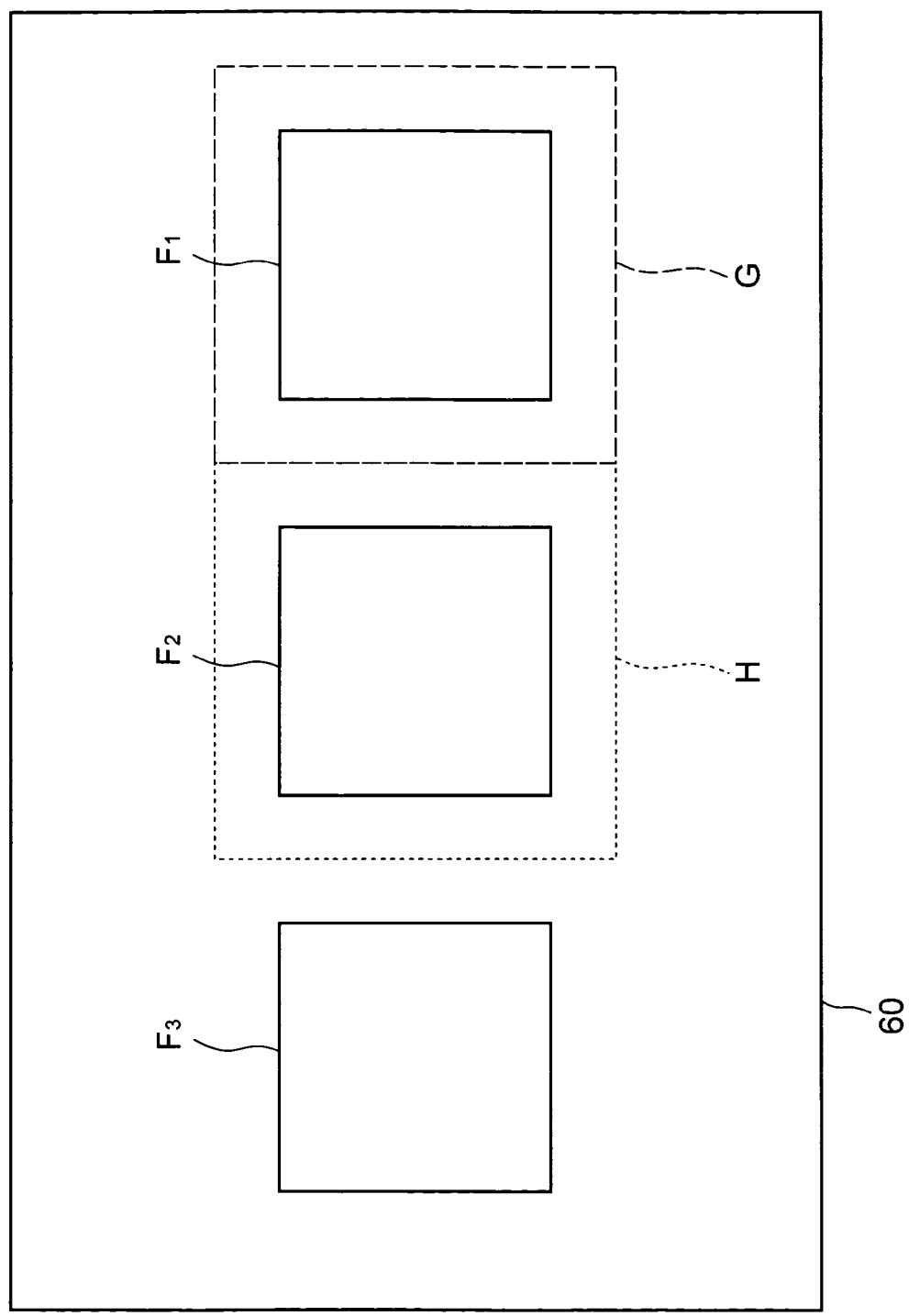

In this step S3, as illustrated in FIG. 11C, a second film thickness designation frame H which surrounds the second active region designation frame $F_2$ is displayed on the display region 60 by a method similar to that for the first film thickness designation frame G. The second film thickness designation frame H is generated in a layer different from that of the first film thickness designation frame G.

Further, the second film thickness designation frame H is only required to be connected to the first film thickness designation frame G, and is not necessarily required to be in contact with the first film thickness designation frame G as illustrated in the drawing. However, if the second film thickness designation frame H is set to be in contact with the first film thickness designation frame G, the second film thickness designation frame H can be easily generated using graphic information of the first film thickness designation frame G. Thus, a burden on the user can be reduced.

Subsequently, the method goes to step S4 of FIG. 10A.

Figure 11D:
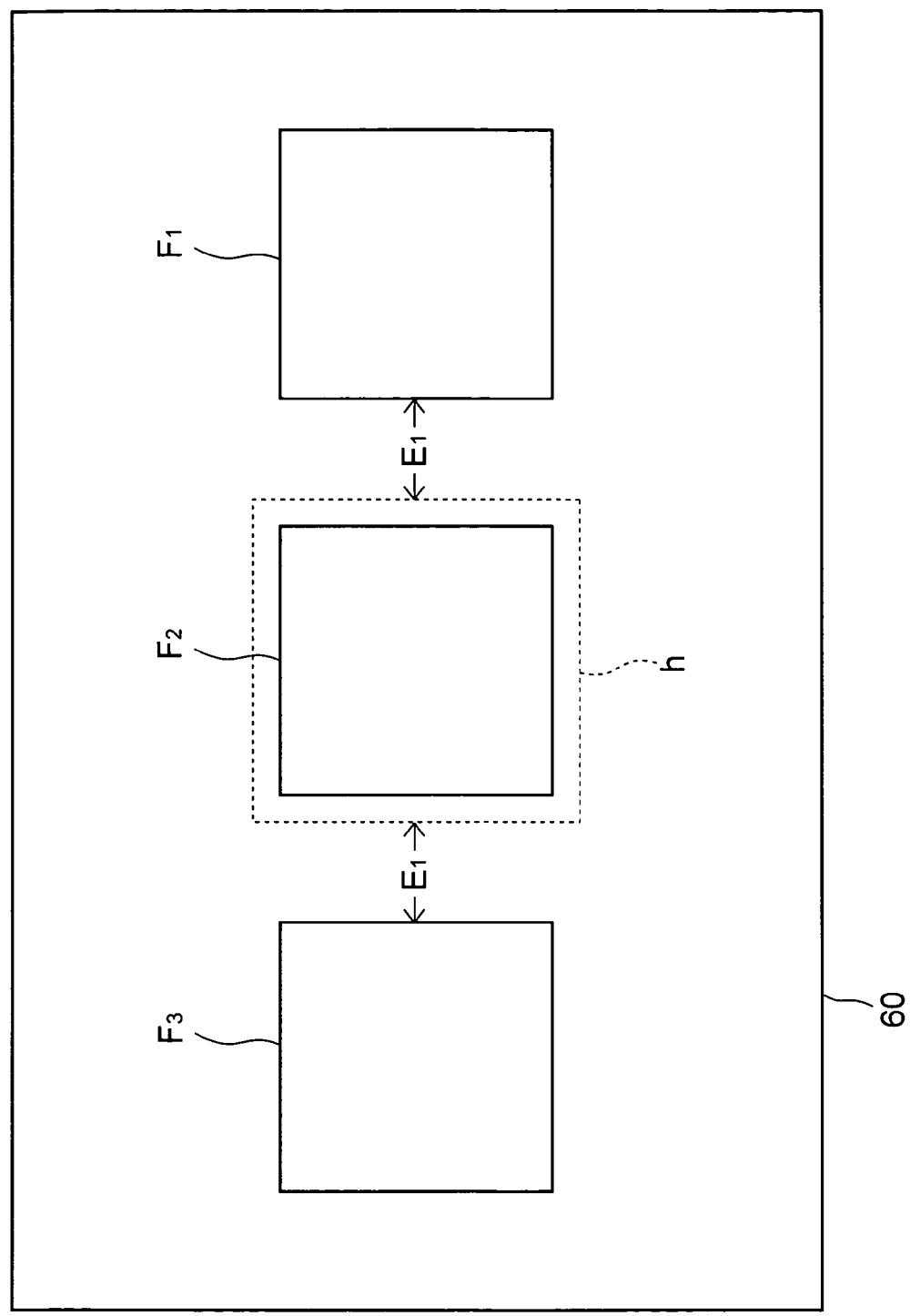

In this step S4, as illustrated in FIG. 11D, a shrunk frame h is generated on the display region 60 by shrinking the second film thickness designation frame H illustrated in FIG. 11C. The shrunk frame h corresponds to the first resist opening portion 38a of the first resist pattern 38c illustrated in FIG. 8A. The distance $E_1$ from the shrunk frame h to the first and third active region designation frames $F_1$ and $F_3$ is equal to a value obtained by multiplying the first distance $D_1$ (see FIG. 8A) by the reciprocal of the reduction ratio of the exposure system.

It should be noted that in this step S4, the first film thickness designation frame G of FIG. 11C may not be displayed on the display region 60 by temporarily saving the first film thickness designation frame G in the storage unit 103a (see FIG. 9) or the like.

After this step S4 has been finished, the method goes to step S5 of FIG. 10A.

In this step S5, graphic information (data) $f_1$ of the shrunk frame h (see FIG. 11D) generated in step S4 is obtained and stored in the storage unit 103a. This graphic information $f_1$ includes shape data such as the size, shape, and the like of the shrunk frame h.

Subsequently, the method goes to step S6 of FIG. 10B.

In this step S6, as illustrated in FIG. 1E, both of the aforementioned first and second film thickness designation frames G and H are enlarged. This is performed by, for example, designating an enlargement width through the keyboard 101 (see FIG. 9) by the user.

Next, the method goes to step S7 of FIG. 10B.

Figure 11E:
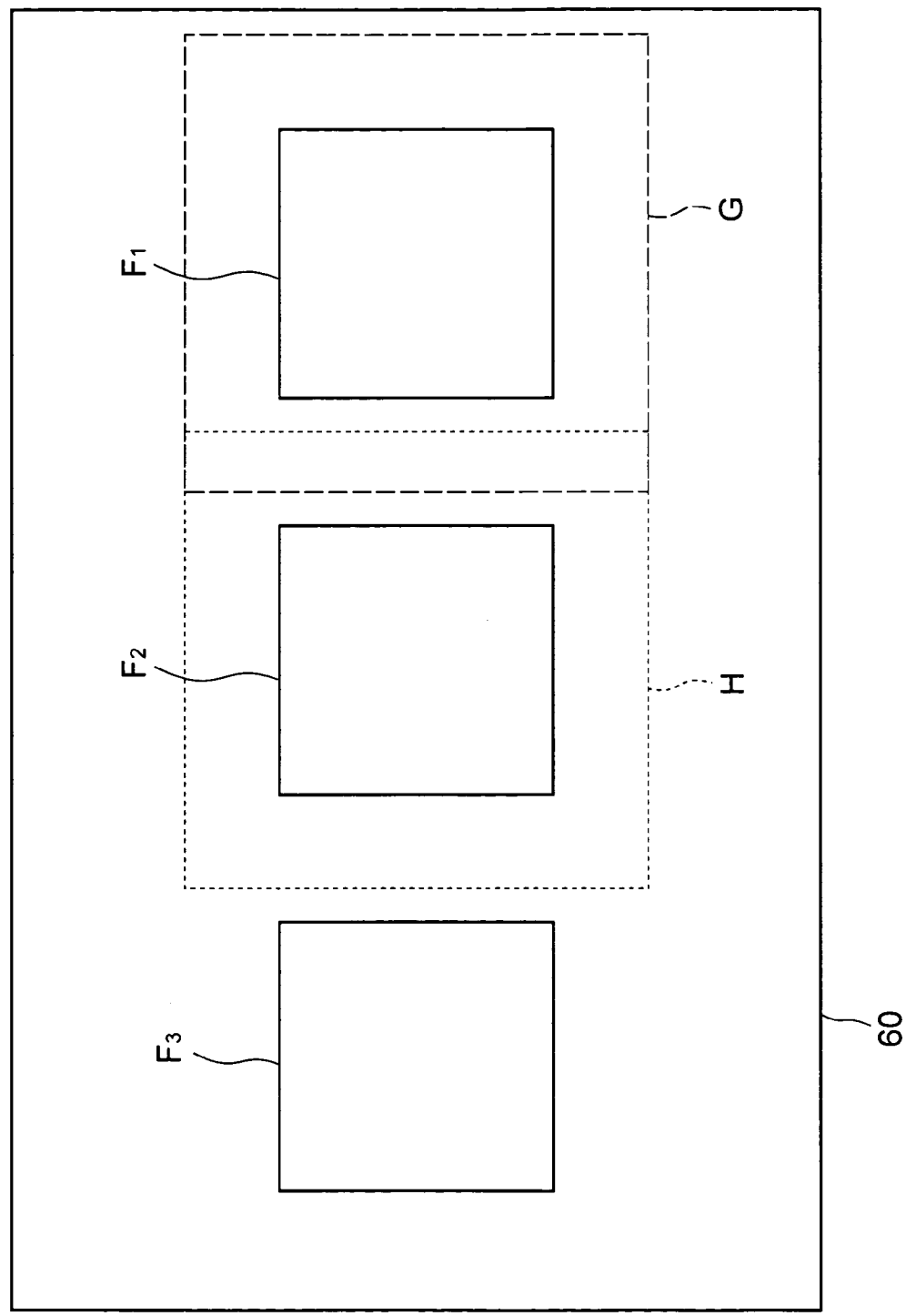
Figure 11F:
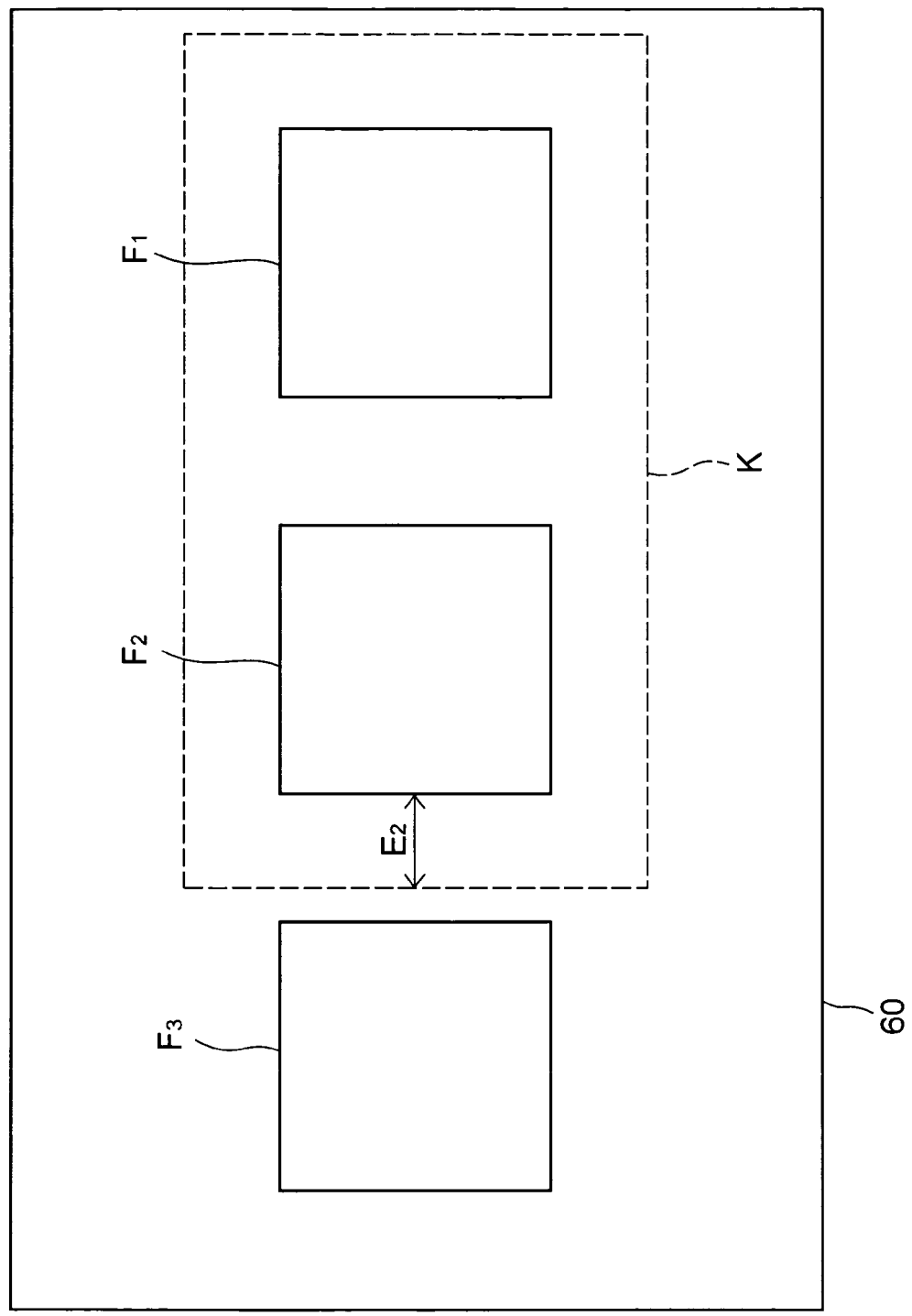

In step S7, as illustrated in FIG. 11F, a third film thickness designation frame K is newly generated in a layer different from those of the aforementioned first and second film thickness designation frames G and H, by combining the first and second film thickness designation frames G and H enlarged in the aforementioned step. The third film thickness designation frame K is displayed on the display region 60.

This third film thickness designation frame K corresponds to the resist portion 45b of the second resist pattern 45c illustrated in FIG. 8B. The distance $E_2$ between the designation frame K and the second active region designation frame $F_2$ is equal to a value obtained by multiplying the second distance $D_2$ (see FIG. 8B) by the reciprocal of the reduction ratio of the exposure system.

Subsequently, the method goes to step S8 of FIG. 10B, and graphic information (data) $f_2$ of this third film thickness designation frame K is obtained and stored in the storage unit 103a (see FIG. 9). This graphic information $f_2$ includes shape data such as the size, shape, and the like of the third film thickness designation frame K.

Through the above-described steps, the graphic information $f_1$ and $f_2$ necessary to fabricate reticles has been obtained. In subsequent steps S9 and S10, reticles are actually fabricated using the graphic information $f_1$ and $f_2$.

FIGS. 12A to 12E are cross-sectional views of the first reticle fabricated in step S9 in the process of being fabricated. The first reticle is used to form the first resist pattern 38c by exposing the first photoresist 38 described in FIG. 7I. It should be noted that in FIGS. 12A to 12E, first to third regions $A_I$ to $A_{III}$ respectively corresponding to the first to third active regions of the semiconductor substrate 30 are also written.

Further, the following description is for the case where the first reticle is fabricated by lithography using an electron beam exposure system. However, the first reticle may be fabricated by photolithography using an optical exposure system.

In order to fabricate the first reticle, as illustrated in FIG. 12A, a chromium film is formed as a first light-blocking film 71 on a first transparent substrate 70 such as a quartz substrate by sputtering, and first electron beam resist 72 is coated on the surface of the first light-blocking film 71.

Next, a process for obtaining the cross-sectional structure illustrated in FIG. 12B will be described.

Figure 14:
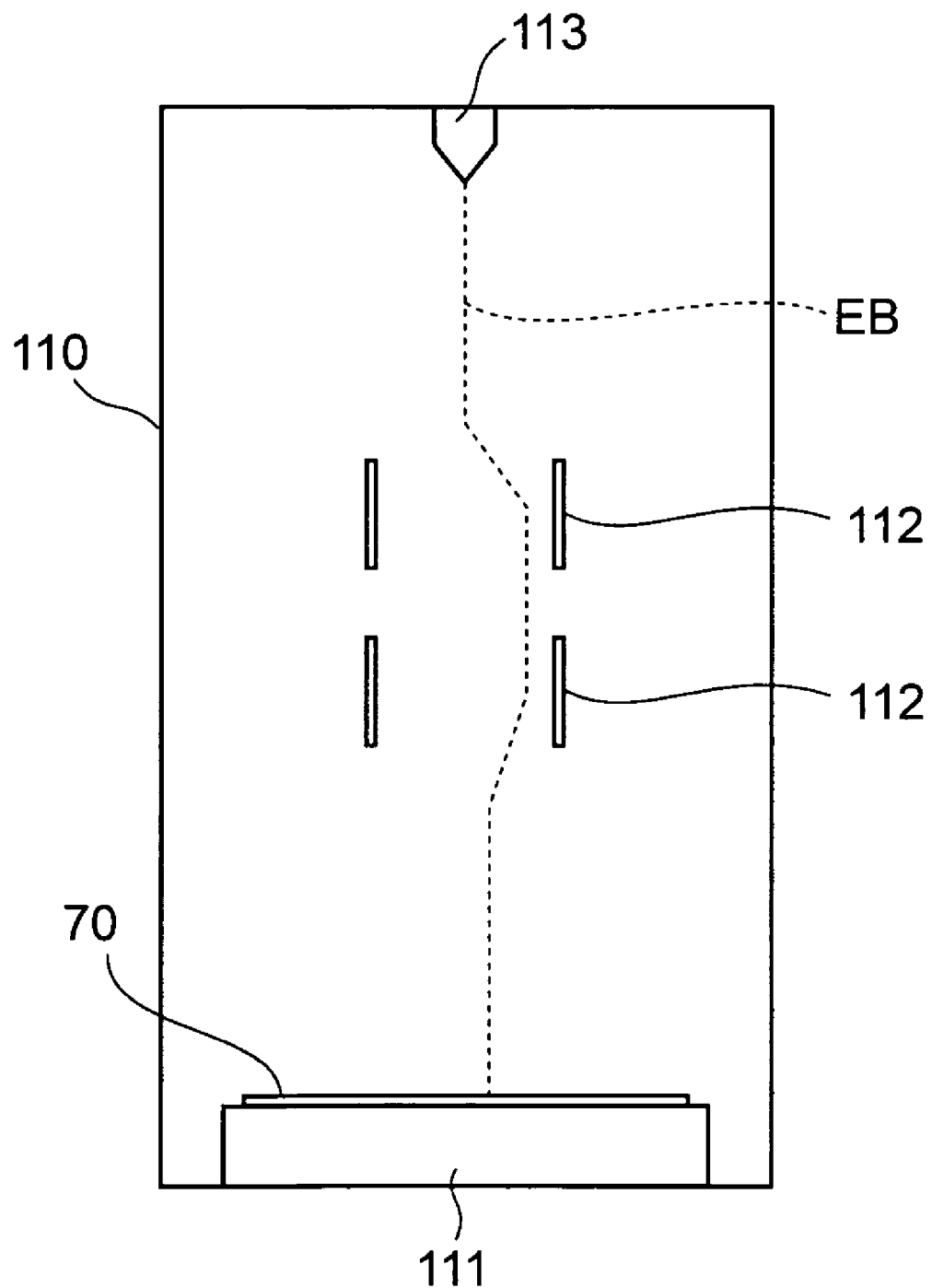
FIG. 14 is a view of the configuration of an electron beam exposure system used in the first embodiment of the present invention.

FIG. 14 is a view of the configuration of an electron beam exposure system used in this process. The electron beam exposure system includes a column 110 in which the pressure inside is reduced. A wafer stage 111, deflectors 112, and an electron gun 113 are arranged in the column 110 as illustrated in the drawing.

In this process, first, the first transparent substrate 70 is placed on the wafer stage 111 of this electron beam exposure system.

Subsequently, the pressure in the column 110 is reduced to a predetermined pressure, and then the graphic information $f_1$ of the shrunk frame h (see FIG. 11D) obtained in step S5 of FIG. 10A is inputted to the electron bean exposure system. Thus, the values of voltages and the amounts of currents which are applied to the deflectors 112 are set to values according to the graphic information $f_1$. Further, an electron beam EB generated in the electron gun 113 is deflected by the deflectors 112 by a distance corresponding to the graphic information $f_1$, and the first electron beam resist 72 (see FIG. 12B) is exposed to the electron beam EB.

As a result, as illustrated in FIG. 12B, a portion of the first electron beam resist 72 which corresponds to the inside of the shrunk frame h (see FIG. 11D) is photoreacted, and a first photoreacted portion 72a is formed in this portion.

After that, the first photoreacted portion 72a is removed by developing the first electron beam resist 72, thus forming a first electron beam resist pattern 72d including a first window 72b and a first electron beam resist portion 72c as illustrated in FIG. 12C.

Subsequently, as illustrated in FIG. 12D, the light-blocking film 71 is wet etched using the first electron beam resist pattern 72d as a mask, thus removing the first light-blocking film 71 under the first window 72b to form a first mask opening portion 71a.

Figure 12E:
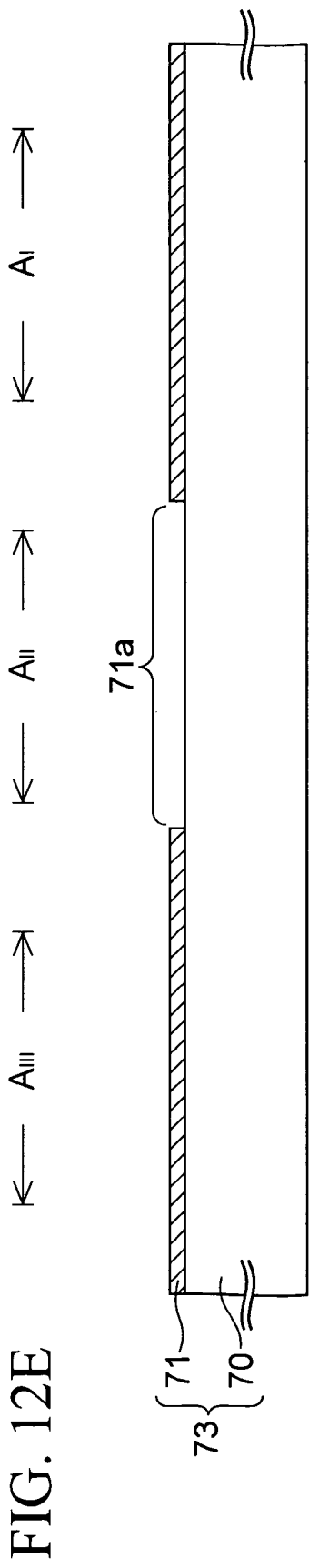

After that, the first electron beam resist pattern 72d is removed, thus completing the first reticle 73 including the first transparent substrate 70 and the first light-blocking film 71 as illustrated in FIG. 12E.

Figure 13:
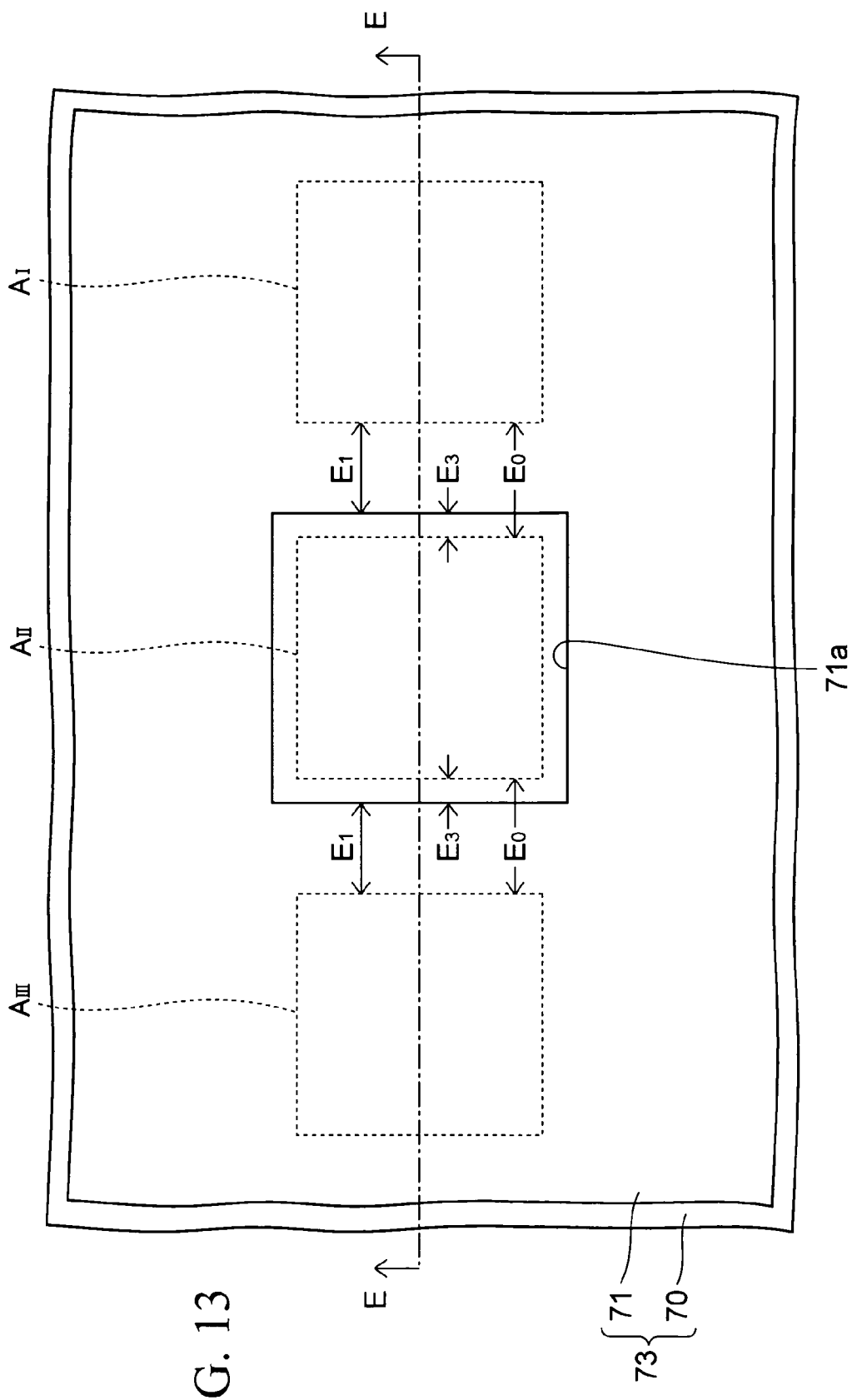
FIG. 13 is a plan view of the first reticle used in the first embodiment of the present invention.

FIG. 13 is a plan view of this first reticle 73. The aforementioned FIG. 12E is a cross-sectional view taken along the E-E line of FIG. 13. As illustrated in FIG. 13, the first reticle 73 is fabricated by removing a portion of the first light-blocking film 71 which corresponds to the inside of the shrunk frame h illustrated in FIG. 11D and forming the first mask opening portion 71a in this portion.

Next, step S10 of FIG. 10B will be described.

FIGS. 15A to 15E are cross-sectional views of the second reticle fabricated in step S10 in the process of being fabricated. The second reticle is used to form the second resist pattern 45c by exposing the second photoresist 45 described in FIG. 7M. It should be noted that in FIGS. 15A to 15E, the first to third regions $A_I$ to $A_{III}$ respectively corresponding to the first to third active regions of the semiconductor substrate 30 are also written as in FIGS. 12A to 12E.

Further, the following description is for the case where the second reticle is fabricated by lithography using an electron beam exposure system. However, the second reticle may be fabricated by photolithography using an optical exposure system.

To begin with, a process for obtaining the cross-sectional structure illustrated in FIG. 15A will be described.

First, a chromium film is formed on a second transparent substrate 75 such as a quartz substrate by sputtering. This chromium film is used as a second light-blocking film 76. After that, second electron beam resist 77 is applied to the surface of the second light-blocking film 76.

Next, a process for obtaining the cross-sectional structure illustrated in FIG. 15B will be described.

First, the second transparent substrate 75 is placed on the wafer stage 111 of the electron beam exposure system described in FIG. 14. Further, the graphic information $f_2$ of the third film thickness designation frame K (see FIG. 11F) obtained in step S8 of FIG. 10B is inputted to the electron beam exposure system, whereby the electron beam EB is deflected by the deflectors 112 by a distance corresponding to the graphic information $f_2$.

Thus, as illustrated in FIG. 15B, a portion of the second electron beam resist 77 which corresponds to the outside of the third film thickness designation frame K (see FIG. 11F) is photoreacted, and a second photoreacted portion 77a is formed in this portion.

After that, the second photoreacted portion 77a is removed by developing the second electron beam resist 77, thus forming a second resist pattern 77d including a second window 77b and a second electron beam resist portion 77c as illustrated in FIG. 15C.

Then, as illustrated in FIG. 15D, the second light-blocking film 76 is wet etched using the second resist pattern 77d as a mask, whereby the second light-blocking film 76 under the second window 77b is removed to form a second mask opening portion 76a.

Figure 15E:
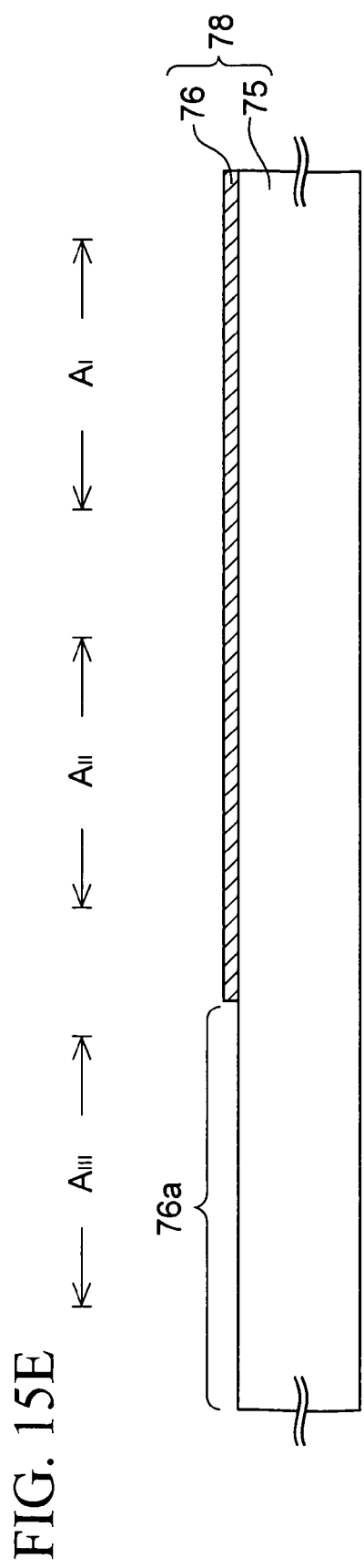

Further, the second resist pattern 77d is removed after the above-described etching has been finished, thus completing the second reticle 78 including the second transparent substrate 75 and the second light-blocking film 76 as illustrated in FIG. 15E.

Figure 16:
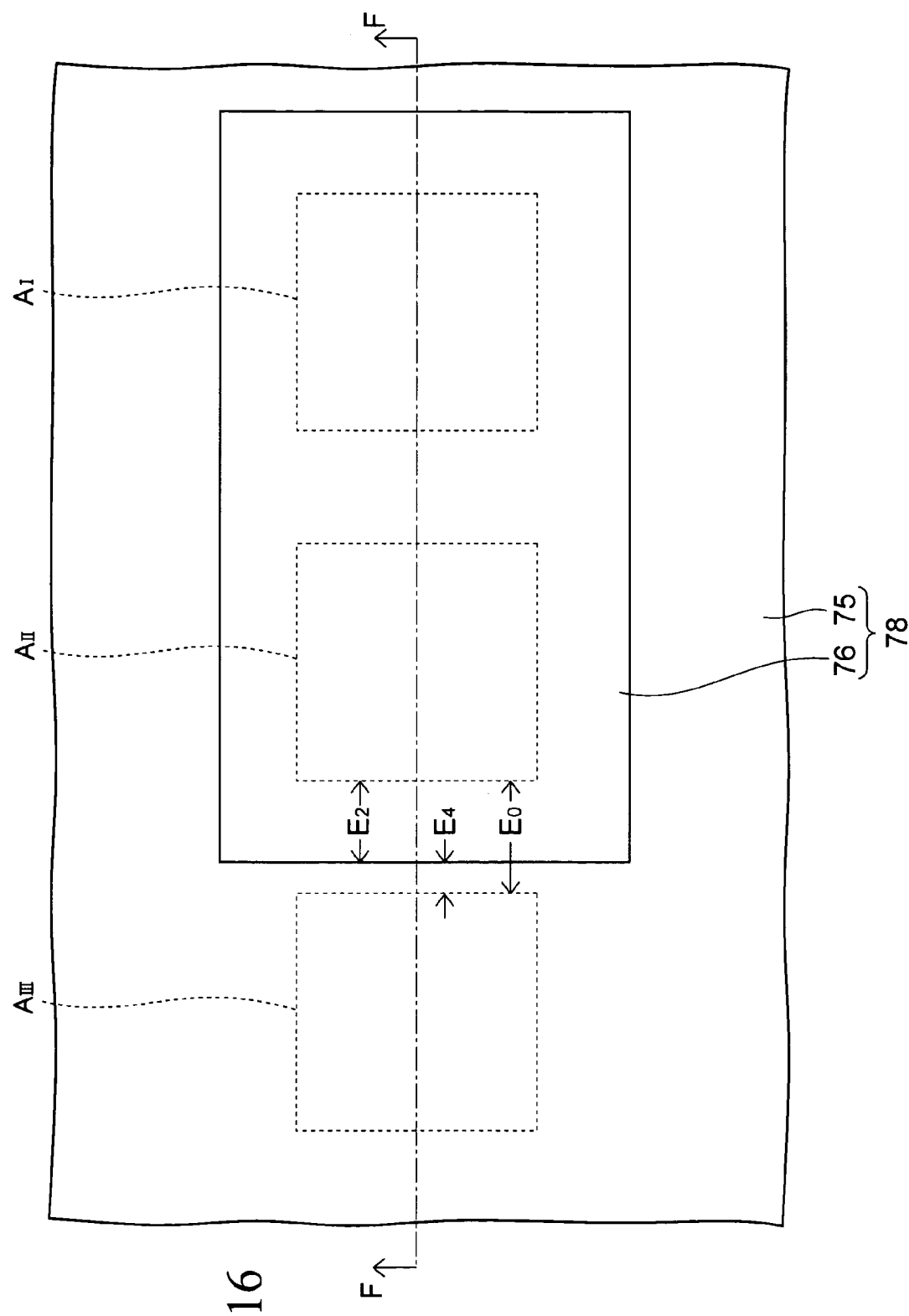
FIG. 16 is a plan view of the second reticle used in the first embodiment of the present invention.

FIG. 16 is a plan view of the second reticle 78. The aforementioned FIG. 15E is a cross-sectional view taken along the F-F line of FIG. 16. As illustrated in FIG. 16, the second reticle 78 is formed by removing a portion of the second light-blocking film 76 which corresponds to the outside of the third film thickness designation frame K described in FIG. 11F so that the second light-blocking film 76 is left only in the designation frame K.

Thus, major steps of a reticle fabrication method illustrated in the flowcharts of FIGS. 10A and 10B are finished.

In this embodiment described above, as illustrated in FIG. 11C, the first and second film thickness designation frames G and H which respectively surround the first and second active region designation frames $F_1$ and $F_2$ are formed. At this time, on the CAD system, no graphics and frames other than the third active region designation frame $F_3$ are generated in a portion corresponding to the third active region III in which the third gate insulating film 43 (see FIG. 7Q) having the smallest thickness is formed.

Moreover, as illustrated in FIG. 11D, the shrunk frame h is generated by shrinking the second film thickness designation frame H, and the first mask opening portion 71a of the first reticle 73 (see FIG. 13) is formed using the graphic information $f_1$ of this shrunk frame h. As illustrated in FIG. 13, the first mask opening portion 71a formed as described above is separated from the first and third regions $A_I$ and $A_{III}$ by the distance $E_1$ necessary to prevent an etchant from penetrating to the first and third active regions I and III of the semiconductor device, whereas the distance $E_3$ from the first mask opening portion 71a to the second region $A_{II}$ becomes smaller than $E_1$.

Accordingly, since the distance $E_0$ between each of the first to third regions $A_I$ to $A_{III}$ on the mask becomes less than twice ($2E_1$) the above-described distance $E_1$, the distance between each of the first to third active regions I to III on the silicon substrate, i.e., the width W (see FIG. 8A) of the device-isolation insulating film 33, becomes less than twice ($2D_1$) the first distance $D_1$ on the silicon substrate, the first distance $D_1$ corresponding to the distance $E_1$. Thus, the width W can be reduced to approximately 0.36 μm.

On the other hand, as for the second reticle 78, the third film thickness designation frame K of FIG. 11F is created by enlarging the aforementioned first and second film thickness designation frames G and H as illustrated in FIG. 11E and combining them. Further, as illustrated in FIG. 15D, the second reticle 78 including the transparent substrate 75 and the light-blocking film inside the frame K is formed by removing the light-blocking film 76 outside the frame K based on the graphic information $f_2$ of the third film thickness designation frame K.

As illustrated in FIG. 16, in the second reticle 78 obtained as described above, the distance between an edge portion of the light-blocking film 76 and the second region $A_{II}$ has a value $E_2$ necessary to prevent an etchant from penetrating to the second active region II of the semiconductor device. Further, the distance $E_4$ between the light-blocking film 76 and the third region $A_{III}$ becomes smaller than this $E_2$.

Accordingly, for a reason similar to that in the case of the first reticle 73, the width W of the device-isolation insulating film 33 has a value less than twice ($2D_2$) the second distance $D_2$ on the substrate which corresponds to the distance $E_2$, e.g., a value of approximately 0.36 μm.

Thus, in this embodiment, by enlarging and shrinking the first and second film thickness designation frames G and H, the width W of the device-isolation insulating film, which cannot be set below 0.52 μm in the example described in Preliminary Explanation, can be reduced to 0.36 μm as described above. This can greatly contribute to the miniaturization of a semiconductor device which will be desired in the future.

Moreover, in this embodiment, as illustrated in FIGS. 11A to 11F, no graphics other than the third film thickness designation frame $F_3$ are generated on the CAD system in a portion which corresponds to the third active region III. Accordingly, even if a large number of third active regions III are provided in the silicon substrate 30 and the aforementioned second p-type MOS transistors $TR_{p2}$ are respectively formed in the third active regions III, graphics on the CAD system do not become obstacles to the design of each second p-type MOS transistor $TR_{p2}$. This can prevent an increase of a burden on a designer of the semiconductor device.

Furthermore, in this embodiment, as illustrated in FIGS. 7I to 7Q, the removal of a thermal oxide film which becomes any one of the first to third gate insulating films 41 to 43 is performed only once in each of the first to third active regions I to III. Accordingly, no divots are generated in the device-isolation insulating film 33 unlike in the case where the removal of a thermal oxide film is performed at a plurality of times, and it is possible to prevent an electric field from concentrating at end portions of the first to third active regions I to III when the first and second p-type MOS transistors $TR_{p1}$ and $TR_{p2}$ and the n-type MOS transistor $TR_n$ are driven.

(3) Second Embodiment

FIGS. 17A to 17K are cross-sectional views of a semiconductor device according to a second embodiment of the present invention in the process of being fabricated. It should be noted that in these drawings, the same components as those described in the first embodiment are denoted by the same reference numerals as those of the first embodiment and will not be further described below.

In the aforementioned first embodiment, as illustrated in FIG. 7U, the first to third active regions I to III are arranged in this order in the silicon substrate 30.

On the other hand, in this embodiment, the first and second active regions I and II of the first embodiment are replaced with each other. Other than this, for example, a method of fabricating the first and second reticles 73 and 78 is the same as that of the first embodiment.

In order to fabricate the semiconductor device according to this embodiment, the steps of FIGS. 7A to 7I described in the first embodiment are performed, thereby obtaining a cross-sectional structure in which the first photoresist 38 is applied to the entire upper surface of the silicon substrate 30 as illustrated in FIG. 17A.

Next, as in the step of FIG. 7J, the first photoresist 38 is exposed using the first reticle 73 and developed, thus forming the first resist pattern 38c as illustrated in FIG. 17B. The first resist pattern 38c includes the first resist opening portion 38a and the first resist portion 38b. The overlap distance between the first resist portion 38b and the device-isolation insulating film 33 is set to $D_1$ which is the same as that of the first embodiment.

Subsequently, as illustrated in FIG. 17C, the first gate insulating film 41 is removed through the first resist opening portion 38a of the first resist pattern 38c by wet etching. As an etchant thereof, for example, a hydrofluoric acid solution is used.

As in the first embodiment, in this wet etching, the etchant penetrates to the interface between the first resist pattern 38c and the device-isolation insulating film 33, and the step 33a of the device-isolation insulating film 33 recedes by Δ.

Then, as illustrated in FIG. 17D, the first resist pattern 38c is removed.

Next, as illustrated in FIG. 17E, the surface of the silicon substrate 30 in the second active region II is thermally oxidized by a thermal oxidation at the same substrate temperature as that of the first embodiment, thus forming a thermal oxide film having a thickness of approximately 1.5 nm. This thermal oxide film is referred to as a second gate insulating film 42.

Further, as illustrated in FIG. 17F, the second photoresist 45 is applied to the entire upper surface of the silicon substrate 30, and then is exposed and developed, thus forming the second resist pattern 45c as illustrated in FIG. 17G. In this exposure, the second reticle 78 described in the first embodiment is used.

Moreover, as described in the first embodiment, the second resist pattern 45c includes the second resist portion 45b and the second resist opening portion 45a through which the third active region III is exposed. Further, the overlap distance between the second resist portion 45b and the device-isolation insulating film 33 is set to $D_2$ which is the same as that of the first embodiment.

Subsequently, as illustrated in FIG. 17H, the first gate insulating film 41 under the second resist opening portion 45a is removed by wet etching using a hydrofluoric acid solution as an etchant. At this time, the etchant penetrates to the interface between the second resist portion 45b and the device-isolation insulating film 33, and the step 33b, which is formed in the upper surface of the device-isolation insulating film 33 by the wet etching, recedes by the distance Δ.

Figure 17I:
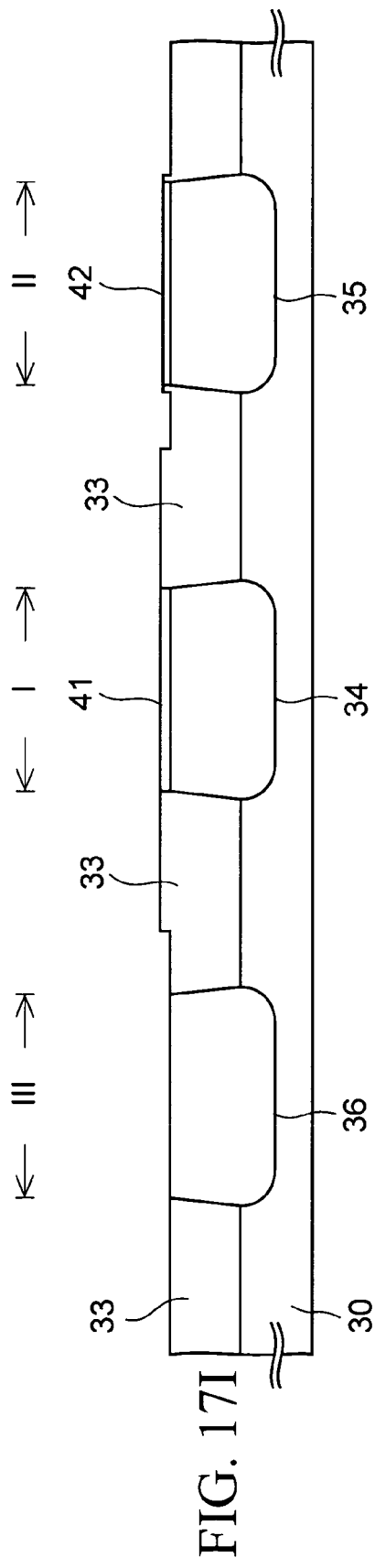

After that, as illustrated in FIG. 17I, the second resist pattern 45c is removed.

Figure 17J:
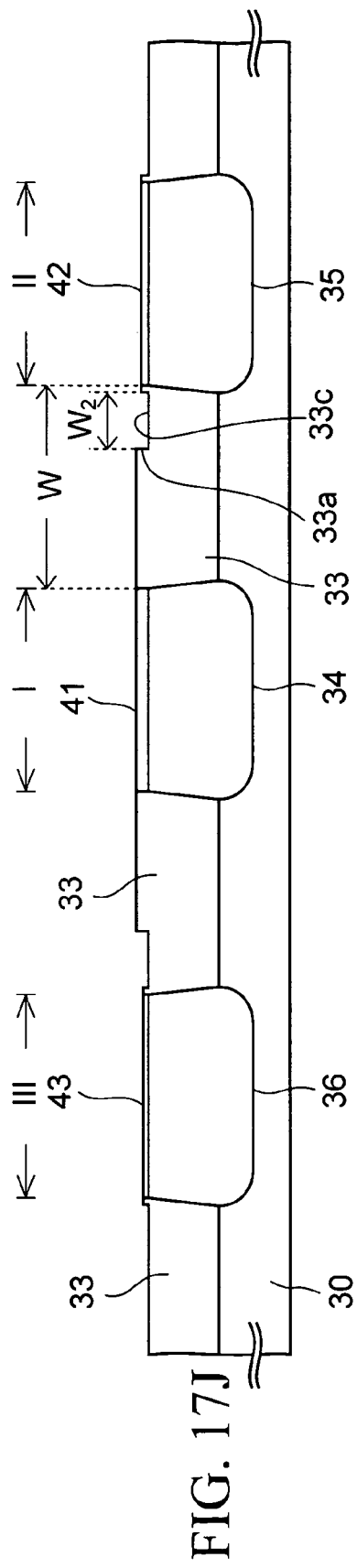

Next, as illustrated in FIG. 17J, by adopting the same thermal oxidation conditions as those of the first embodiment, the surface of the silicon substrate 30 in the third active region III is thermally oxidized, thus forming a thermal oxide film as the third gate insulating film 43 to a thickness of approximately 1.75 nm.

Through the above-described steps, the first to third gate insulating films 41 to 43, whose thicknesses decrease in this order, are formed in the first to third active regions I to III of the silicon substrate 30.

Figure 17K:
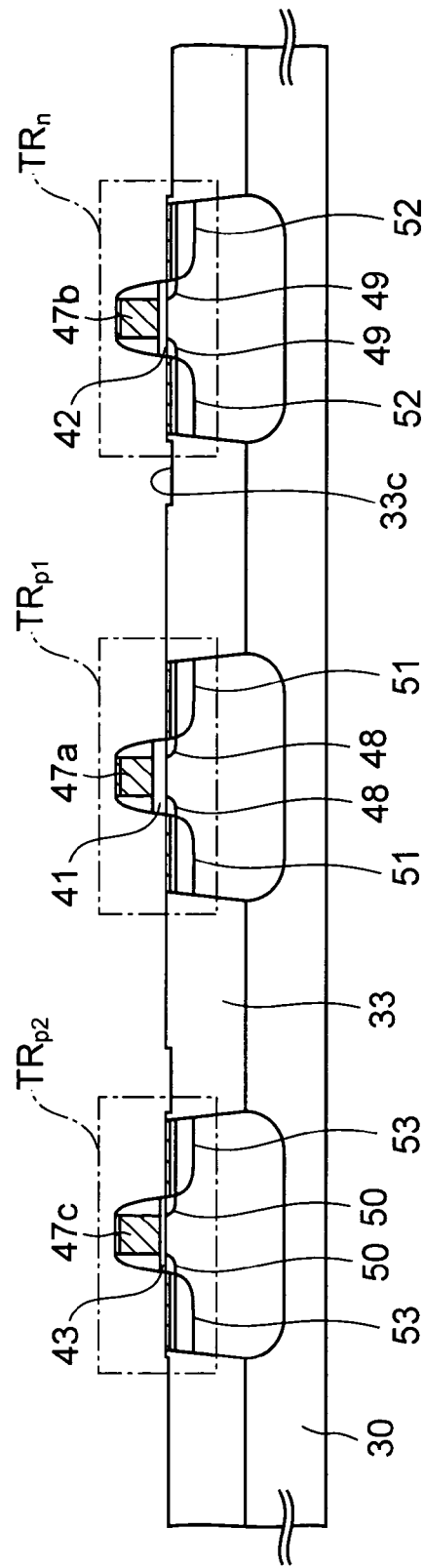

After that, the steps of FIGS. 7R to 7U described in the first embodiment are performed, thus forming the first and second p-type MOS transistors $TR_{p1}$ and $TR_{p2}$ and the n-type MOS transistor $TR_n$ which include the first to third gate insulating films 41 to 43 having different thicknesses as illustrated in FIG. 17K.

Through the above-described steps, a basic structure of the semiconductor device according to this embodiment is completed.

In this embodiment described above, when the first and second resist patterns 38c and 45c are formed by exposing a photoresist, the first and second reticles 73 and 78 fabricated according to the first embodiment are used. The first and second reticles 73 and 78 are fabricated based on the shrunk frame h and the third film thickness designation frame K which are obtained by shrinking and enlarging the first and second film thickness designation frames G and H as described in FIGS. 11C to 11F. Shrinking and enlarging frames as described above makes it possible to reduce the width of the device-isolation insulating film 33 as described in the first embodiment and to advance the miniaturization of a semiconductor device.

(4) Third Embodiment

In the first embodiment, as illustrated in FIG. 11C, the first and second film thickness designation frames G and H are formed so as to be in contact with each other. Such an arrangement of the frames G and H is useful in the case where the distance between the first and second active region designation frames $F_1$ and $F_2$ is small.

However, the arrangement of the frames G and H is not limited to the above-described one. The frames G and H may be arranged as follows. FIGS. 18 to 22 are plan views schematically illustrating images displayed on a display of a CAD system in a reticle fabrication method of this embodiment. It should be noted that in these drawings, the components described in the first embodiment are denoted by the same reference numerals as those of the first embodiment and will not be further described below.

(i) First Example

Figure 18:
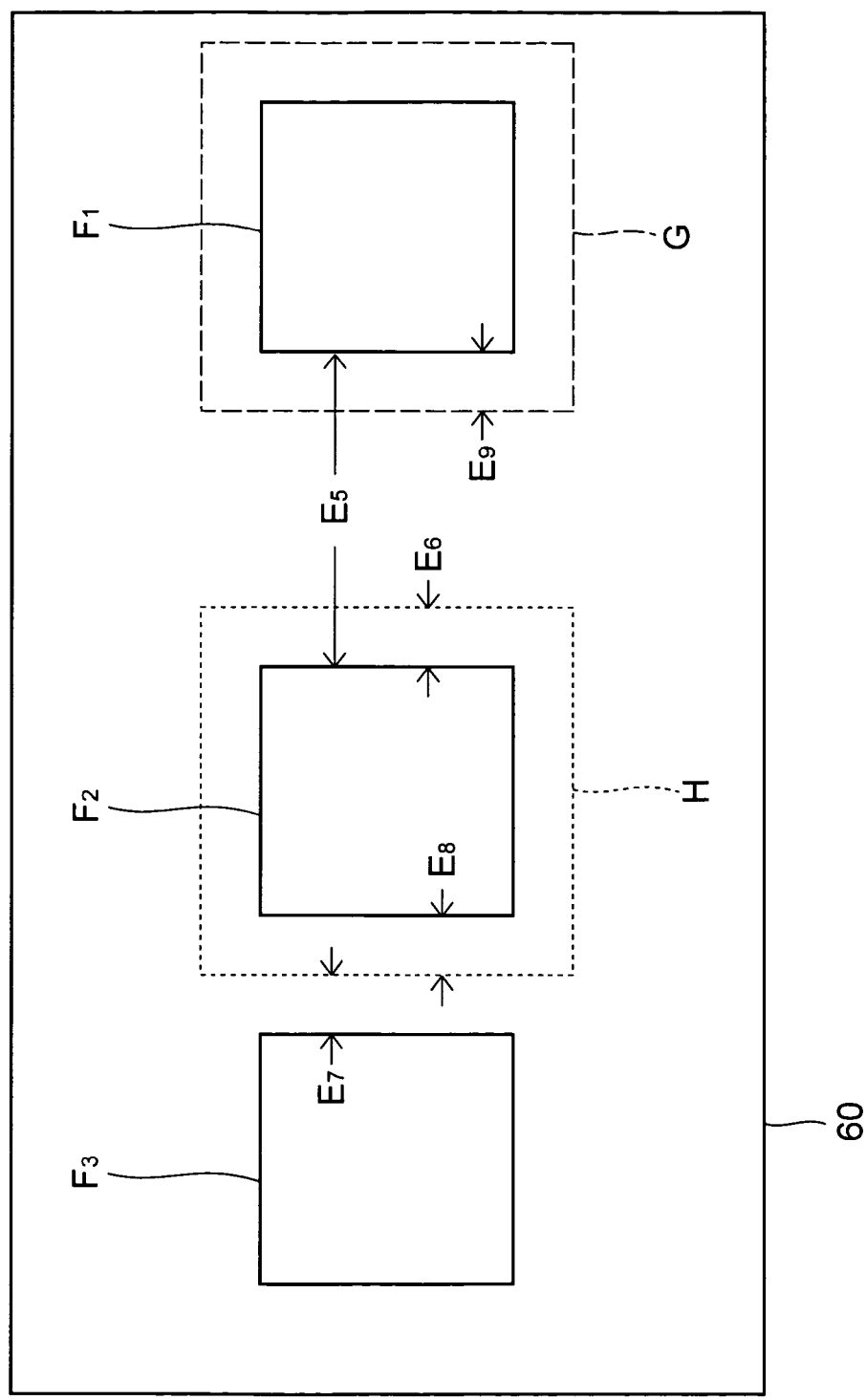
FIG. 18 is a first plan view schematically illustrating an image displayed on the display of the CAD system in a reticle fabrication method of a third embodiment of the present invention.

FIG. 18 is a plan view illustrating a method of arranging the designation frames G and H according to a first example.

As illustrated in this drawing, in the first example, the distance $E_5$ between the first and second active region designation frames $F_1$ and $F_2$ is sufficiently large. In this case, each of the distances $E_6$ to $E_9$ illustrated in this drawing is approximately 0.18 μm, and the designation frames G and H are arranged so as to be separated from each other.

(ii) Second Example

Figure 19:
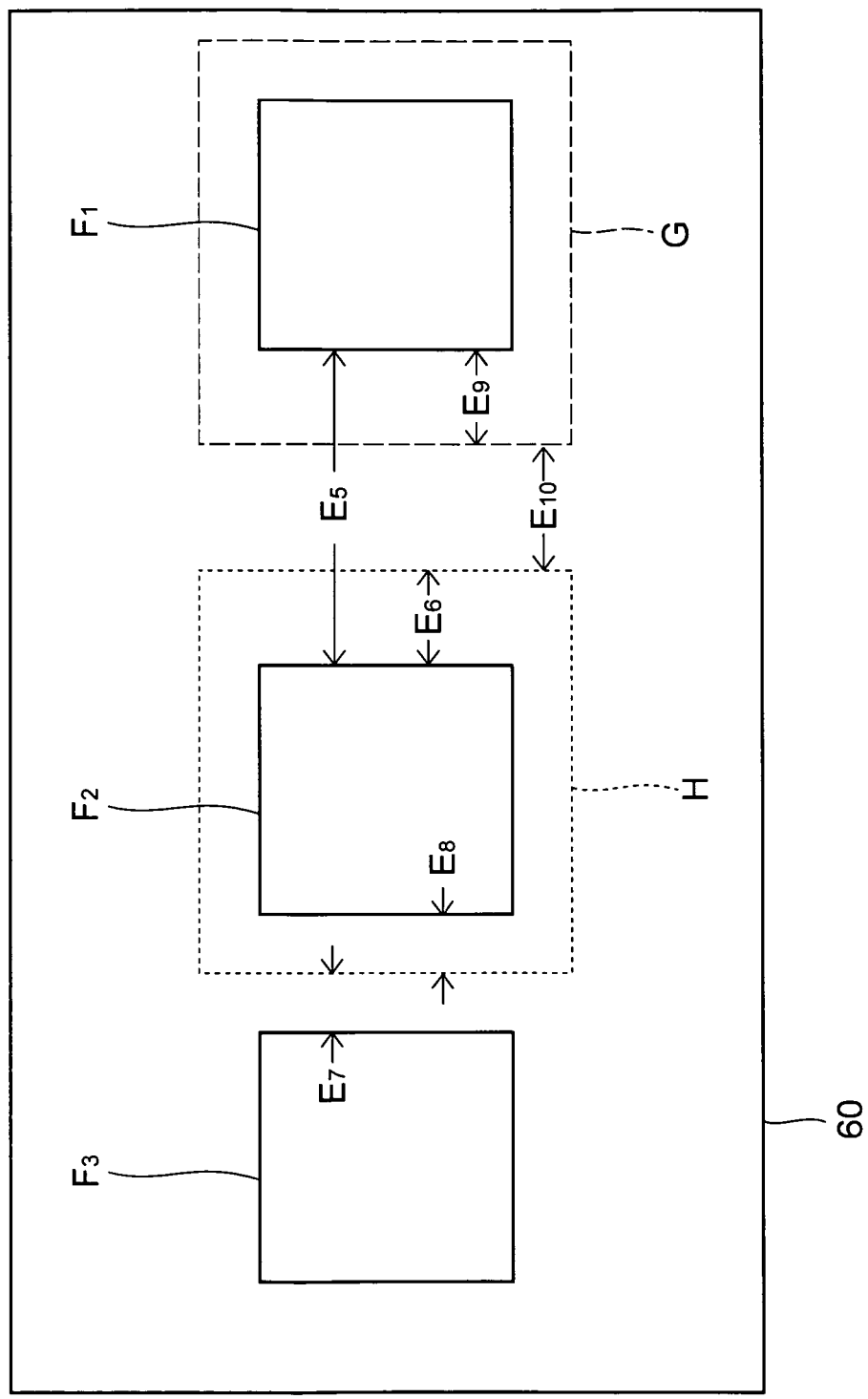
FIG. 19 is a second plan view schematically illustrating an image displayed on the display of the CAD system in the reticle fabrication method in the third embodiment of the present invention.

FIG. 19 is a plan view illustrating a method of arranging the designation frames G and H according to a second example.

In the second example, the distance $E_5$ between the first and second active region designation frames $F_1$ and $F_2$ is also sufficiently large as in the first example.

However, in this example, assumed is the case where the distance $E_{10}$ between the designation frames G and H can be set sufficiently large. In this case, the distance $E_9$ between the first film thickness designation frame G and the first active region designation frame $F_1$, and the distance $E_6$ between the second film thickness designation frame H and the second active region designation frame $F_2$ can be set larger than those of the first example.

Each of the distances $E_7$ and $E_8$ other than the above-described distances is set to approximately 0.18 μm as in the first example.

(iii) Third Example

Figure 20:
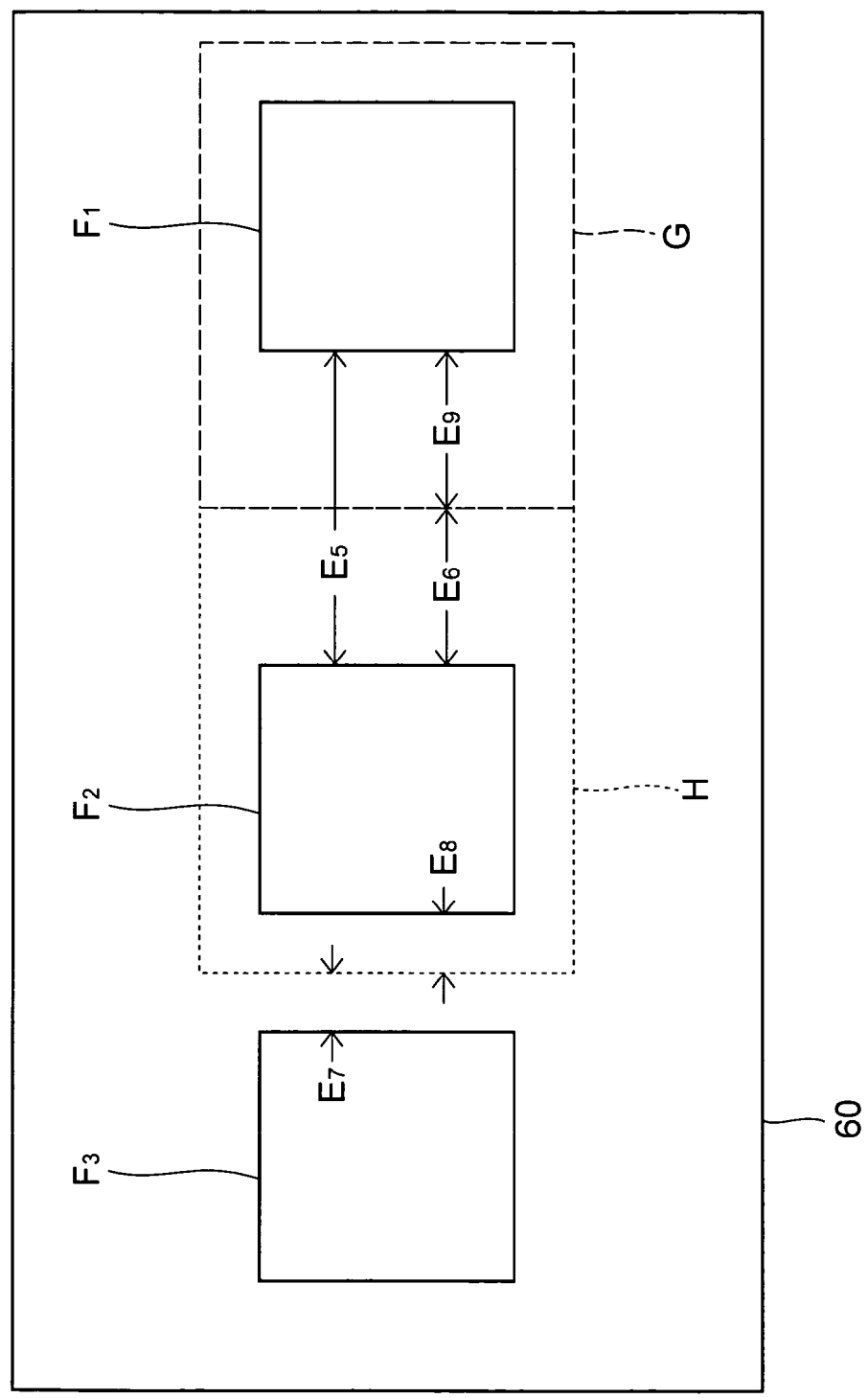
FIG. 20 is a third plan view schematically illustrating an image displayed on the display of the CAD system in the reticle fabrication method in the third embodiment of the present invention.

FIG. 20 is a plan view illustrating a method of arranging the designation frames G and H according to a third example.

In the aforementioned first and second examples, in the case where the distance $E_5$ between the first and second active region designation frames $F_1$ and $F_2$ is sufficiently large, the designation frames G and H are arranged so as to be separated from each other.

On the other hand, in this example, as illustrated in FIG. 20, the designation frames G and H are arranged so as to be in contact with each other. It should be noted that the distances $E_7$ and $E_8$ are approximately 0.18 μm as in the first example.

(iv) Fourth Example

Figure 21:
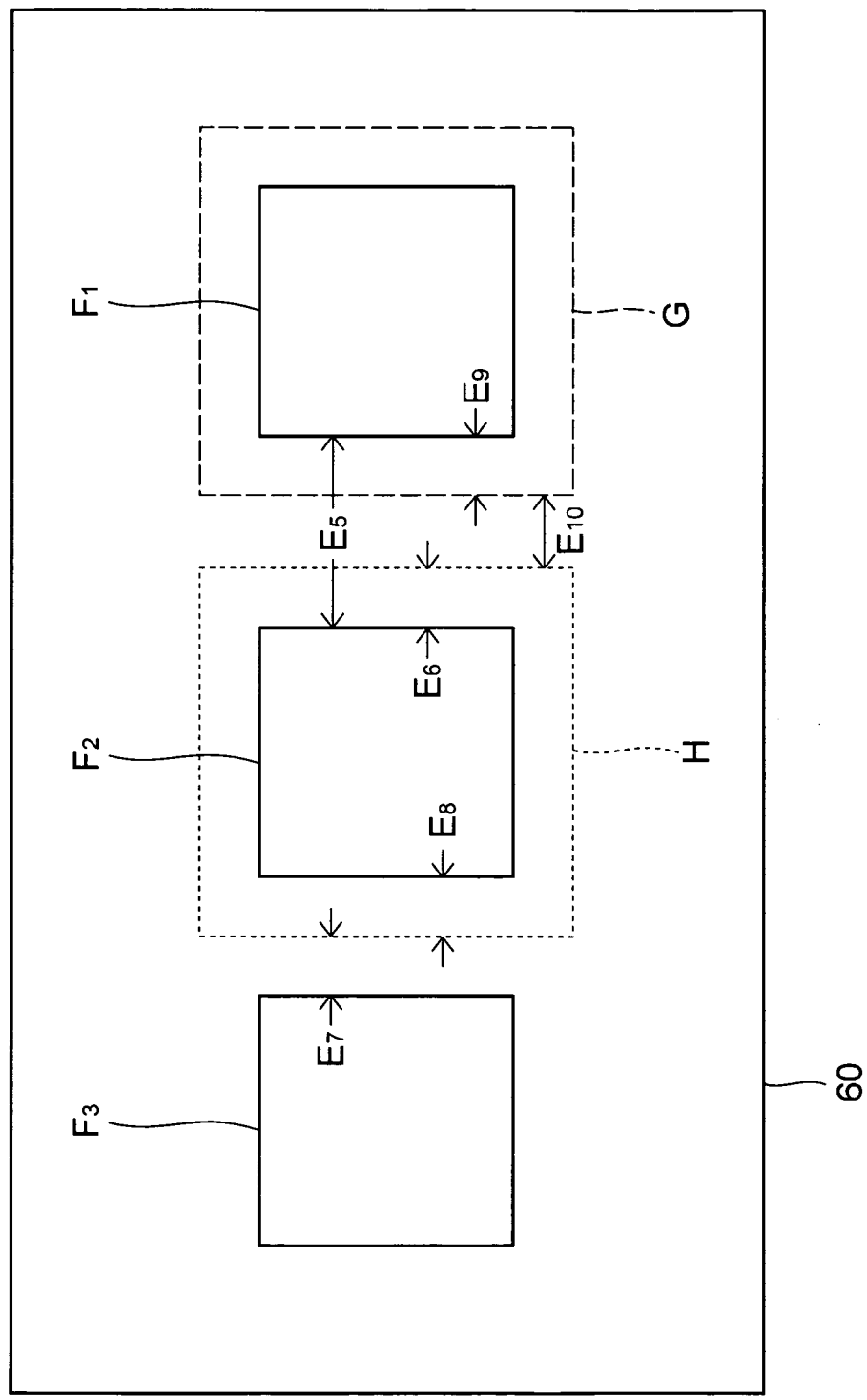
FIG. 21 is a fourth plan view schematically illustrating an image displayed on the display of the CAD system in the reticle fabrication method in the third embodiment of the present invention.

FIG. 21 is a plan view illustrating a method of arranging the designation frames G and H according to a fourth example.

In this example, as illustrated in FIG. 21, the distance $E_5$ between the first and second active region designation frames $F_1$ and $F_2$ is moderately large. In this case, if the distance $E_{10}$ between the designation frames G and H is more than the resolution of an exposure system used in the steps of FIGS. 7J and 7N, the designation frames G and H may be arranged so as to be separated from each other as illustrated in the drawing. In the case where i-line having a low resolution is adopted as exposure light in the above-described exposure system, the resolution, i.e., the minimum value of the distance $E_{10}$, is approximately 0.6 μm.

It should be noted that in FIG. 21, each of the distances $E_6$ to $E_9$ is approximately 0.18 μm.

(v) Fifth Example

Figure 22:
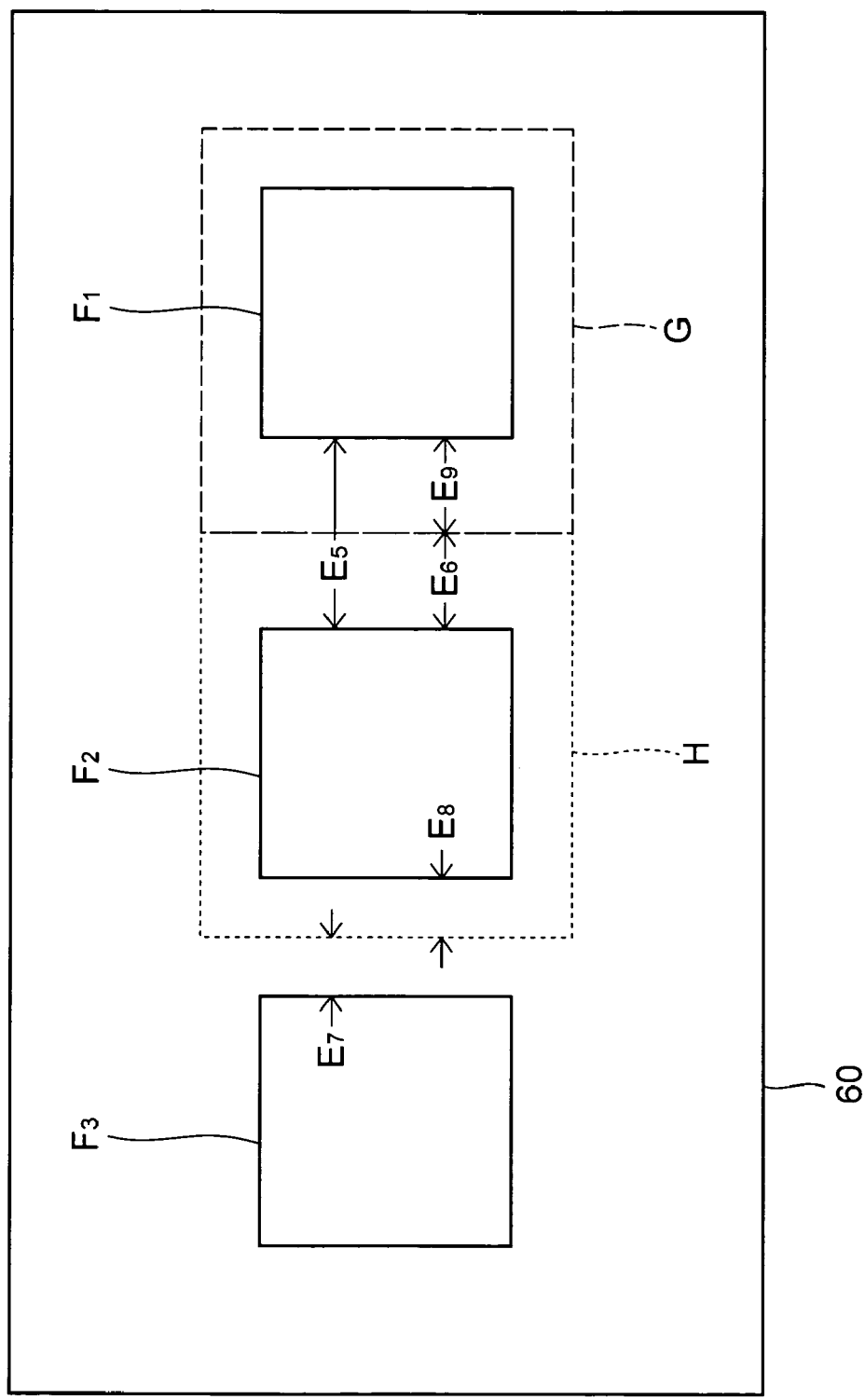
FIG. 22 is a fifth plan view schematically illustrating an image displayed on the display of the CAD system in the reticle fabrication method in the third embodiment of the present invention.

FIG. 22 is a plan view illustrating a method of arranging the designation frames G and H according to a fifth example.

In this example, as in the aforementioned fourth example, the distance $E_5$ between the first and second active region designation frames $F_1$ and $F_2$ is also moderately large. However, in this example, assumed is the case where the distance $E_{10}$ (see FIG. 21) between the designation frames G and H is not more than the resolution of an exposure system. In this case, as illustrated in FIG. 22, the designation frames G and H are arranged so as to be in contact with each other.

It should be noted that each of the distances $E_7$ and $E_8$ in FIG. 22 is approximately 0.18 μm.

According to the present invention described above, when the first gate insulating films in the second and third active regions are removed by wet etching, the first and second resist patterns are used as etching masks. Further, by setting the planar shape of the second resist portion of the second resist pattern to be larger than that of the first resist opening portion of the first resist pattern, the width of the device-isolation insulating film can be reduced while the overlap distances between the device-isolation insulating film and the first and second resist patterns are set larger than the penetration length of an etchant. Thus, a semiconductor device which includes gate insulating films having different thicknesses can be miniaturized.

What is claimed is:

1. A method of fabricating a semiconductor device, comprising the steps of:
    forming a device-isolation insulating film in a semiconductor substrate to isolate first to third active regions of the semiconductor substrate with the device-isolation insulating film;
    forming first gate insulating films on the semiconductor substrate in the first to third active regions, respectively;
    forming a first resist pattern on the device-isolation insulating film and the first gate insulating films, the first resist pattern having a first resist opening portion surrounding the second active region and a first resist portion covering the first and third active regions;
    removing the first gate insulating film of the second active region through the first resist opening portion by wet etching;
    removing the first resist pattern;
    forming a second gate insulating film on the semiconductor substrate in the second active region after removing the first resist pattern, the second gate insulating film being thinner than the first gate insulating film;
    forming a second resist pattern on the device-isolation insulating film and the first and second gate insulating films, the second resist pattern having a second resist opening portion surrounding the third active region and a second resist portion covering the first and second active regions and being larger than that of the first resist opening portion of the first resist pattern;
    removing the first gate insulating film of the third active region through the second resist opening portion by wet etching;
    removing the second resist pattern;
    forming a third gate insulating film on the semiconductor substrate in the third active region after removing the second resist pattern, the third gate insulating film being thinner than the second gate insulating film;
    forming first to third gate electrodes on the first to third gate insulating films, respectively; and
    forming first to third source/drain regions in the semiconductor substrate on both sides of the first to third gate electrodes, respectively.

2. The method according to claim 1, wherein
    the first resist portion overlaps the device-isolation insulating film around the first resist opening portion by a first distance longer than half of a width of the device-isolation insulating film, and
    the second resist portion overlaps the device-isolation insulating film around the second resist opening portion by a second distance longer than half of the width of the device-isolation insulating film.

3. The method according to claim 2, wherein as the first distance, a distance is adopted which is longer than a length by which an etchant penetrates to an interface between the device-isolation insulating film and the first resist pattern in the step of wet-etching the first gate insulating film of the second active region.

4. The method according to claim 2, wherein as the second distance, a distance is adopted which is longer than a length by which an etchant penetrates to an interface between the device-isolation insulating film and the second resist pattern in the step of wet-etching the first gate insulating film of the third active region.

5. The method according to claim 1,
    wherein the steps of forming the first resist pattern and forming the second resist pattern are performed by exposing first and second photoresists using first and second reticles and then developing the first and second photoresists, respectively, and
    wherein the first and second reticles are fabricated by a reticle fabrication method comprising the steps of:
    generating first to third active region designation frames respectively corresponding to the first to third active regions;
    generating a first film thickness designation frame surrounding the first active region designation frame;
    generating a second film thickness designation frame surrounding the second active region designation frame so that the second film thickness designation frame is connected to the first film thickness designation frame;
    shrinking the first film thickness designation frame to generate a shrunk frame;
    patterning a first film on a first transparent substrate by lithography using shape data of the shrunk frame, and removing a portion of the first film which corresponds to an inside of the first film thickness designation frame to form in the portion a first mask opening portion corresponding to the first resist opening portion, thus forming the first film and the first transparent substrate into the first reticle;

enlarging the first and second film thickness designation frames, respectively;

combining the enlarged first and second film thickness designation frames to generate a third film thickness designation frame; and patterning a second film on a second transparent substrate by lithography using shape data of the third film thickness designation frame, and removing a portion of the second film which corresponds to an outside of the third film thickness designation frame to form in the portion a second mask opening portion corresponding to the second resist opening portion, thus forming the second film and the second transparent substrate into the second reticle.

6. The method according to claim 5, wherein in the step of generating the second film thickness designation frame, the second film thickness designation frame is generated to be in contact with the first film thickness designation frame.

7. The method according to claim 1, wherein the steps of forming the first gate insulating films, forming the second gate insulating film, and forming the third gate insulating film are performed by forming thermal oxide films on a surface of the semiconductor substrate.

8. The method according to claim 1, further comprising the step of doping at least one of the first to third gate insulating films with nitrogen.

9. The method according to claim 1, wherein in at least one of the steps of removing the first gate insulating film of the second active region by wet etching and removing the first gate insulating film of the third active region by wet etching, a hydrofluoric acid solution is used as an etchant.

* * * * *